United States Patent
Rabkin et al.

(10) Patent No.: US 9,287,290 B1
(45) Date of Patent: Mar. 15, 2016

(54) 3D MEMORY HAVING CRYSTALLINE SILICON NAND STRING CHANNEL

(71) Applicant: SanDisk Technologies Inc., Plano, TX (US)

(72) Inventors: Peter Rabkin, Cupertino, CA (US); Jayavel Pachamuthu, San Jose, CA (US); Johann Alsmeier, San Jose, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/619,836

(22) Filed: Feb. 11, 2015

(51) Int. Cl.
*H01L 29/792* (2006.01)
*H01L 27/115* (2006.01)

(52) U.S. Cl.
CPC .... *H01L 27/11582* (2013.01); *H01L 27/11556* (2013.01)

(58) Field of Classification Search
CPC ............... H01L 27/11524; H01L 27/1157; H01L 27/11529; H01L 27/11582; H01L 27/11556; H01L 27/11514
USPC .......... 257/324, 302, 314, 328; 438/216, 287, 438/137, 138, 206, 209
See application file for complete search history.

(56) References Cited

U.S. PATENT DOCUMENTS

| | | | |
|---|---|---|---|
| 6,727,517 B2 | 4/2004 | Chan et al. | |
| 7,847,334 B2 | 12/2010 | Katsumata et al. | |
| 7,859,066 B2 | 12/2010 | Kito et al. | |
| 8,236,673 B2 | 8/2012 | Son et al. | |
| 8,349,681 B2 | 1/2013 | Alsmeier et al. | |
| 8,501,609 B2 | 8/2013 | Roizin et al. | |
| 8,610,193 B2 | 12/2013 | Ramaswamy | |
| 8,866,139 B2 | 10/2014 | Ino | |
| 2009/0191680 A1 | 7/2009 | Walker | |
| 2010/0025753 A1* | 2/2010 | Terai | H01L 21/28282 257/324 |
| 2011/0237055 A1 | 9/2011 | Son et al. | |
| 2011/0298013 A1* | 12/2011 | Hwang | H01L 27/11551 257/208 |
| 2013/0248974 A1 | 9/2013 | Alsmeier et al. | |
| 2013/0341701 A1 | 12/2013 | Blomme et al. | |
| 2013/0341702 A1 | 12/2013 | Kar et al. | |

(Continued)

OTHER PUBLICATIONS

Stinzianni, Emilio, et al., "Relationship of Aluminum Grain Size to the Grain Size of Polycrystalline Silicon Produced by the Aluminum Induced Crystallization of Amorphous Silicon," 34th IEEE Photovoltaic Specialists Conference, Jun. 7-12, 2009, 5 pages.

(Continued)

*Primary Examiner* — Jarrett Stark
*Assistant Examiner* — Shahed Ahmed
(74) *Attorney, Agent, or Firm* — Vierra Magen Marcus LLP

(57) ABSTRACT

Disclosed herein are 3D NAND memory devices having vertical NAND strings with a crystalline silicon channel and techniques for fabricating the same. The NAND string channel may be a single crystal of silicon or have a few large grains of polysilicon. The single crystal may have a (100) orientation with respect to a tunnel oxide of the 3D NAND string. When the channel region comprises grains of polysilicon, predominantly all of the silicon channel is part of a grain of polysilicon having the (100) orientation. The (100) orientation may be favorable for high carrier mobility. Techniques using metal induced crystallization (MIC) for forming the NAND strings having a crystalline silicon channel are also disclosed.

14 Claims, 43 Drawing Sheets

(56) References Cited

U.S. PATENT DOCUMENTS

2014/0264525 A1  9/2014  Takahashi et al.
2014/0284697 A1  9/2014  Wang et al.

OTHER PUBLICATIONS

Yoon, Soo Young, et al., "Metal-induced crystallization of amorphous silicon," Thin Solid Films, vol. 383, Issues 1-2, Feb. 2001, 5 pages.

Yoon, Soo Young, et al., "Low temperature metal induced crystallization of amorphous silicon using a Ni solution," AIP Journal of Applied Physics, Aug. 1997, 4 pages.

Wei, Sung-Yen, et al., "Orientation Selected Epitaxy for Grain Enlargement of AIC Poly-Si Seed Layers," 35th IEEE Photovoltaic Specialists Conference, Jun. 20-25, 3 pages.

Bo, Xiang-Zheng, et al., "Large-grain polycrystalline silicon films with low intragranular defect density by low-temperature solid-phase crystallization without underlying oxide," Journal of Applied Physics, vol. 91, No. 5, Mar. 1, 2001, 6 pages.

Chu, Hsiao-Yeh, et al., "Fabrication of Large-Grain Thick Polycrystalline Silicon Thin Films via Aluminum-Induced Crystallization for Application in Solar Cells," Hindawi Publishing Corporation, International Journal of Photoenergy, vol. 2013, Mar. 29, 2013, 5 pages.

Joshi, Amol Ramesh, "High Performance CMOS With Metal Induced Lateral Crystallization of Amorphous Silicon," A Dissertation submitted to the Dept. of Electrical Engineering, Stanford Univ., Mar. 2003, 116 pages.

* cited by examiner

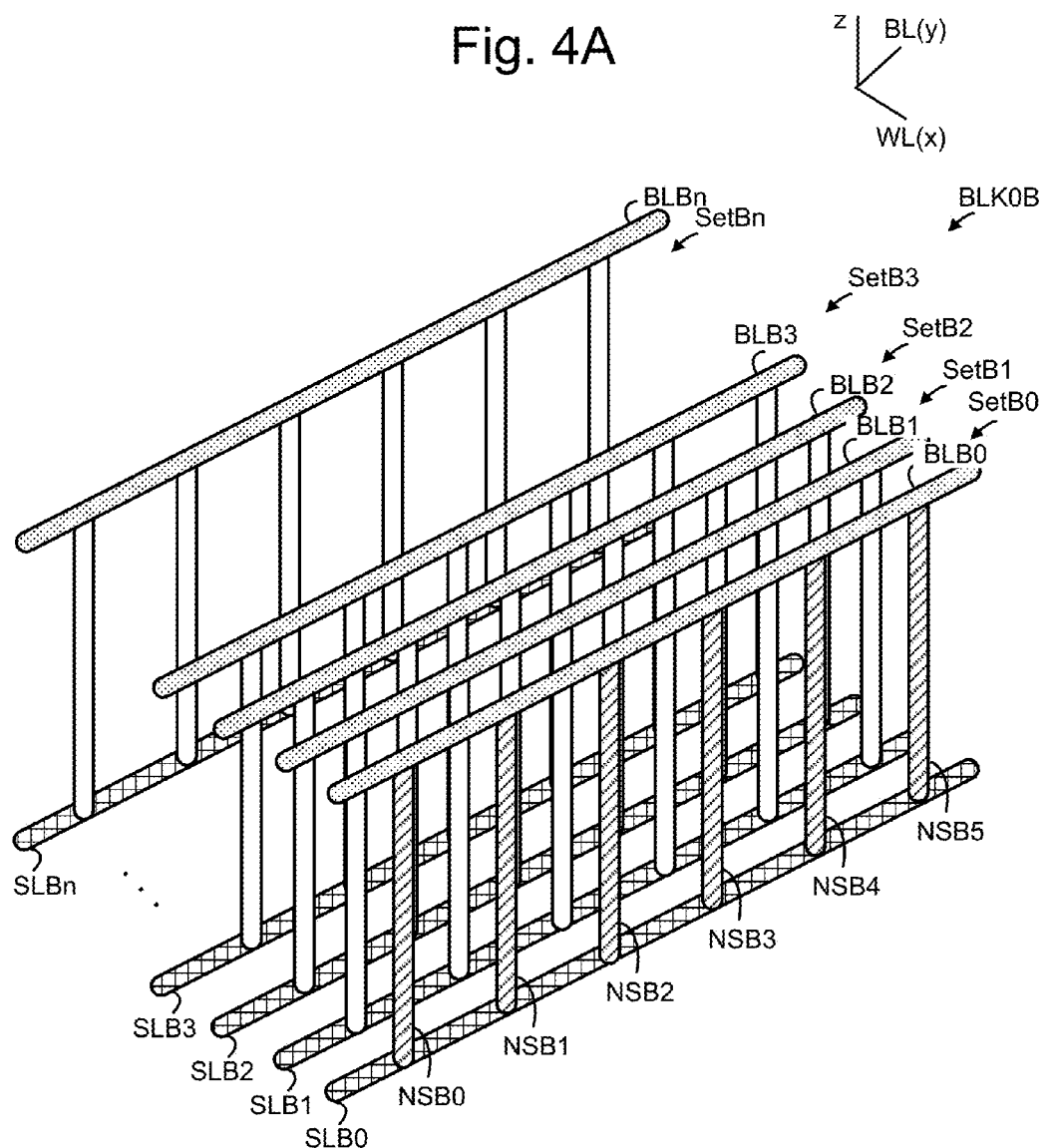

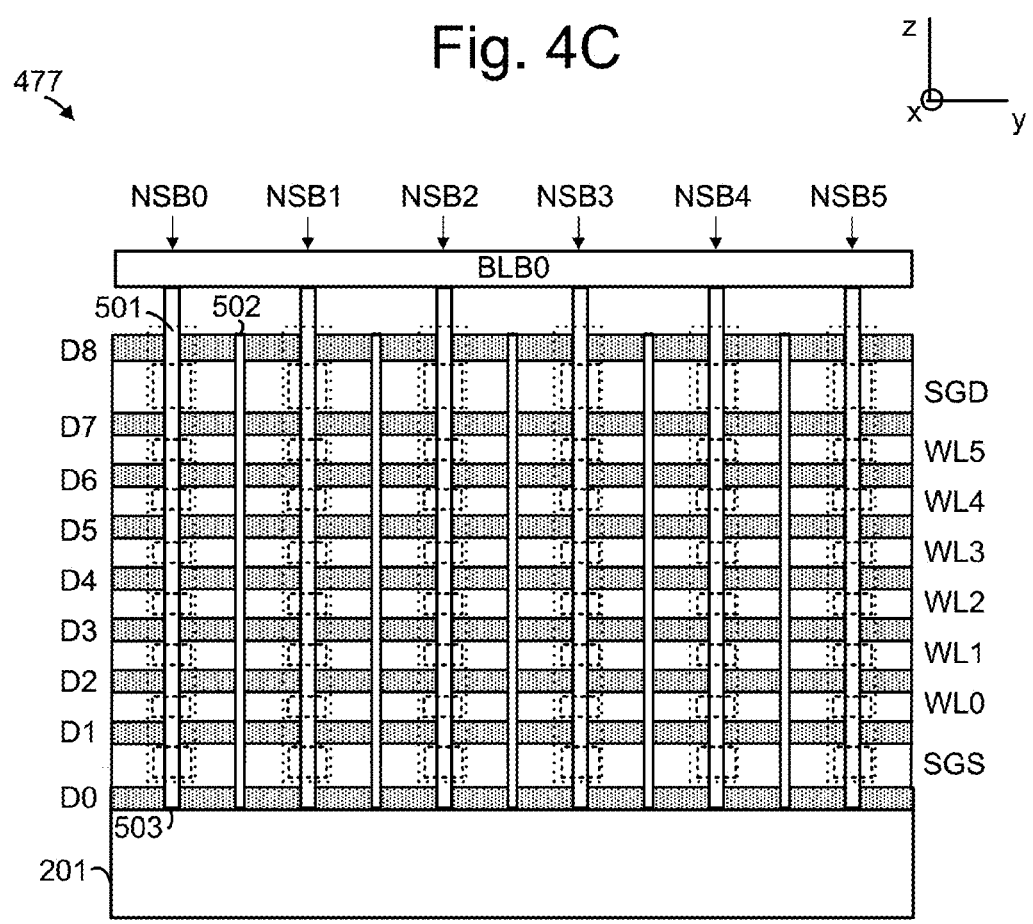

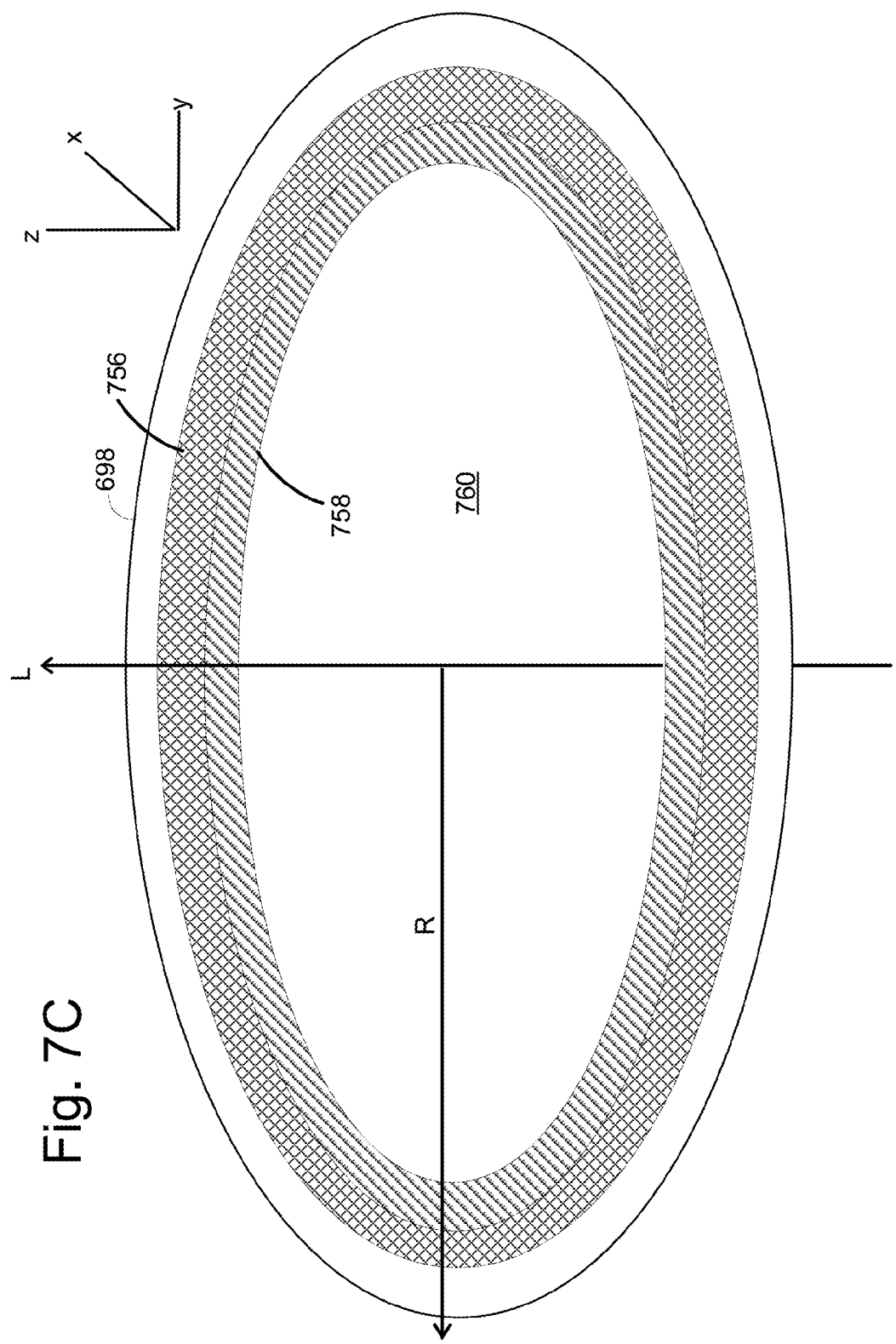

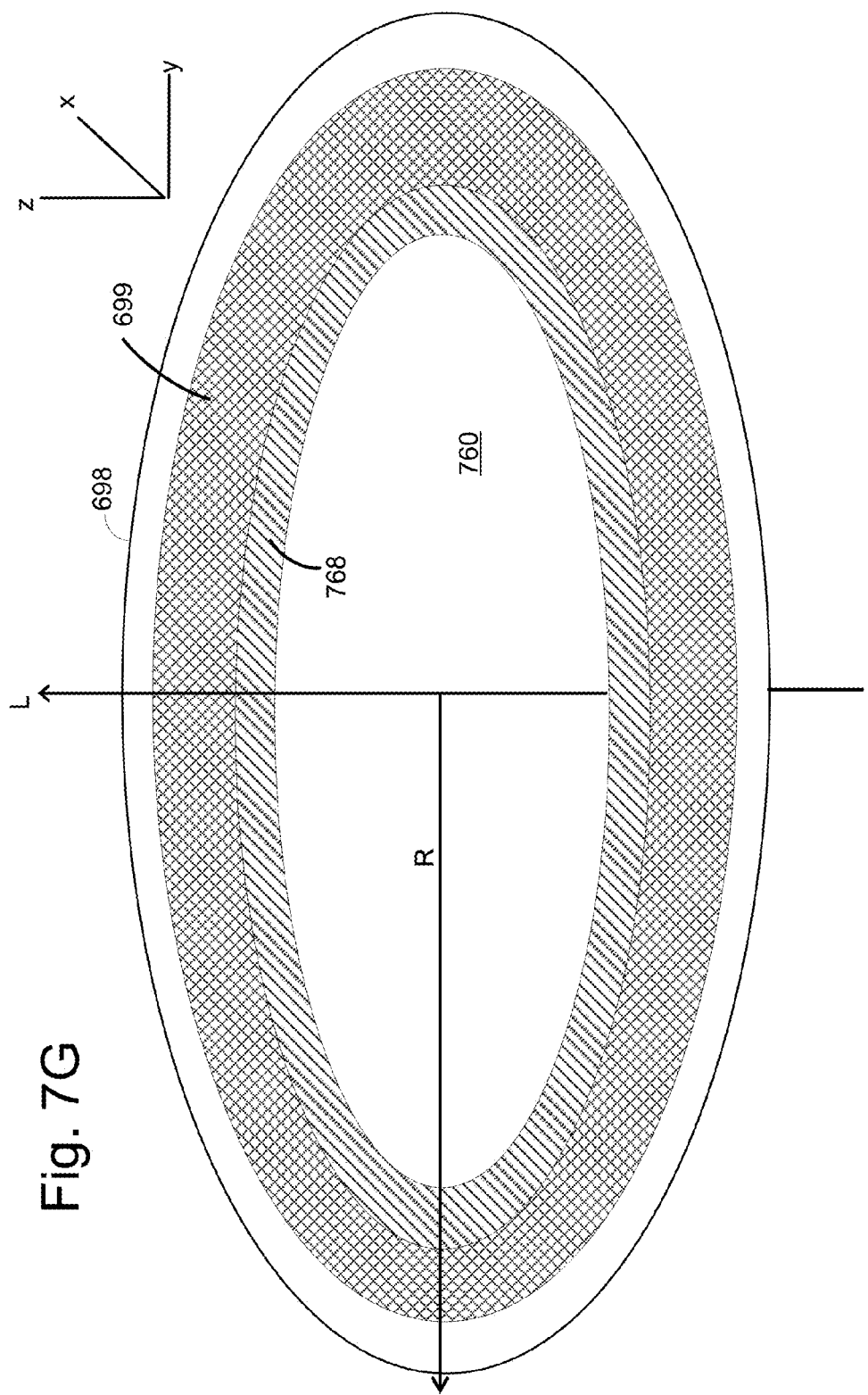

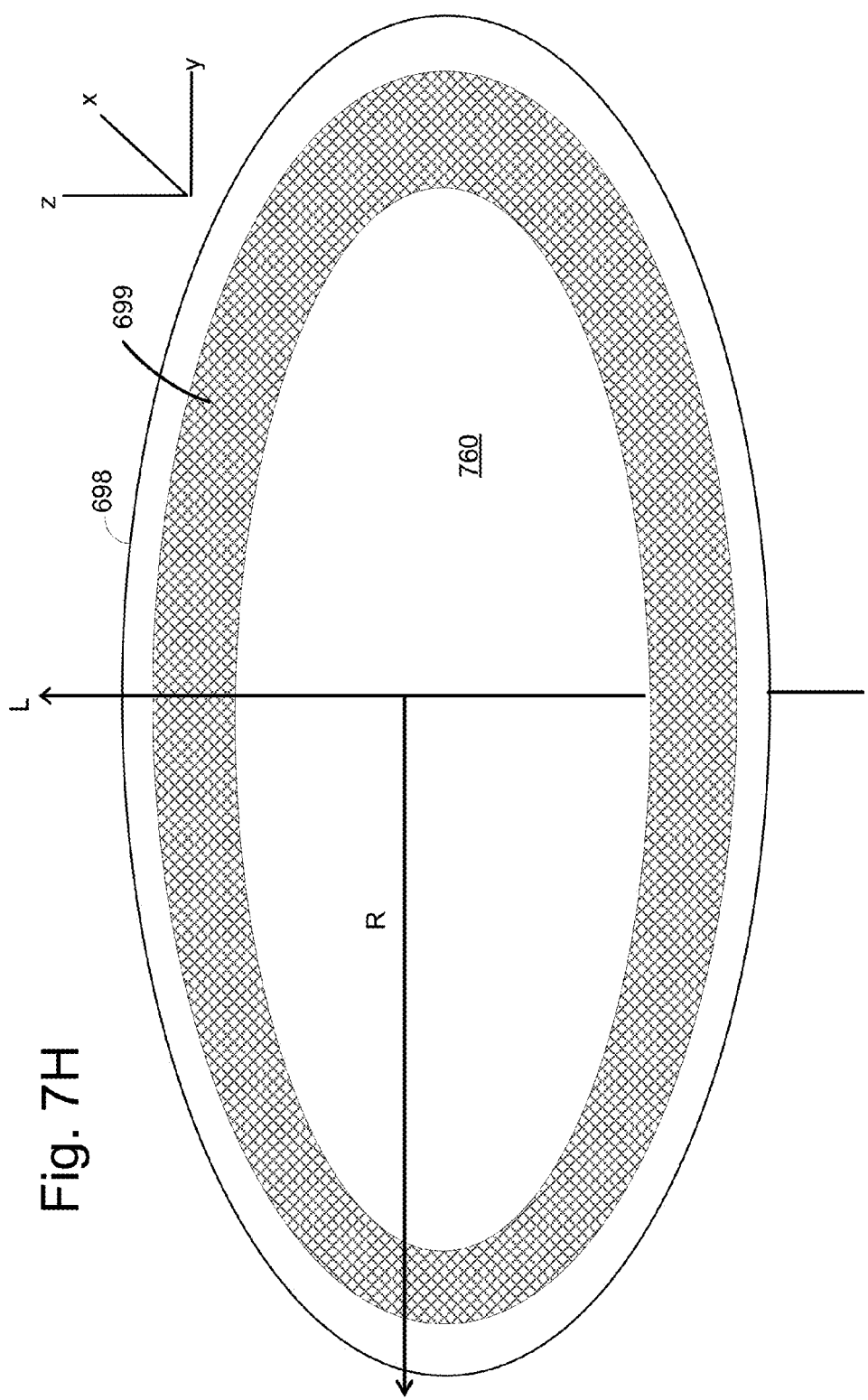

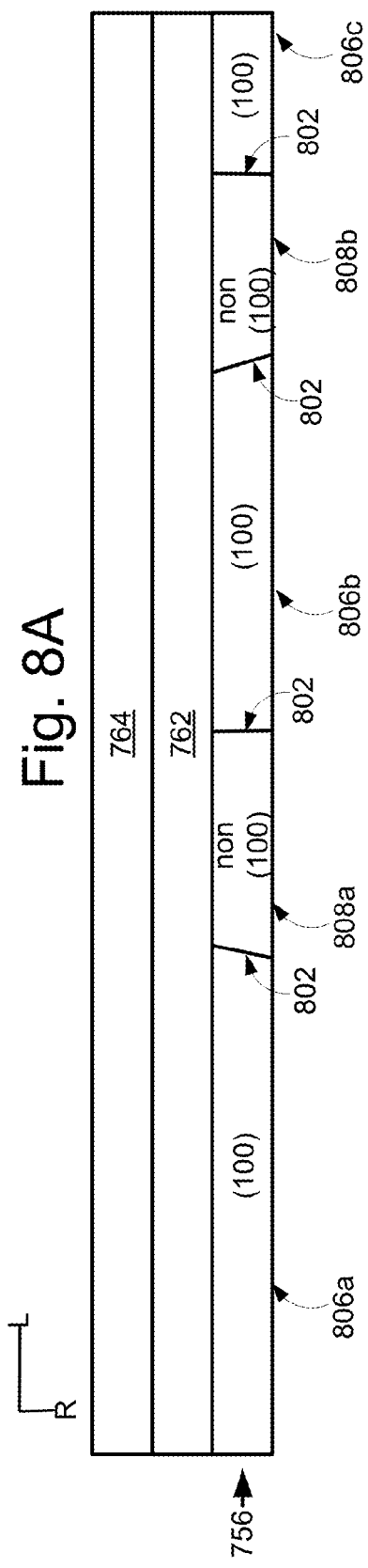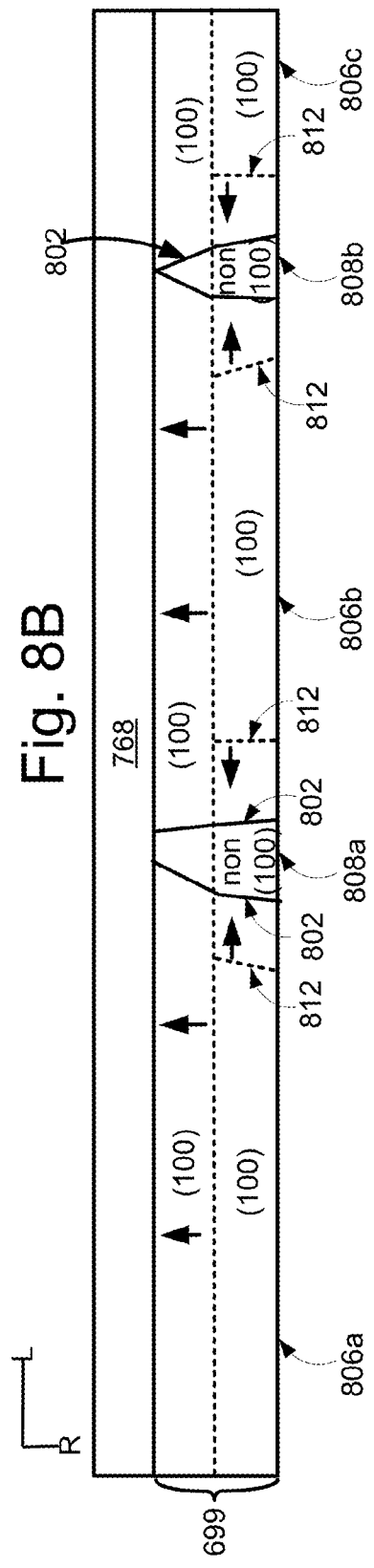

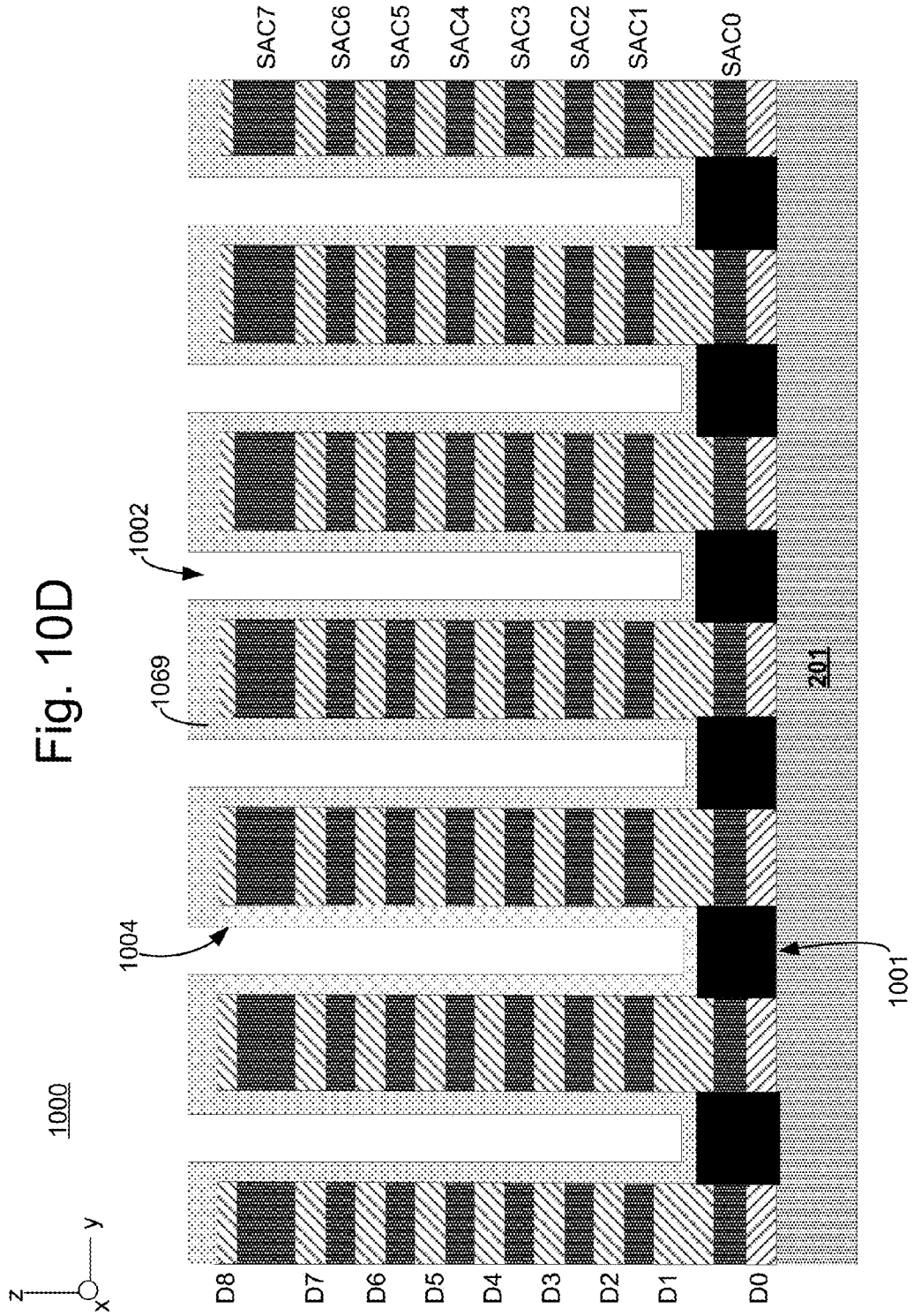

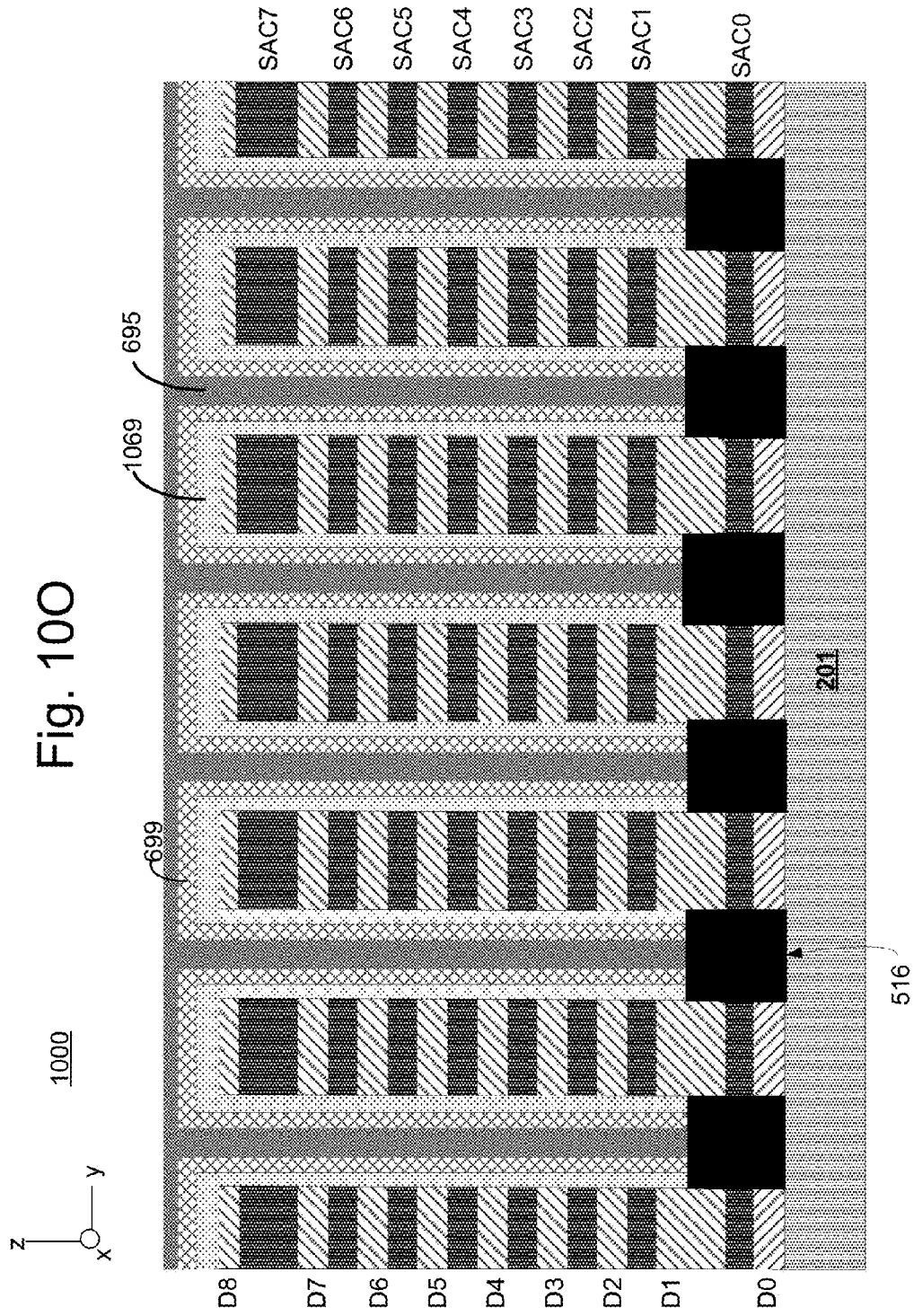

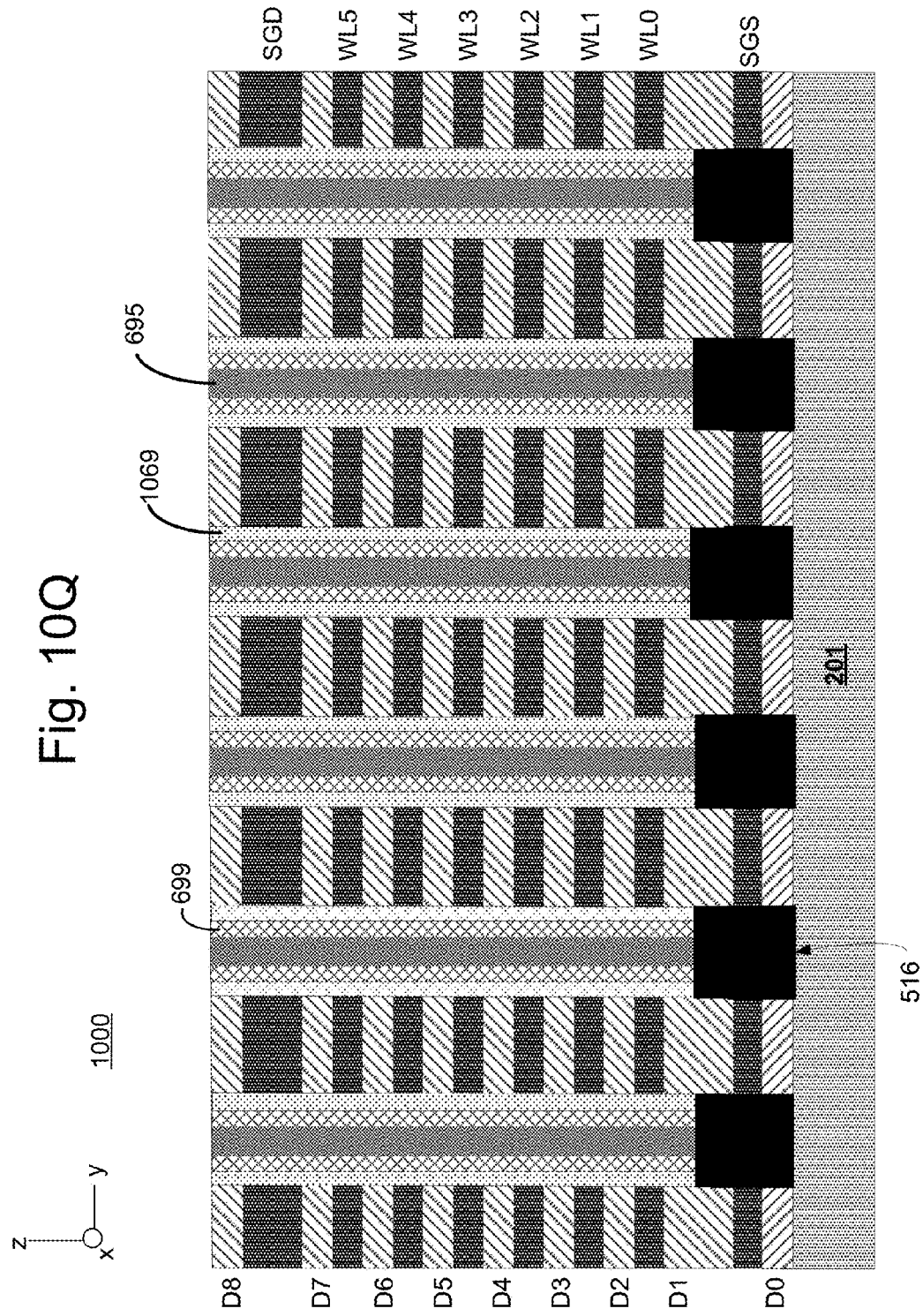

3D MEMORY HAVING CRYSTALLINE SILICON NAND STRING CHANNEL

BACKGROUND

The present technology relates to non-volatile memory.

Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. In one technique, a memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

BRIEF DESCRIPTION OF THE DRAWINGS

Like-numbered elements refer to common components in the different figures.

FIG. 4A depicts an embodiment of block BLK0 of FIG. 2 which includes straight NAND strings.

FIG. 4C depicts a cross-sectional view of a block of a 3D non-volatile memory device having straight strings.

FIGS. 7B-7D shows results after various steps of the process of FIG. 7A.

FIGS. 7F-7H shows results after various steps of the process of FIG. 7E.

FIGS. 8A-8D show additional details of crystal orientation during of one embodiment of forming the channel 699.

DETAILED DESCRIPTION

Figure 1:
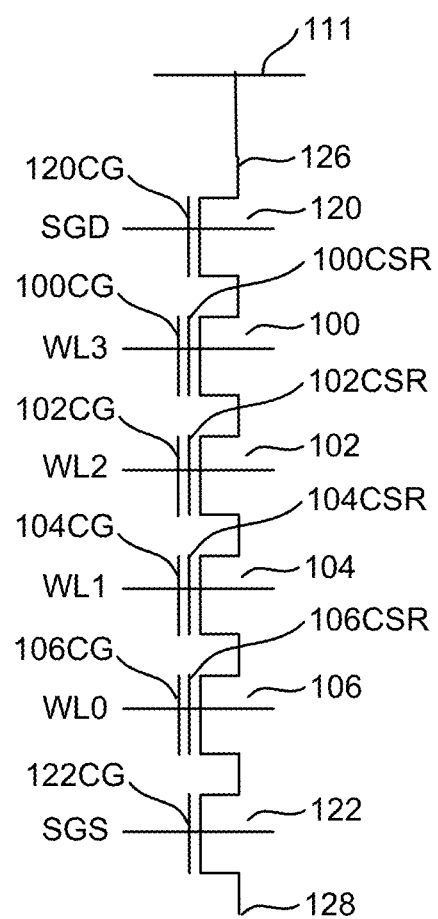
FIG. 1 is a circuit representation of a NAND string.

Disclosed herein are methods for forming 3D NAND memory devices with vertical NAND strings having a crystalline silicon channel. In one embodiment, the NAND string channel is a single crystal of silicon. In one embodiment, the NAND string channel is large grain polysilicon. For both the single crystal silicon and the large grain polysilicon cases, the crystalline orientation may be favorable for high carrier mobility.

A semiconductor film may be roughly classified as crystalline or amorphous. An amorphous semiconductor film has disordered atomic arrangement and no crystalline component. An example is a semiconductor film in which no crystal part exists even in a microscopic region. Crystalline semiconductor films include single-crystal and non-single-crystal semiconductor films.

A non-single crystal semiconductor film can be crystalline to a different degree. For instance, a poly-crystalline semiconductor film is comprised of "grains". Within each grain, the material is in the crystalline phase. That is, within each grain, the crystalline structure is oriented in the same way. However, in different grains, the crystal orientation may be different. As the term is used herein, a poly-crystalline semiconductor film may include nano-crystals, micro-crystals, or even larger crystals. The terminology depends on the grain size. Nano-crystals are on the order of one nanometer ($1 \times 10^{-9}$ meter) to hundreds of nanometers. Micro-crystals are on the order of one micrometer ($1 \times 10^{-6}$ meter) to hundreds of micrometers. Thus, a poly-crystalline semiconductor film has a higher degree of atomic order than an amorphous oxide semiconductor film. Hence, the density of defect states of the poly-crystalline semiconductor film is lower than that of the amorphous semiconductor film.

The term "large grain" is used herein to refer to a grain that extends at least 300 nanometers ($300 \times 10^{-9}$ meter) in at least one direction. Note that for some embodiments of a 3D memory device, the NAND channel is formed from a thin semiconductor film. For example, the semiconductor film may be on the order of tens of nanometers in thickness. Thus, a large grain of polysilicon may extend a few hundred nanometers or more in a direction parallel to the NAND string channel. However, a large grain might extend for less than a few hundred nanometers in a direction perpendicular to the channel.

In one embodiment, the crystalline orientation of the single crystal is oriented (100) with respect to a tunnel oxide of the 3D NAND string. In one embodiment, predominantly all of the silicon channel is formed from large grains that are oriented (100) with respect to a tunnel oxide of the 3D NAND string. The (100) orientation may be most favorable for higher mobility.

For the large grain polysilicon case, there may be just a few grains of silicon for the entire NAND channel. For example, the grains may be about 1 to 10 microns (1 to $10\times10^{-6}$ meters) in size. For some embodiments of a 3D memory device, the length of the NAND channel is a few microns or possibly somewhat longer. Therefore, there may be just a few grain boundaries along the length of NAND channel.

The following is a discussion of some parameters of interest for 3D NAND memory devices. One parameter of note in 3D NAND memory devices is the "on current" of the memory cell on the NAND string, which is referred to as $I_{CELL}$. A higher $I_{CELL}$ can provide better sensing margin. Another parameter of note in 3D NAND memory devices is the sub-threshold slope, which may be defined as the slope of the $Vgs/I_{CELL}$ curve below the memory cell's threshold voltage. The sub-threshold slope, often measured in mV/decade, generally describes the Vgs voltage increase necessary to increase Icell by one order of magnitude. A low slope means that a smaller Vgs increase is needed for a certain Icell increase. When the sub-threshold slope is smaller, the Icell-Vgs curve shows sharper increase of Icell current with every incremental Vgs voltage increase. A low (e.g., relatively flat) slope can make it easier to determine which memory cells are off. Another parameter of note in 3D NAND memory devices is select gate leakage. This refers to leakage of select gates that connect/disconnect the NAND string from a bit line or source line. Another parameter of note in 3D NAND memory devices is carrier generation, including trap assisted generation and band-to-band (BTB) generation. Low carrier generation can significantly improve boosting during programming. Also, low carrier generation can reduce program disturb. This can reduce the need to use complicated boosting schemes. This, in turn, can simplify chip design and reduce chip size.

One embodiment of a 3D memory device having a NAND string channel with all or predominantly all (100) orientation with respect to the tunnel oxide has a high on current (e.g., high $I_{CELL}$). One embodiment of a 3D memory device having a NAND string channel with all or predominantly all (100) orientation with respect to the tunnel oxide has a low sub-threshold slope. Thus, the memory cell turns on fast (e.g., $I_{CELL}$ increases sharply with an increment in Vg). One embodiment of a 3D memory device having a NAND string channel with all or predominantly all (100) orientation with respect to the tunnel oxide has a low select gate leakage.

In one embodiment, the NAND string has a single crystal of silicon. Hence, problems associated with many grain boundaries are avoided. Grain boundaries may be associated with defects. These defects may increase leakage, increase trap assisted carrier generation, reduce cell on current, reduce mobility of charge carriers, and introduce variability of device parameters. One embodiment having a single crystalline silicon NAND string channel has no grain boundaries and no associated defects/traps. Thus, the adverse effects that such defects/traps have on electron mobility and channel leakage are avoided. Thus, a NAND string with a single crystal of silicon may have a high $I_{CELL}$, low sub-threshold slope, low select gate leakage, and/or low carrier generation.

In one embodiment, the NAND string has a single crystal of silicon that has the (100) orientation with respect to the tunnel oxide. Therefore, benefits of both the (100) orientation and the single crystal may be realized.

In one embodiment, the NAND string includes large grain polysilicon with just a few grain boundaries. Such a device has few defects/traps compared to one with many polysilicon grains (and hence many grain boundaries). Hence, the adverse effects that defects/traps have on electron mobility and channel leakage are reduced. Thus, a NAND string with large grains of polysilicon with just a few grain boundaries may have a high $I_{CELL}$, low sub-threshold slope, low select gate leakage, and/or low carrier generation. Also note that benefits mentioned above of the (100) orientation apply to embodiments having large grain polysilicon with predominantly all of the silicon channel being formed from grains having a (100) orientation with respect to the tunnel oxide.

Additionally, in one embodiment, the NAND string channels having a crystalline silicon channel in a 3D NAND memory device are fabricated without a high temperature anneal. High temperatures during fabrication can harm elements such as transistors. For example, CMOS transistors that are formed in a peripheral region of the memory device prior to the 3D NAND memory array could be harmed during a high temperature anneal associated with formation of 3D memory devices. However, the crystalline silicon vertical NAND channel is formed in one embodiment without a high temperature anneal.

In one embodiment, vertically oriented NAND strings are formed in a 3D memory device by using metal induced crystallization (MIC). The MIC process is used to form vertical NAND strings that have hollow cylindrical crystalline silicon channels, in one embodiment. In a given round of the MIC process, a layer of metal is deposited and then a layer of amorphous silicon is deposited on the layer of metal. A thermal anneal causes the metal and silicon to switch places. Additionally, silicon from the amorphous silicon layer is crystallized by the thermal anneal. This results in a layer of crystalline silicon having a hollow cylindrical shape with metal from the layer of metal exposed on the crystalline silicon. The exposed metal is then removed. This MIC process may be repeated by forming another metal layer, another amorphous silicon layer, and performing another thermal anneal. Again, the metal and newly deposited silicon switch places, and silicon crystallization takes place during the thermal anneal. This results in a single region of crystalline silicon with metal exposed on the crystalline silicon. The exposed metal can then be removed. The single region of crystalline silicon may be predominantly oriented (100) with respect to the tunnel oxide layer. The single region of crystalline silicon may be a single crystal of silicon or mostly large grains of silicon, in one embodiment. Thus, the process can be used to engineer a desired crystalline orientation in the NAND channel.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a circuit representation of a NAND string. The NAND string depicted in FIG. 1 includes four transistors 100, 102, 104 and 106 in series and sandwiched between (drain side) select gate 120 and (source side) select gate 122. Select gate 120 connects the NAND string to a bit line 111. Select gate 122 connects the NAND string to source line 128. Select gate 120 is controlled by applying the appropriate voltages to select line SGD. Select gate 122 is controlled by applying the appropriate voltages to select line SGS.

Each of the transistors 100, 102, 104 and 106 has a control gate (CG) and a charge storage region (CSR). For example, transistor 100 has control gate 100CG charge storage region 1600CSR. Transistor 102 includes control gate 102CG and a charge storage region 102CSR. Transistor 104 includes control gate 104CG and charge storage region 104CSR. Transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select gate controlled by select line SGS and connected to its associated bit line by its drain select gate controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of silicon oxide, silicon nitride and silicon oxide ("ONO") is sandwiched between a conductive control gate and the memory cell channel. For example, the ONO may be $Al_2O_3$—SiN—$SiO_2$. In the direction from control gate toward the center of memory hole, the first oxide (e.g., $Al_2O_3$) is a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the center of MH, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

Figure 2:
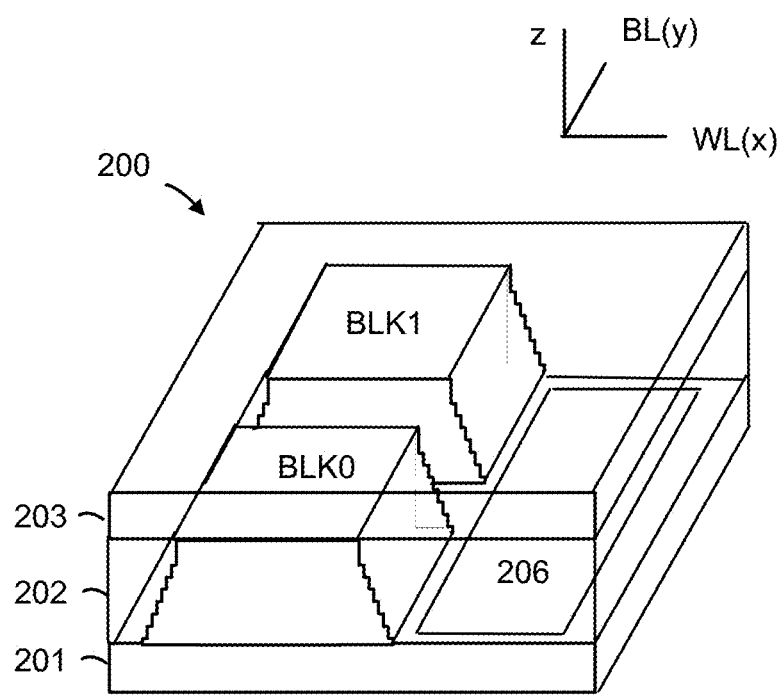
FIG. 2 is a perspective view of a 3D stacked non-volatile memory device.

FIG. 2 is a perspective view of a 3D stacked non-volatile memory device. The 3D memory device 200 includes a substrate 201. In one embodiment, the substrate 201 is formed from silicon. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 3A:
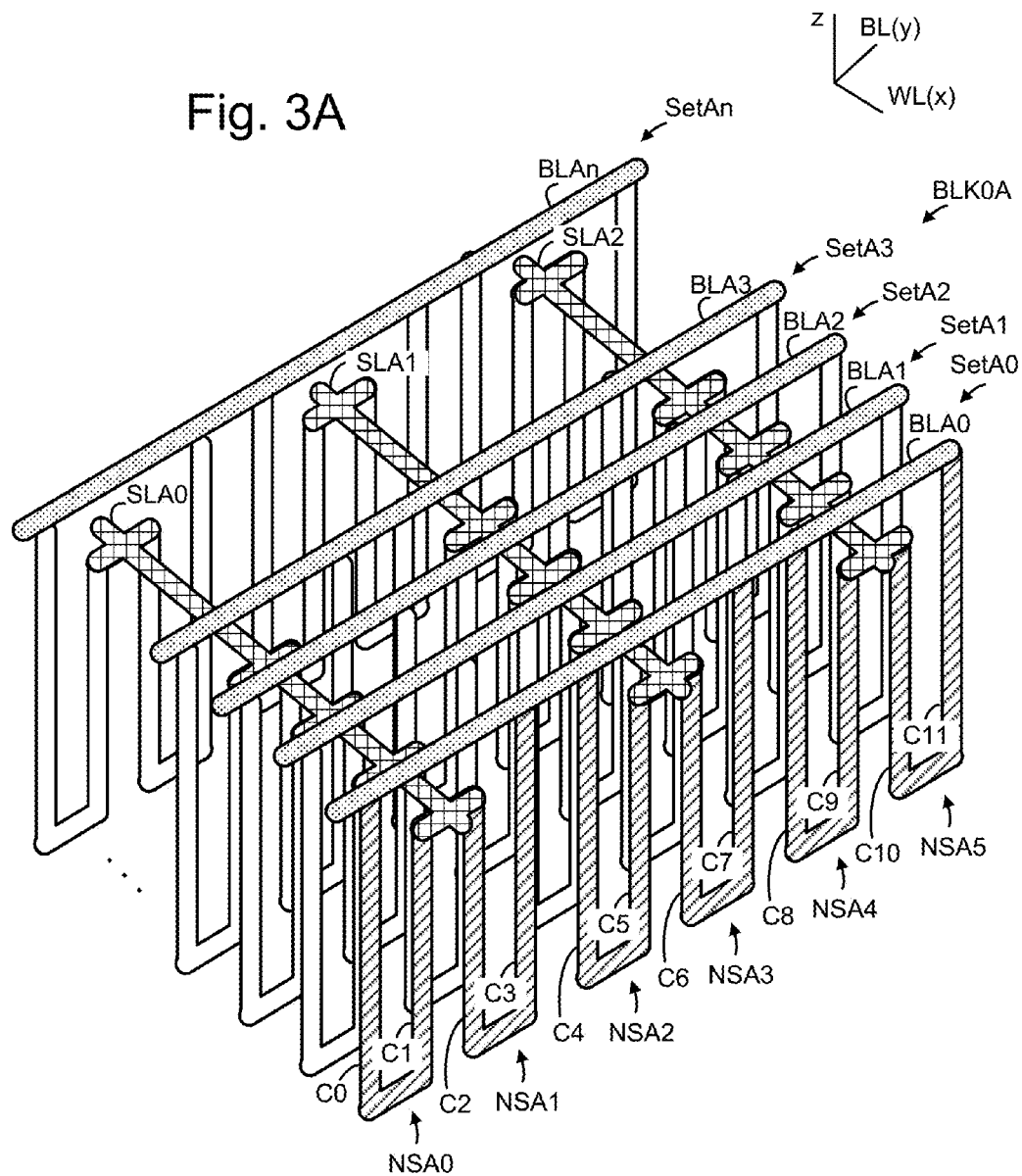
FIG. 3A depicts an embodiment of block BLK0 of FIG. 2 which includes U-shaped NAND strings.

In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
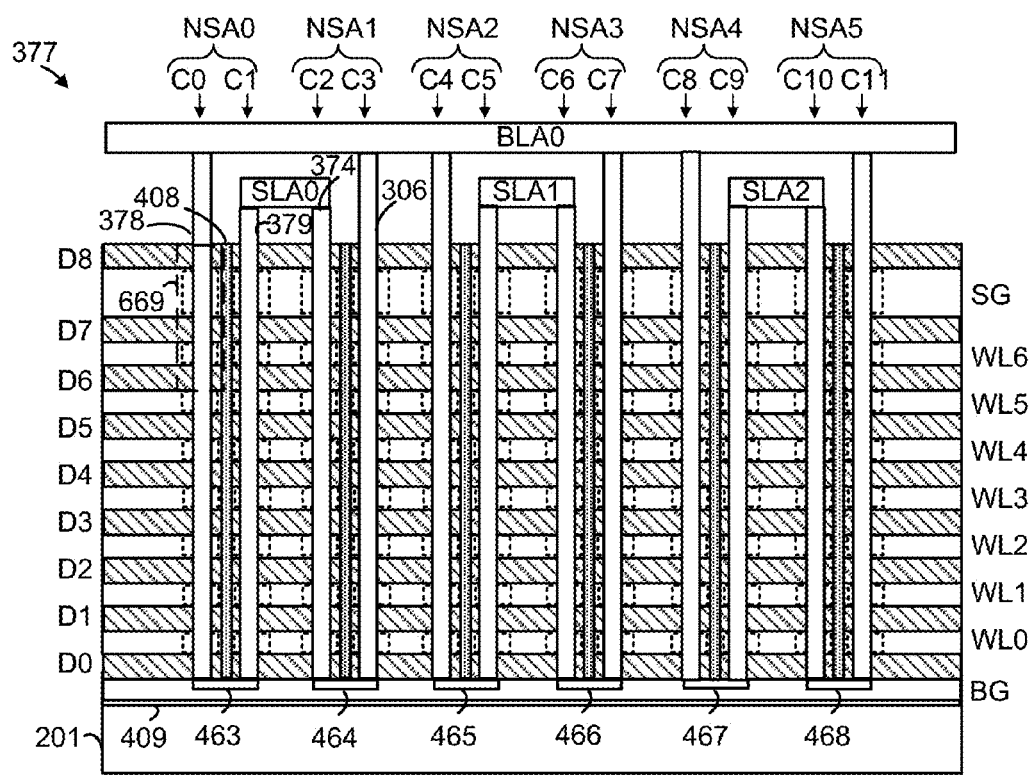
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 306 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select gate in the SG layer. A region 669 of the stack is shown in greater detail in FIG. 5A.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
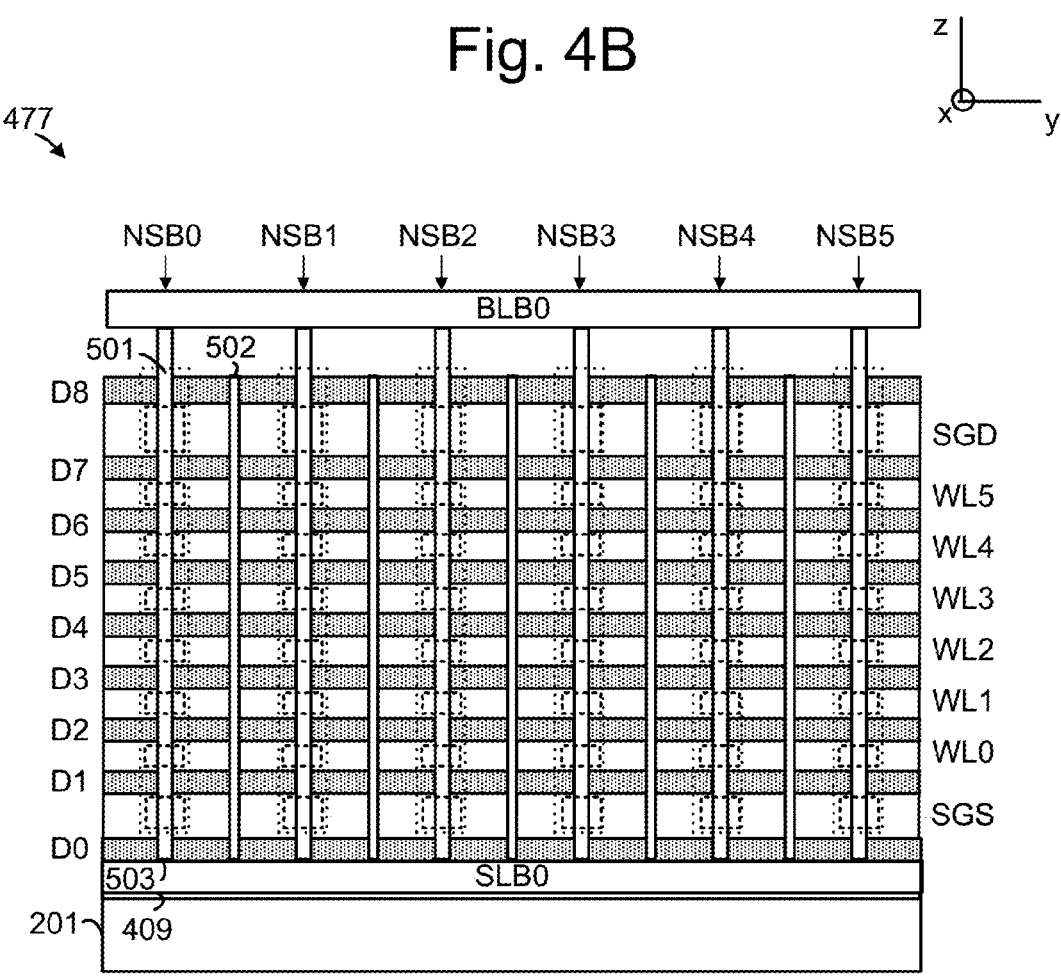
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 503 and a drain end 501. A slit 502 is also depicted with other slits. It is not required that there be a slit 502 between each pair of strings, as depicted. For example, slits could be used to separate blocks. Slits could be placed between several groups of strings within a block. In this case, a group of strings separated by slits within a block may be referred to as a "finger". There may be several fingers within a block. A portion of the bit line BLB0 is also depicted. Dashed lines depict memory cells and select gates, as discussed further below.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the substrate 201. The substrate 201 may be silicon. The source line is not depicted in FIG. 4C.

Figure 5A:
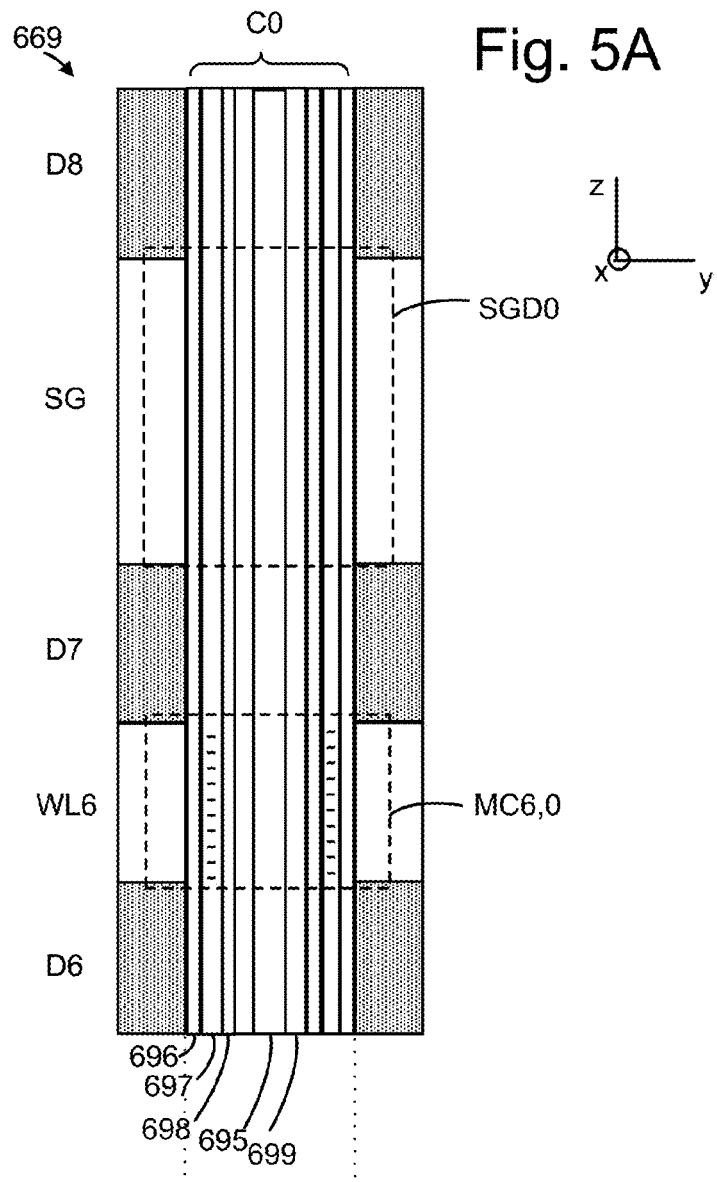
FIG. 5A depicts a close-up view of the region 669 of the column C0 of FIG. 3B, showing a drain-side select gate SGD0 and a memory cell MC6,0.
Figure 5B:
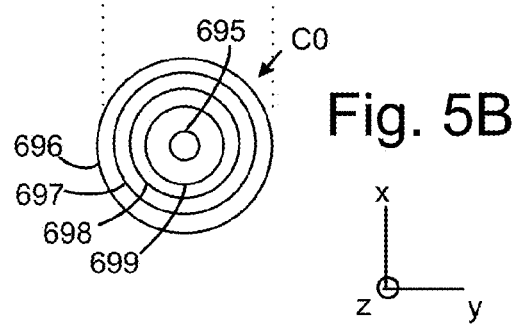
FIG. 5B depicts a cross-sectional view of the column C0 of FIG. 5A.

FIG. 5A depicts a close-up view of the region 669 of the column C0 of FIG. 3B, showing a drain-side select gate SGD0 and a memory cell MC6,0. FIG. 5B depicts a cross-sectional view of the column C0 of FIG. 5A. The region 669 shows portions of the dielectric layers D6 to D8 and the conductive layers WL6 and SG. Each column includes a number of layers which are deposited along the sidewalls of the column. These layers can include oxide-nitride-oxide and silicon layers which may be formed using a variety of techniques. For example, atomic layer deposition could be used to deposit one or more of the layers. For example, a block oxide (or blocking layer) can be deposited as layer 696, a nitride such as SiN as a charge trapping layer (e.g., charge storage region CSR) can be deposited as layer 697, a tunnel oxide (or tunneling layer) can be deposited as layer 698, a silicon body or channel can be formed as layer 699. The innermost region is a silicon oxide core 695.

The silicon body or channel 699 is a single crystal of silicon that has a (100) orientation with respect to the tunnel oxide layer 698, in one embodiment. The silicon body or channel 699 includes a few large grains of silicon with the large grains having a (100) orientation with respect to the tunnel oxide layer 698, in one embodiment. Note that in the large grain case, there may be a few grains that do not have the (100) orientation. The semiconductor body or channel 699 may also be referred to as an active area.

The block oxide layer 696 and the tunnel oxide layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel oxide layer 698 comprises a stack of oxide, nitride and oxide films. Additional memory cells are similarly formed throughout the columns.

Each layer 696-699 is shaped as a hollow cylinder in one possible approach. Region 695 is a silicon oxide core, in one possible approach. The horizontal cross section of the cylinders may be circular. However, it is not required that the horizontal cross section of the cylinders be circular. In one embodiment, the horizontal cross section of the cylinders is an ellipse. The horizontal cross section of the cylinders could deviate from a perfectly circular or perfectly elliptical shape. Also note that the size (e.g., width in the x-y plane) of the column can vary from top to bottom. Thus, the radius of the cylinders could vary from top to bottom. Thus, the term "cylindrical" as used herein does not require a constant radius from top to bottom. This, the term "cylindrical" as used herein allows for some tapering. Recall that region 669 of the column C0 of FIG. 3B is for the U-shaped 3D NAND string example. However, the diagrams and discussion for FIGS. 5A and 5B also apply to a straight 3D NAND string, such as the examples of FIGS. 4A-4C.

When a memory cell such as depicted in FIG. 5A is programmed, electrons are stored in a portion of the charge trapping layer which is associated with the memory cell. For example, electrons are represented by "-" symbols in the charge trapping layer 697 for MC6,0. These electrons are drawn into the charge trapping layer from the semiconductor body, and through the tunnel oxide. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and drain side select gate bias (SGD), and similarly, between source line bias and source side select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

Figure 5C:
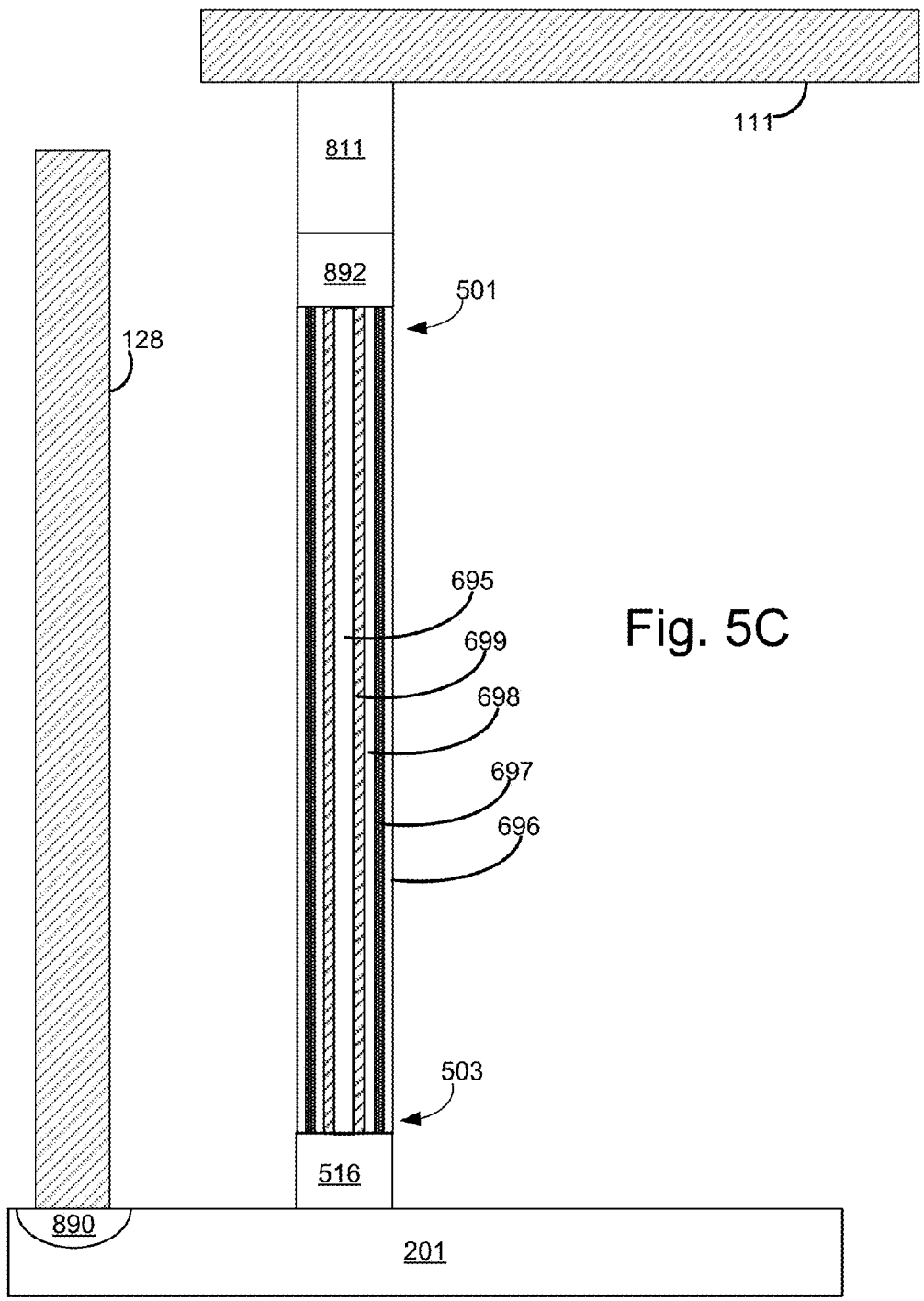
FIG. 5C depicts electrical connections between one embodiment of a crystalline silicon vertical NAND channel and a bit line and a source line.

FIG. 5C shows electrical connections between the crystalline silicon vertical NAND channel 699 and a bit line 111 and a source line 128. The source end 503 of the crystalline silicon channel 699 is in direct physical contact with a source side select gate transistor body 516. The source side select gate transistor body 516 may be formed from silicon. In one embodiment, the source side select gate transistor body 516 is crystalline silicon. The source side select gate body 516 may be a single crystal of silicon. The source side select gate body 516 is in direct physical contact with the substrate 201, which may be formed from silicon. The source line 128 is in electrical contact with a source 890 that is formed in the substrate 201. The source may be an n+ region. Thus, source 890 can be formed by heavily doping the silicon substrate 201. The source line 128 is formed from metal, in one embodiment. Example metals include, but are not limited to, titanium, tungsten, copper, aluminum, and molybdenum. The source line 128 can be electrically connected to the NAND string channel 699 by the action of a source side select gate (SGS) transistor, when a respective bias is applied to the SGS line (not depicted in FIG. 5C). An example of the SGS line is depicted in FIGS. 4B and 4C. Operationally, source side select gate transistor body 516 may act as at least a portion of the channel of the SGS transistor. A portion of the substrate 201 between the source 890 and where source side select gate transistor body 516 contacts the substrate 201 may also act as part of the channel of the SGS transistor. Source 890 may act as the source of the SGS transistor. Note that the source line 128 may serve as a common source line for a number of NAND strings. For example, all of the NAND strings depicted in FIG. 4C may share a common source line.

The drain end 501 of the crystalline silicon NAND string channel 699 is in direct physical contact with a drain 892. In one embodiment, the drain 892 is a heavily doped silicon region (e.g., n+ region). The bit line contact 811 is formed from metal, in one embodiment. Likewise, the bit line 111 is formed from metal, in one embodiment. Example metals for the bit line and bit line contact include, but are not limited to, titanium, tungsten, copper, aluminum, and molybdenum.

Figure 6A:
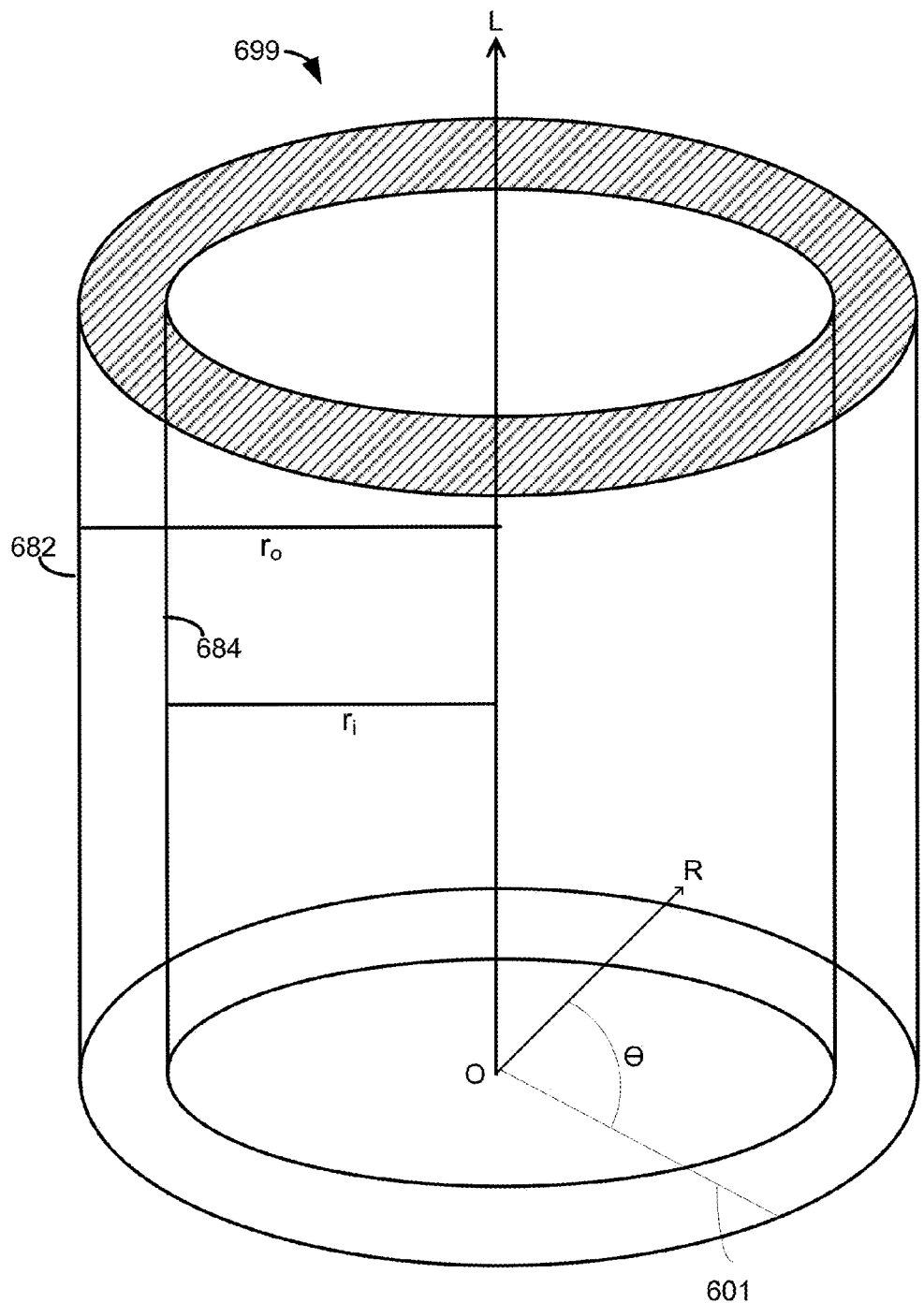
FIG. 6A is a diagram of one embodiment of a crystalline silicon vertical NAND channel.

In one embodiment, the crystalline silicon vertical NAND channel has a hollow cylindrical shape. FIG. 6A is a diagram of one embodiment of a crystalline silicon vertical NAND channel 699. A coordinate system is depicted with an origin O, an L-axis and an R-axis. The origin is shown at the base of the crystalline silicon channel 699, as an arbitrary point of reference. The L-axis runs vertically along the center of the hollow cylinder. The L-axis may also be referred to as a vertical axis. The L-axis may also be referred to as a longitudinal axis. The vertical NAND channel 699 extends substantially parallel to the L-axis. Note that there may be some tapering of the NAND channel 699. Thus, the NAND channel 699 is not necessarily exactly parallel to the L-axis. Depending on the design the deviation could be several tens of a degree to one degree, or even more than one degree. The R-axis may also be referred to as a radial axis. The R-axis extends horizontally from the L-axis, and is perpendicular to the L-axis. Also, a line 601 is shown as extending from the origin at an angle θ from the R-axis. A radial direction is defined herein by a line that is defined by the R-axis or some angle θ from the R-axis. Line 601 is one example of a line in the radial direction. The radial direction also includes lines that originate from the L-axis above the origin and extend horizontally outward.

An inner radius $r_i$ and an outer radius $r_o$ are depicted. Thus, the crystalline silicon channel 699 has an outer cylindrical surface 682 defined by the outer radius $r_o$ and an inner cylindrical surface 684 defined by the inner radius $r_i$, in this embodiment. Note that the radii are not required to be constant in length from top to bottom of the cylinder. Thus, the cylinder may have some taper. The outer cylindrical surface 682 may be in direct physical contact with the tunnel oxide layer 698 (not depicted in FIG. 6A). The inner cylindrical surface 684 may be in direct contact with the core filler dielectric 695 (not depicted in FIG. 6A).

Figure 6B:
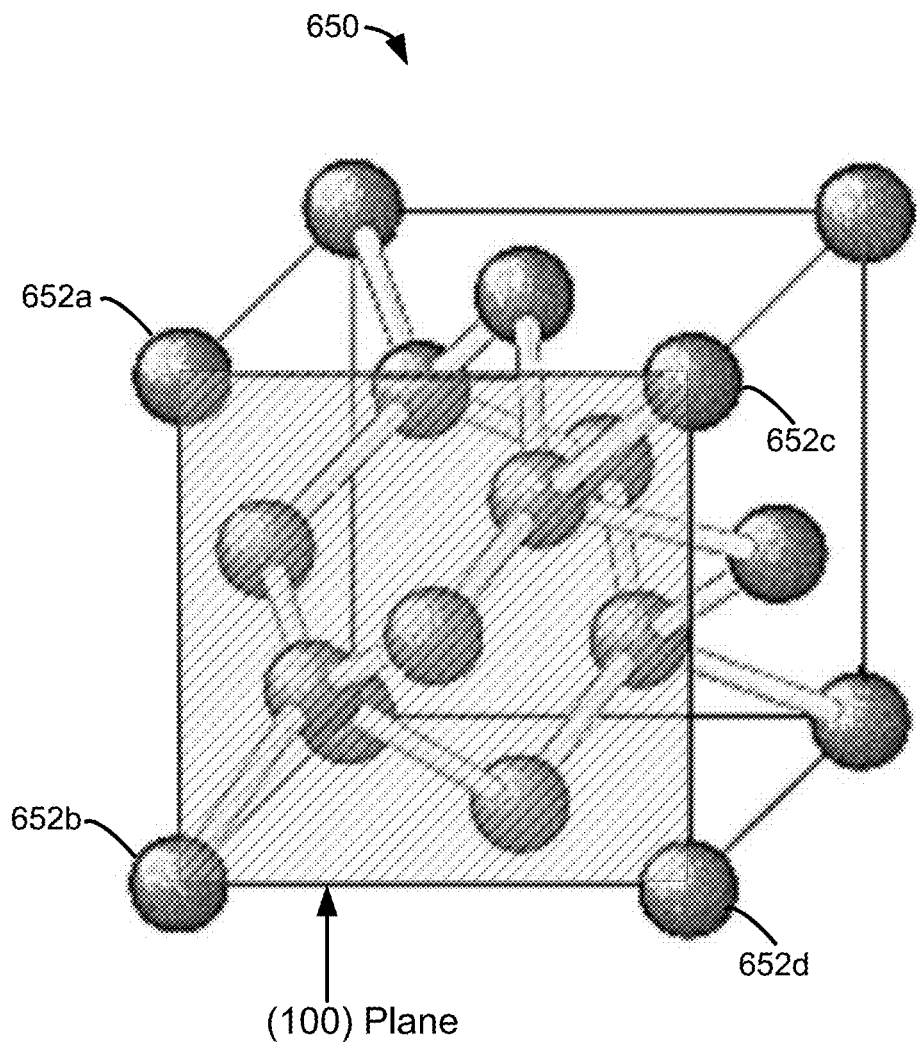
FIG. 6B shows a crystal lattice structure of silicon.

FIG. 6B shows a crystal lattice structure 650 of silicon. Each silicon atom 652 is covalently bound to four other silicon atoms. The crystal orientation is defined by the well-known Miller indices. FIG. 6B shows a (100) plane that is defined by four of the silicon atoms 652a-652d.

Figure 6C:
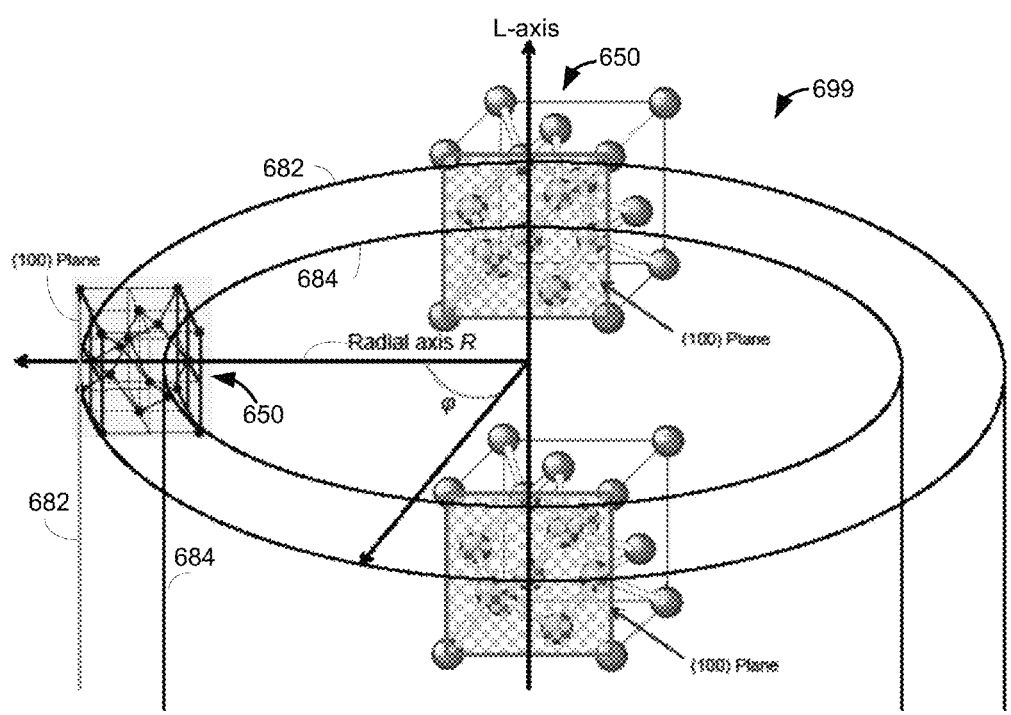
FIG. 6C shows a portion of the crystalline silicon channel 699 of FIG. 6A to illustrate a crystalline orientation of one embodiment.

FIG. 6C shows a portion of the crystalline silicon channel 699 of FIG. 6A to illustrate a crystalline orientation of one embodiment. The diagram is not drawn to scale. Three crystal lattice structures 650 are depicted. Each of the crystal lattice structures 650 has a (100) plane that is oriented such that it is parallel to either the inner surface 682 or the outer surface 684 of the crystalline silicon channel 699. As noted previously, the inner surface 682 of the crystalline silicon channel 699 may be in direct physical contact with the tunnel layer 698. In this example, a small section of the inner surface 684 is parallel to a small section of the outer surface 682 that is on the same radial line. Therefore, the crystalline silicon channel 699 has a (100) orientation with respect to a surface of the tunnel layer 698.

As noted, the individual crystal lattice structures 650 that are depicted in FIG. 6C are not drawn to scale. The depicted crystal lattice structures 650 could all be part of one single crystal of silicon that fills the entire channel 699, with no grain boundaries. As another alternative, the depicted crystal lattice structures 650 could each be part of a large grain of silicon that does not fill the entire channel 699. For example, a grain might be 1 to 10 microns in size with the entire channel 699 being 4 to 10 microns in size. As noted above, the channel 699 may be a thin film. Thus, the distance between the outer surface 682 and the inner surface 684 of the channel 699 may be on the order of tens of nanometers, as one example. This, the 1 to 10 micron grain size is with respect to the length of the channel 699 (in the direction of the L-axis), in one embodiment. Thus, a single large grain of silicon could include one, two, or all three of the depicted crystal lattice structures 650.

Figure 7A:
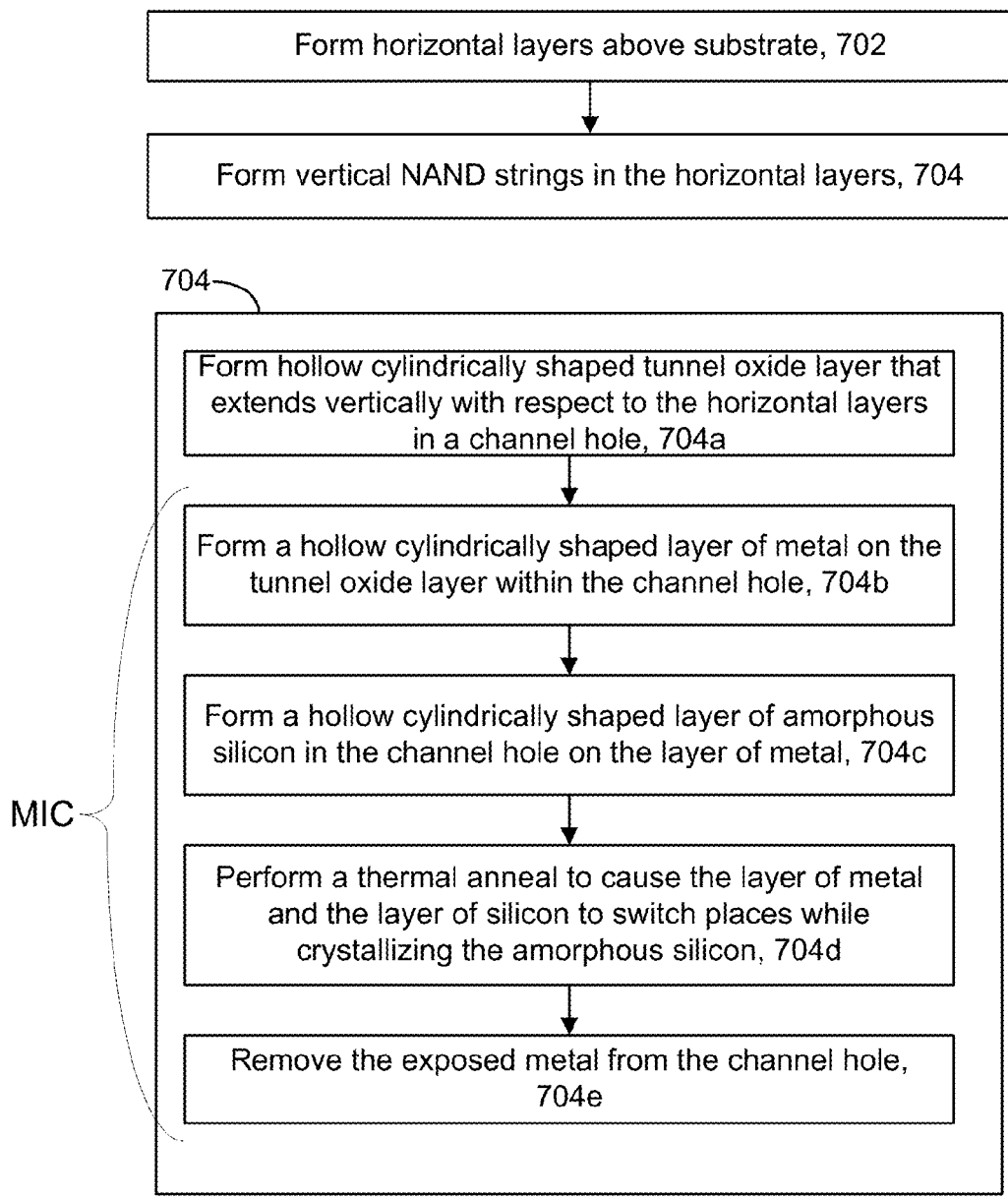
FIG. 7A is a flowchart depicting one embodiment of a process for fabricating 3D NAND memory having a crystalline silicon vertical NAND channel.
Figure 7B:
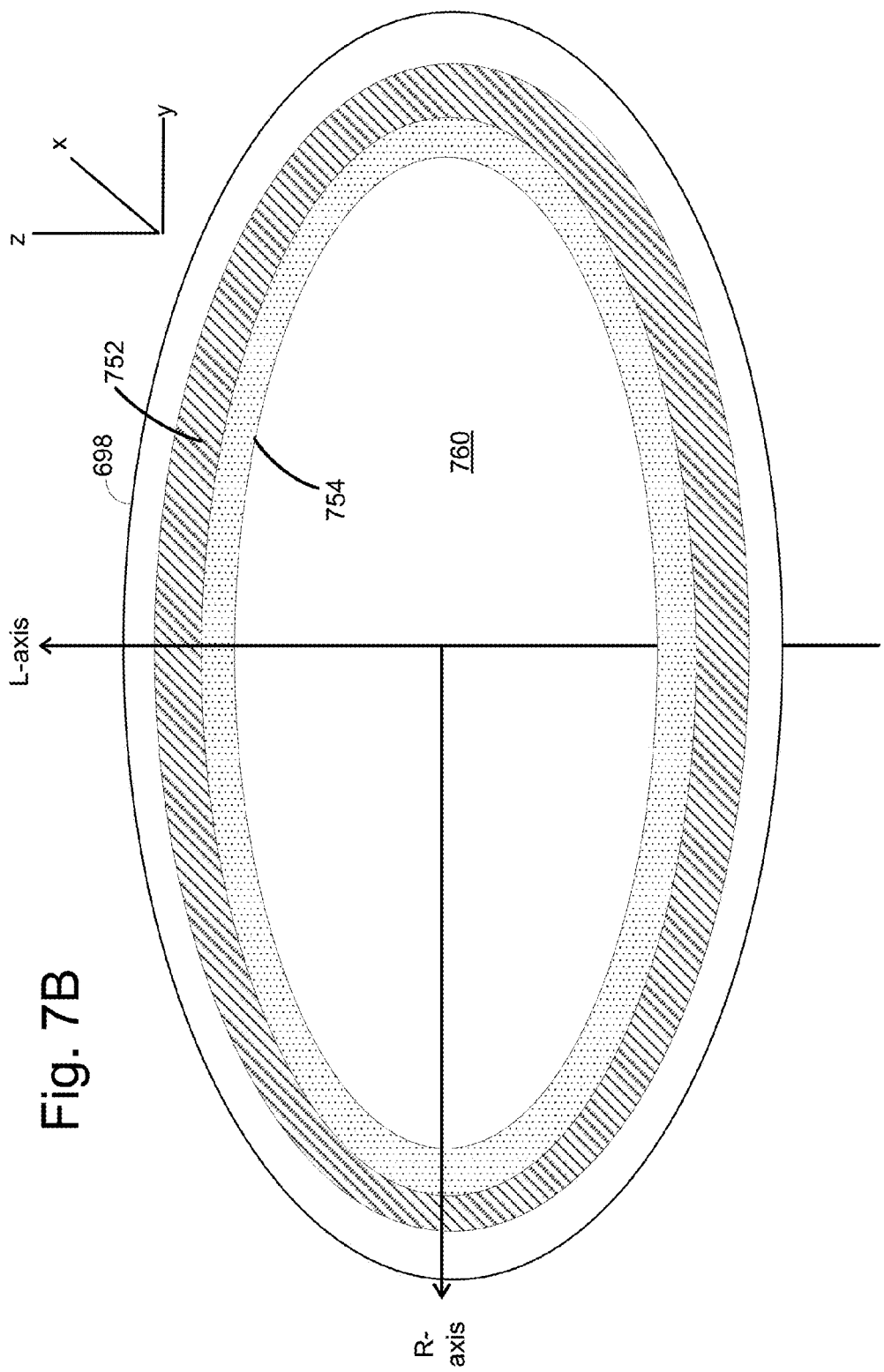
Figure 7D:
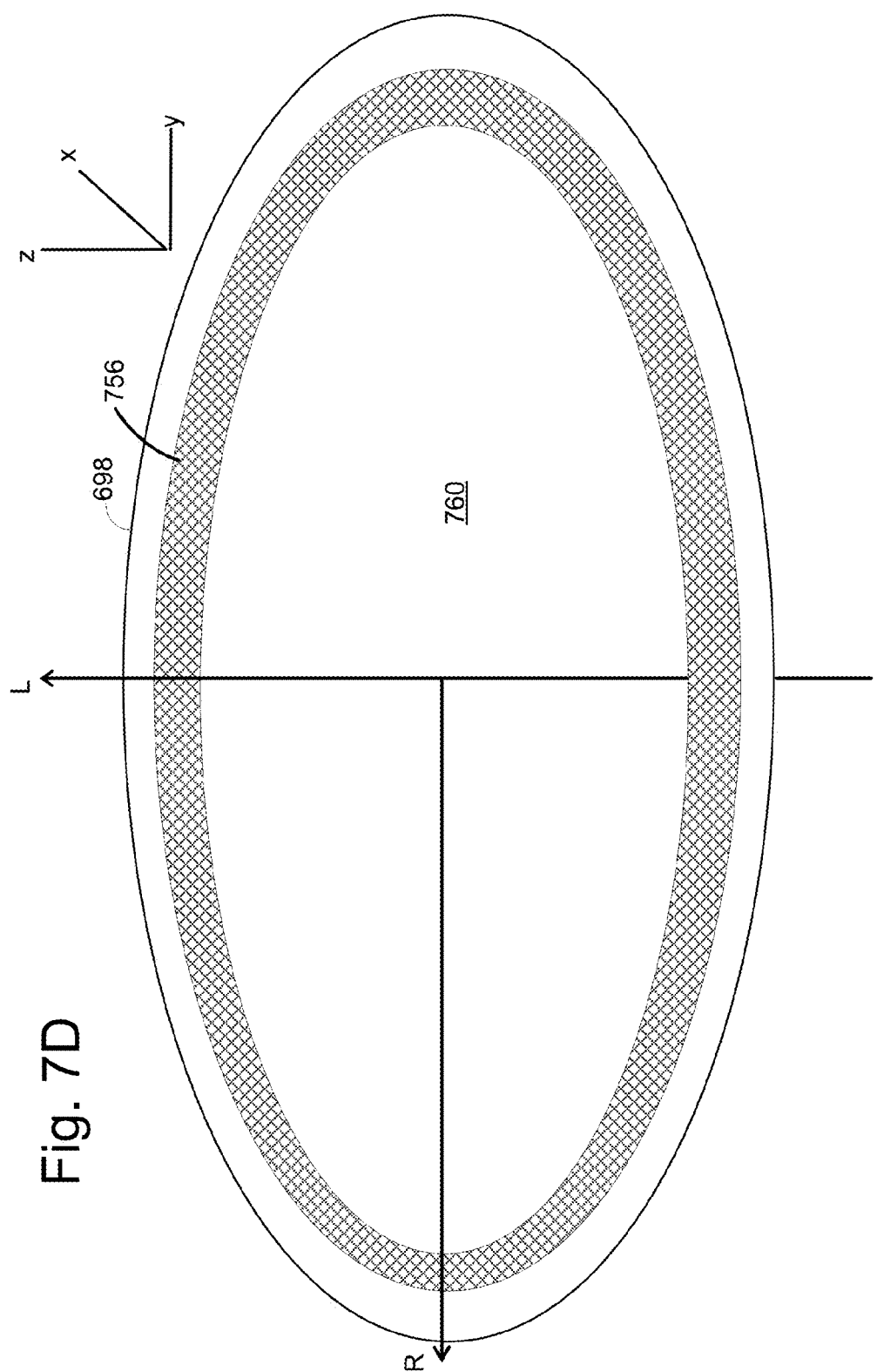

FIG. 7A is a flowchart depicting one embodiment of a process for fabricating 3D NAND memory having a crystalline silicon vertical NAND channel. FIGS. 7B-7D show results after various steps of the process of FIG. 7A. Not all process steps are depicted. This process could be used to form 3D NAND having straight NAND strings or U-shaped NAND strings. The process is used to form NAND strings having single crystal silicon channels having a (100) orientation with respect to the tunnel oxide of the NAND string, in one embodiment. The process is used to form NAND strings having non-single crystal silicon channels in which predominantly all of the channel is part of a polysilicon grain that has a (100) orientation with respect to the tunnel oxide of the NAND string, in one embodiment. The process is used to form NAND strings having large grain polysilicon channels in which all of the large grains have a (100) orientation with respect to the tunnel oxide of the NAND string, in one embodiment. The process is used to form NAND strings having large grain polysilicon channels in which most of the large grains have a (100) orientation with respect to the tunnel oxide of the NAND string, in one embodiment. This process describes a single round of a MIC process. In general, steps 704b-704e describe one round of a MIC process. Optionally, two or more rounds of a MIC process may be used. For the sake of discussion, formation of a NAND channel that uses two rounds of a MIC process will be described.

Step 702 is to form horizontal layers of material above a substrate. The substrate is a silicon substrate, in one embodiment. By a "horizontal layer" it is meant that the layer is horizontal with respect to the substrate. The horizontal layers are alternating layers of silicon oxide and silicon nitride, in one embodiment. The silicon oxide layers may be for insulating layers such as D0-D8 (see FIGS. 3B, 4B, 4C). The silicon nitride is sacrificial material, which will be replaced with metal or some other conductive material. The metal (or other conductor) is for select gate layers (e.g., SGS, SGD) and word line layers (e.g., WL0-WL5). This replacement can be performed either before or after the NAND strings are formed.

Therefore, one embodiment of step 702 is to form alternating layers of silicon oxide and silicon nitride. Another embodiment of step 702 is to form alternating layers of silicon oxide and metal (or some other conductor). Forming alternating layers of silicon oxide and metal can be achieved by replacing sacrificial silicon nitride with metal.

Step 704 is to form vertical NAND strings having crystalline silicon channels in the horizontal layers that were formed in step 702. In one embodiment, the vertical NAND strings are formed through alternating layers of silicon oxide and silicon nitride. In one embodiment, the vertical NAND strings are formed through alternating layers of silicon oxide and metal. The vertical NAND strings are formed perpendicular to the horizontal layers and are vertical with respect to the substrate.

Step 704 includes sub-steps 704a through 704e. Step 704a includes forming a hollow cylindrically shaped tunnel oxide layer that extends vertically with respect to the layers of horizontal material. FIGS. 5A and 5B depict one example of a hollow cylindrically shaped tunnel oxide layer 698 that extends vertically with respect to the layers of horizontal material. The tunnel oxide layer has an inner surface that defines a channel hole.

Step 704b includes forming a layer of metal on the tunnel oxide layer within the channel hole. This layer of metal is in direct physical contact with the tunnel oxide layer in one embodiment. In another embodiment, at least one other layer of material is between the layer of metal and the tunnel oxide. Thus, the phrase, "a first material is formed on a second material" or the like does not require direct physical contact between the first and second materials. This layer of metal has a hollow cylindrical shape, in one embodiment.

Step 704c includes forming a layer of amorphous silicon within the channel hole on the layer of metal. This layer of layer of amorphous silicon is in direct physical contact with the layer of metal in one embodiment. This layer of amorphous silicon has a hollow cylindrical shape, in one embodiment. FIG. 7B is a diagram to illustrate various layers after step 704c. The diagram represents a cross sectional slice in the x-y plane. The R-axis is depicted, along with the L-axis. The tunnel oxide layer 698, a first layer of metal 752, and a first layer of amorphous silicon 754 are depicted. Note that the first layer of metal 752 is between the tunnel oxide layer 698 and the amorphous silicon layer 754. The cross-sectional diagram depicts the various regions 698, 752, and 754 as rings. However, note that each region 698, 752, 754 is a hollow cylinder that extends in the direction of the L-axis. Also note that the region 760 inside of the first layer of amorphous silicon 754 is the presently empty portion of the channel hole. This region 760 will be referred to as the interior of the channel hole.

Step 704d includes performing a thermal anneal which causes a switch in location of the metal and the silicon from the first layer of amorphous silicon, as well as in crystallizing silicon from the first layer of amorphous silicon. FIG. 7C is a diagram to illustrate results after step 704d. A layer of crystalline silicon 756 is shown next to the tunnel oxide 698. A metal layer 758 is depicted on the crystalline silicon 756. The metal layer 758 is exposed to the interior 760 of the channel hole. Note that the crystalline silicon 756 is between tunnel oxide layer 698 and the exposed region of metal 758.

Referring to FIGS. 7B and 7C, the thermal anneal has caused metal from the first metal layer 752 to move (or diffuse) towards the interior of the channel hole 760 such that it now forms exposed metal region 758. Also, silicon from the amorphous silicon layer 754 has moved to region 756. Thus, the metal and the silicon have switched places. However, some of the metal may remain within the crystalline silicon 756. Typically, only a small portion of the metal remains within the crystalline silicon 756. Also note that the metal (e.g., metal atoms) may act as a dopant within the crystalline silicon 756. Additionally, the silicon is no longer amorphous silicon, but is now crystalline silicon. However, the silicon is not necessarily a single crystal of silicon throughout the channel 699.

Step 704e includes removing the exposed metal from the channel hole. This leaves the crystalline silicon 756 in the channel hole. FIG. 7D depicts results after step 704e. The process may conclude after steps 704b-704e have been performed once. Thus, the process may conclude after one round of the MIC process. Thus, region 756 in FIG. 7D is the crystalline silicon channel 699, in one embodiment. Note that the crystalline silicon channel 699 may have a hollow cylindrical shape.

Figure 7E:
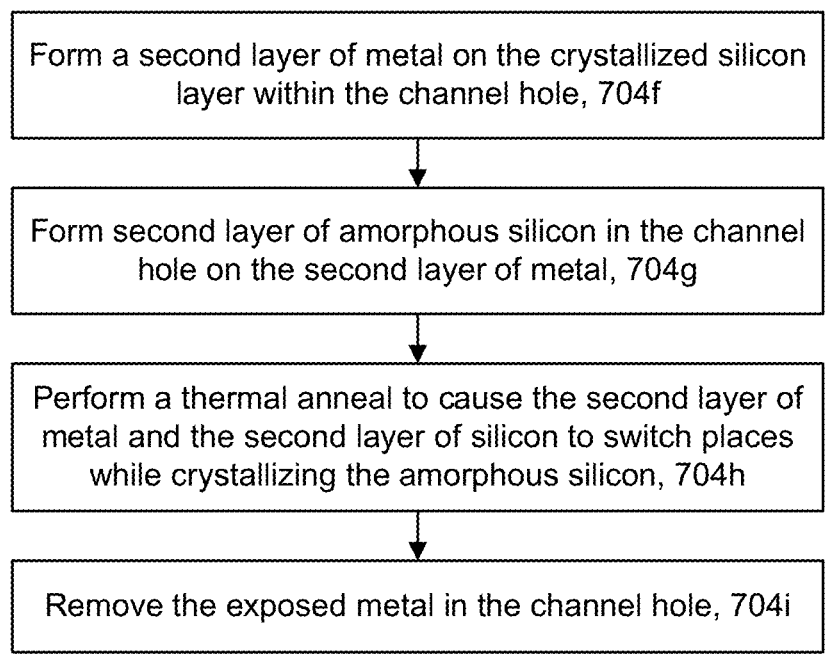
FIG. 7E is a process of one embodiment of performing a second round of a MIC process.
Figure 7F:
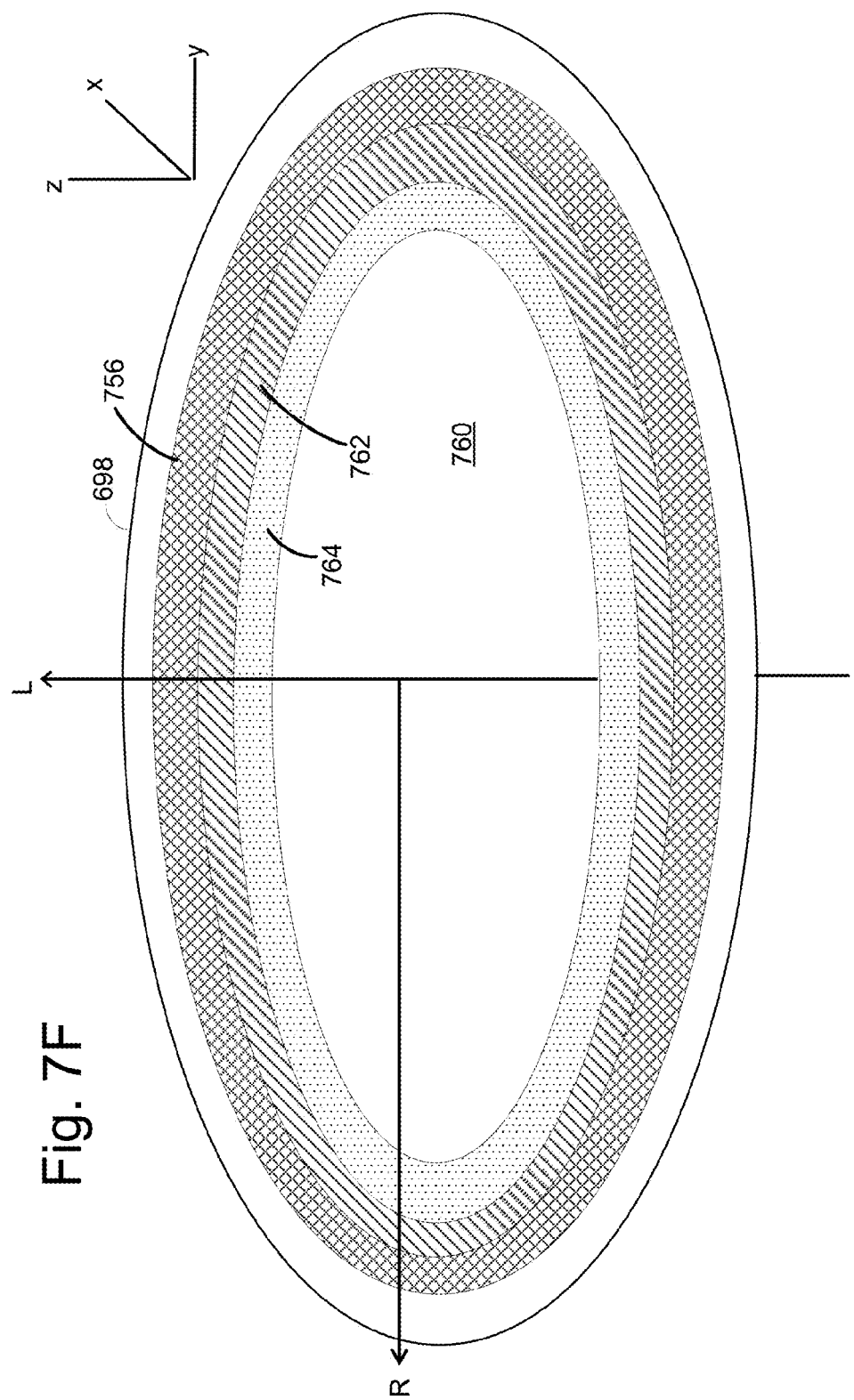

One option is perform another round of a MIC process after step 704*e*. FIG. 7E is a process of one embodiment of performing a second round of a MIC process. The layer of crystalline silicon that was formed in the first round of MIC will be referred to as a "base layer of crystalline silicon." FIGS. 7F-7H show results after steps of the process of FIG. 7E.

In step 704*f* a second layer of metal is formed on the base layer of crystalline silicon. This second layer of metal is in direct physical contact with the base layer of crystalline silicon in one embodiment. This second layer of metal has a hollow cylindrical shape, in one embodiment.

Step 704*g* includes forming a second layer of amorphous silicon within the channel hole on the second layer of metal. This second layer of layer of amorphous silicon is in direct physical contact with the second layer of metal in one embodiment. This second layer of amorphous silicon has a hollow cylindrical shape, in one embodiment. FIG. 7F is a diagram to illustrate various layers after step 704*g*. The diagram represents a cross sectional slice in the x-y plane. The R-axis is depicted, along with the L-axis. The tunnel oxide layer 698, base layer of crystalline silicon 756, a second layer of metal 762, and a second layer of amorphous silicon 764 are depicted. Note that the second layer of metal 762 is between the base layer of crystalline silicon 756 and the second layer of amorphous silicon 764. Also note that each region 698, 756, 762, and 764 is a hollow cylinder that extends in the direction of the L-axis.

Step 704*h* includes performing a second thermal anneal which causes a switch in location of the second metal and the silicon from the second layer of amorphous silicon, as well as in crystallizing silicon from the second layer of amorphous silicon. FIG. 7G is a diagram to illustrate results after step 704*h*. A single region of crystalline silicon 699 is shown next to the tunnel oxide 698. A metal layer 768 is depicted on the single region of crystalline silicon 699. The metal layer 768 is exposed to the interior 760 of the channel hole. Note that the single region of crystalline silicon 699 is between tunnel oxide layer 698 and the exposed region of metal 758.

Referring to FIGS. 7F and 7G, the second thermal anneal has caused metal from the second metal layer 762 to move (e.g., diffuse) towards the interior of the channel hole 760 such that it now forms exposed metal region 768. Also, silicon from the second amorphous silicon layer 754 has moved to region 699. Also note that the base layer of crystalline silicon 756 now forms part of the single region of crystalline silicon 699. Some of the metal may remain within the single region of crystalline silicon 699. Typically, only a small portion of the metal remains within the crystalline silicon 699. Also note that the metal (e.g., metal atoms) may act as a dopant within the crystalline silicon 699.

Step 704*i* includes removing the exposed metal. FIG. 7H shows results after step 704*i*, in which the exposed metal 768 has been removed from the channel hole. As discussed, there may be some residual metal in the region of crystalline silicon 699 after the second thermal anneal. One option is to remove some of the residual metal by the use of a sacrificial layer. This will be discussed below with respect to FIGS. 11 and 12.

Figure 8C:
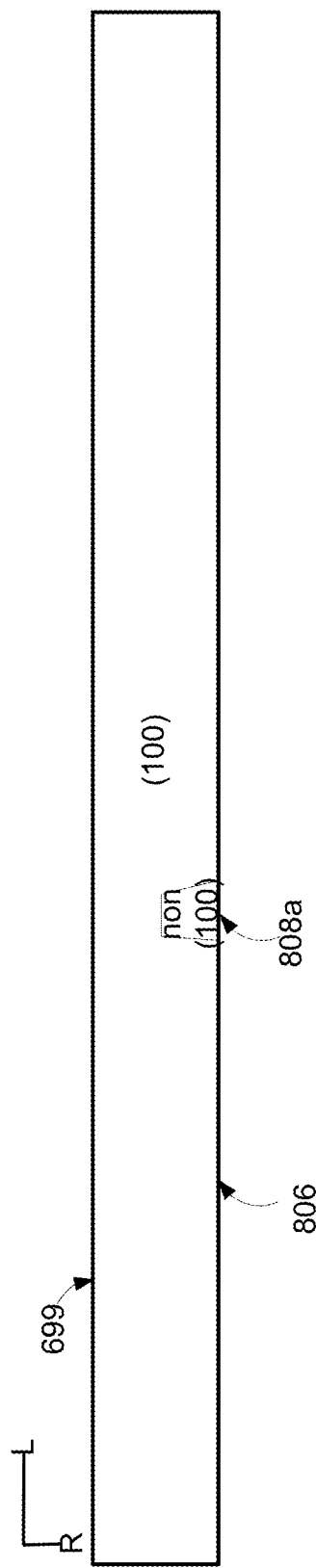

FIGS. 8A-8D show additional details of crystal orientation during of one embodiment of forming the channel 699. FIGS. 8A and 8B show results during one embodiment of a second round of MIC. FIG. 8A shows results after the second layer of metal and the second layer amorphous silicon have been formed. The longitudinal (L) and radial (R) axes are depicted. FIG. 8A shows a base layer of crystalline silicon 756, a second layer of metal 762, and a second layer of amorphous silicon 764. This stage is fabrication is similar to what is depicted in FIG. 7F. Note that this is prior to performing the second thermal anneal. The diagram could represent the entire length of what is to become the NAND string channel from the top to the bottom, or some subset of the top to bottom length of the channel.

The base layer of crystalline silicon 756 has some grains 806*a*, 806*b*, 806*c* that have a (100) orientation. As discussed above, the (100) orientation is with respect to the surface of the tunnel oxide (not depicted in FIG. 8A). Several grain boundaries 802 are also depicted. Some of the grains 808*a*, 808*b* have a non (100) orientation at this stage. A non (100) orientation refers to a region that is either amorphous or to a grain of polysilicon that has an orientation other than (100) with respect to the channel oxide surface. The grains 806 having the (100) orientation may be large grain polysilicon at this stage. For example, in the direction of the L-axis, the grains may be on the order of a micron. Note that this may be a thin semiconductor film, such that in the R-direction the thickness is much less than 1 micron.

FIG. 8B depicts the structure of FIG. 8A after the second thermal anneal (such as in step 704*h* of FIG. 7E). The exposed metal 768 is depicted on the single region of crystalline silicon 699. FIG. 8B shows growth of the (100) orientation grains 806*a*-806*c*, as depicted by arrows. Former grain boundaries 812 are depicted by dashed lines. Also, the boundary of the former base layer of silicon 756 is depicted by a dashed line. Growth of the (100) orientation crystals is shown along the L-axis, as well as along the R-axis. The non (100) grains 808 may re-crystallize and merge with the (100) grains 806. The size of the non (100) grains in the L-direction is much less in FIG. 8B compared to FIG. 8A. Note that a non (100) grain 808 could be completely eliminated by this stage of the process. Several arrows in the R-direction depict growth of the (100) grains in the radial direction. The direction of this growth is from the base layer 756 inward towards the channel hole. Thus, in one embodiment, the crystallization occurs in a direction along the radial axis (R). Note that this is perpendicular to the cylindrical surface of the tunnel oxide 698.

FIG. 8C depicts results after the exposed metal has been removed (such as in step 704*i* of FIG. 7E). Also, a crystallization anneal has been performed. This optional crystallization anneal was not discussed with respect to FIG. 7E. The crystallization anneal may cause further re-crystallization of the non (100) grains. That is, the non (100) grains may re-crystallize, re-grow, and merge into the (100) grains. In this example, a single non (100) grain 808*a* is depicted after the crystallization anneal. Also, what was formerly three (100) grains 806*a*, 806*b*, 806*c* has now become a single (100) grain 806.

Thus, the channel region 699 comprises grains 806, 808 of polysilicon with predominantly all of the silicon channel 699 being part of a grain 806 of polysilicon having the (100) orientation with respect to the surface of the tunnel oxide. For example, predominantly all of the silicon channel 699 is part of grain 806, which has the (100) orientation. A very small part of the silicon channel 699 is part of grain 808*a*, which does not have the (100) orientation. Grain 806 may be a large grain of polysilicon (e.g., extends at least one micrometer in the L-direction).

Figure 8D:
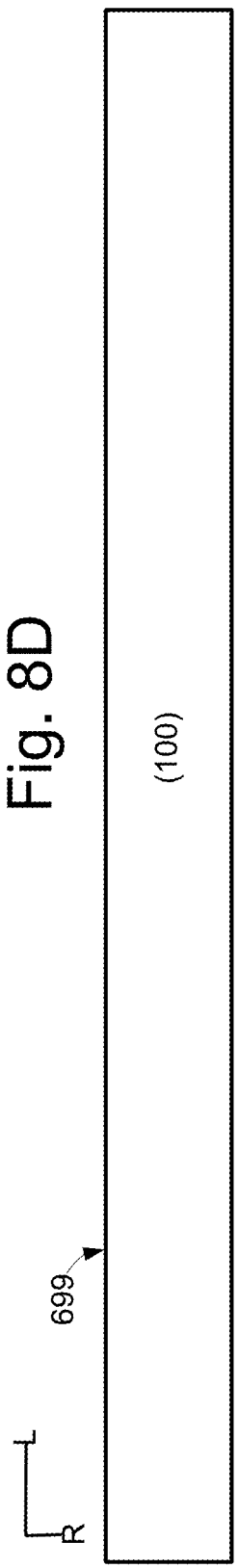

It is possible that the entire channel 699 could be a single crystal having the (100) orientation with respect to the surface of the tunnel oxide. This is represented in FIG. 8D. FIG. 8D represents a stage similar to that of FIG. 8C. Thus, the crystallization may occur along the entire length of the channel (in the longitudinal direction). Note that depending on growth conditions, the single crystal having the (100) orientation could occur earlier in the process, such as after the stage depicted in FIG. 8B. For example, the single crystal might form prior to the crystallization anneal described with respect to FIG. 8C.

Figure 9:
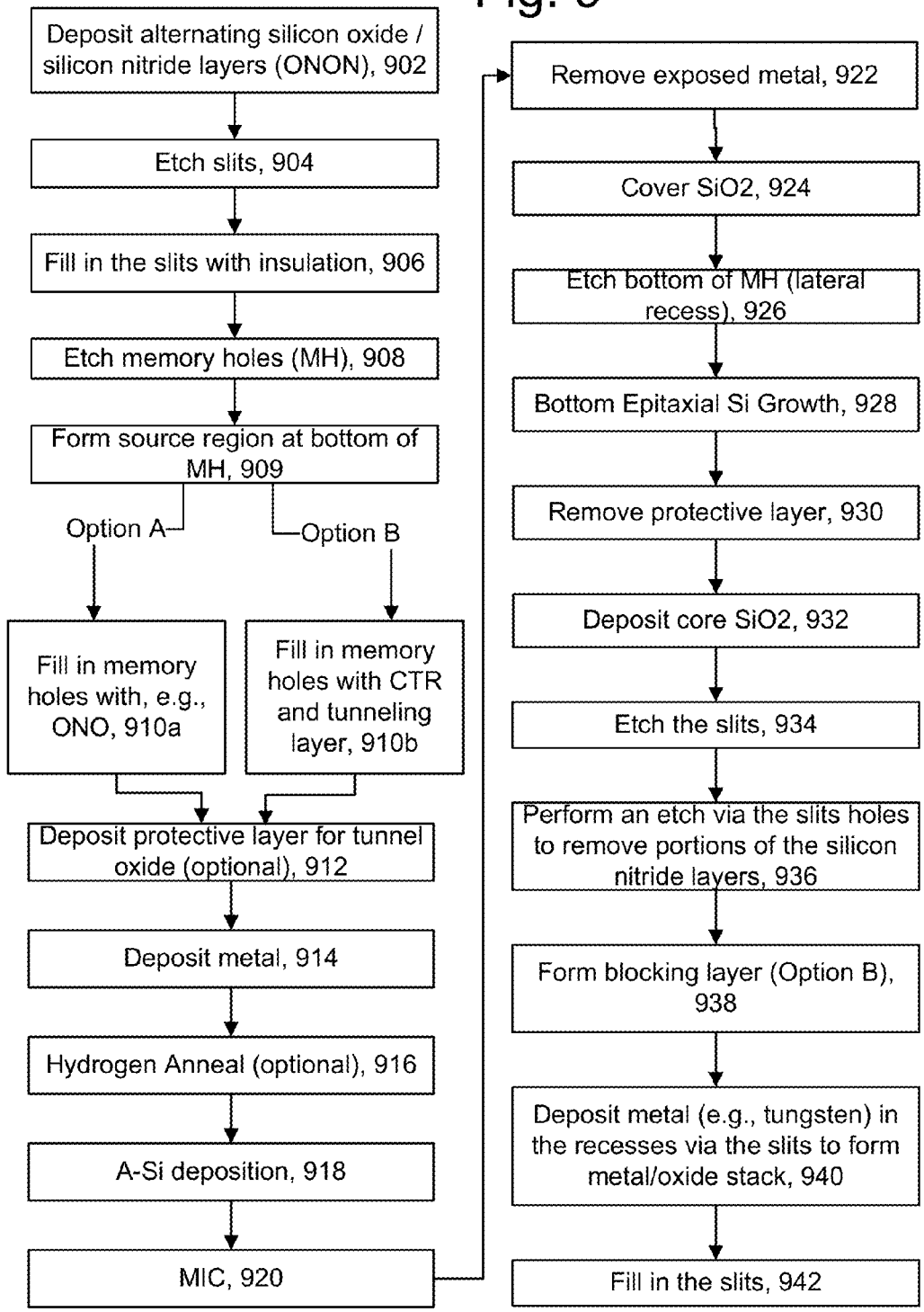
FIG. 9 is a flowchart of one embodiment of a process of fabricating a 3D memory array in which the NAND string channels are formed using a MIC process.

FIG. 9 is a flowchart of one embodiment of a process of fabricating a 3D memory array in which the NAND string channels are formed using a MIC process. In FIG. 9, steps need not necessarily be performed as discrete steps in the order indicated. Various modifications can be made. Moreover, other steps which are known from the art of semiconductor fabrication but are not explicitly depicted here may also be performed. FIG. 9 represents a "word line last" technique in which the word lines are formed after forming the NAND strings. For example, after forming the NAND strings, sacrificial silicon nitride is replaced with metal.

Prior to this process, below-stack circuitry and metal layers may be formed on substrate. Various circuits may be formed in the substrate 201. For example, a metal layer M0 can be used, e.g., for power line and global control signals, and a metal layer M1 can be used, e.g., for bit line and bus signals. In some cases, to make signal routing easier and to save area, a third metal (M2) can also be used, e.g., a total of three (or more) metal layers under the array. The metal layers can be fabricated from a patterned metal film. For example, aluminum can be used for the top metal layer, while the other layers are tungsten. Potentially, copper can be used instead of aluminum for upper layer, using a corresponding integration scheme. For silicidation, Ni, Ti, Co or W can be used, for instance.

Step 902 includes depositing alternating silicon oxide ($SiO_2$)/silicon nitride (SiN) layers above the substrate 201. The silicon nitride is a sacrificial layer, which will be replaced by metal to form word lines (as well as a source select line (SGS), and a drain select line (SGD or SG)). The silicon oxide will be used for the insulating layers between the metal word (and select) lines. Other insulators could be used instead of silicon oxide. Other sacrificial materials could be used instead of silicon nitride. Step 902 is one embodiment of step 702 from FIG. 7, which is forming horizontal layers above a substrate.

Step 904 includes etching slits in the alternating silicon oxide ($SiO_2$)/silicon nitride (SiN) layers. Step 906 includes filling in the slits with insulation. FIGS. 4B and 4C show examples of slits 502 for straight NAND strings. FIG. 4A shows one example of slits 408 for U-shaped NAND strings.

Step 908 includes etching memory holes (MH) in the alternating layers of silicon nitride and silicon oxide. Reactive ion etching can be used to each the memory holes. In the memory array area, the memory holes are placed densely. For example, the memory holes can have a diameter of 70-110 nanometers (nm) ($70-110 \times 10^{-9}$ meters). This is an example range; other ranges could be used. Also note that the diameter could vary from top to bottom.

Figure 10A:
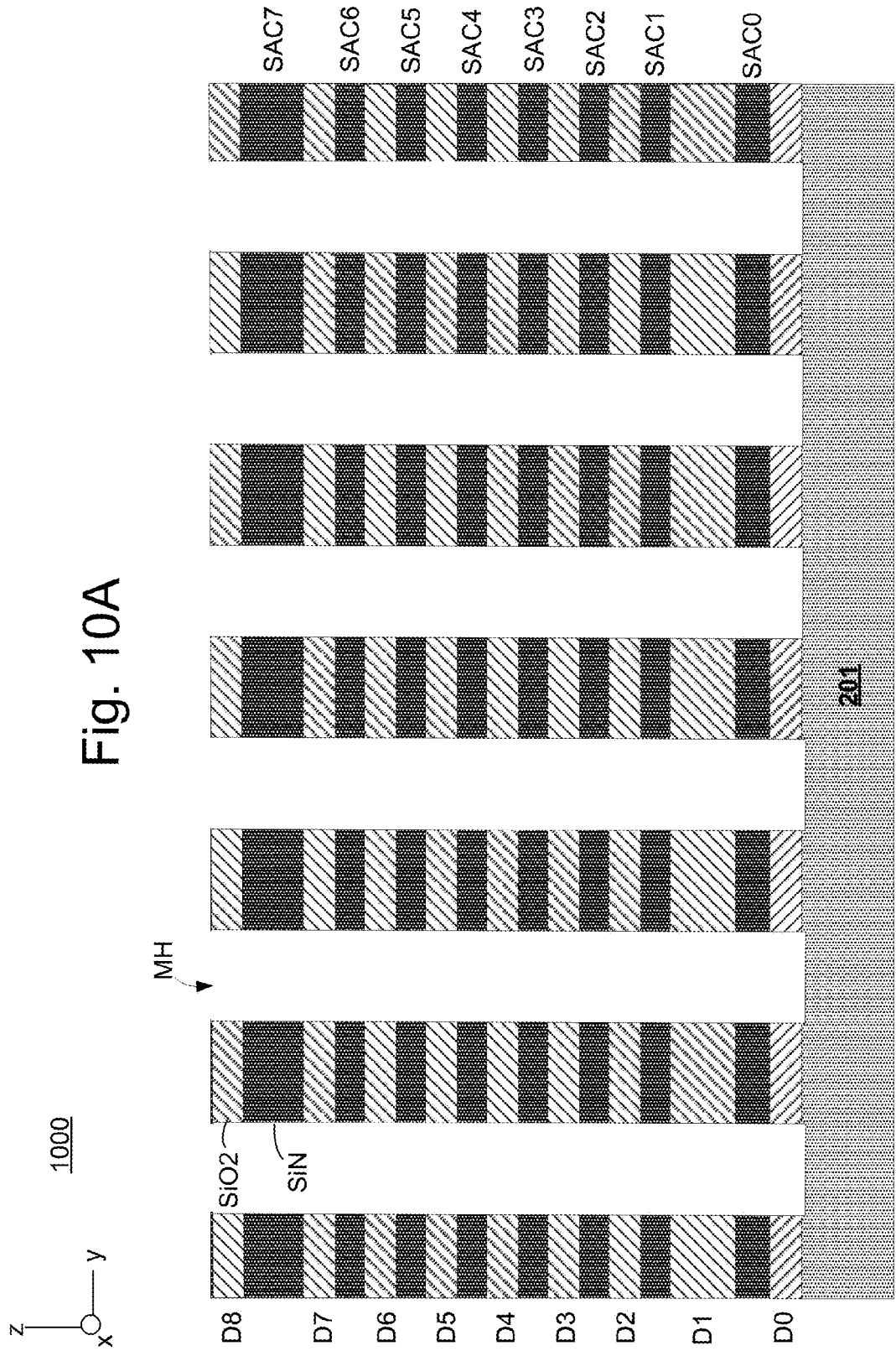
FIGS. 10A-10Q shows results after various steps of the process of FIG. 9.

FIG. 10A shows results after step 908. FIG. 10A shows sacrificial layers (SAC0-SAC7) alternating with insulating layers (D0-D8) in a stack 1000 over a substrate 201. The sacrificial layers are silicon nitride (SiN) in this embodiment and will eventually be layers SGS, WL0, WL1, WL2, WL3, WL4, WL5, and SGD. The insulating layers are silicon oxide in this embodiment. Six memory holes (MH) are depicted as extending vertically through the alternating sacrificial layers and insulating layers. The memory holes extend down to the substrate 201, which is formed from silicon in one embodiment. Etching the memory holes could etch partway into the substrate 201. An x-y-z coordinate system is depicted, showing that direction of formation.

Figure 10B:
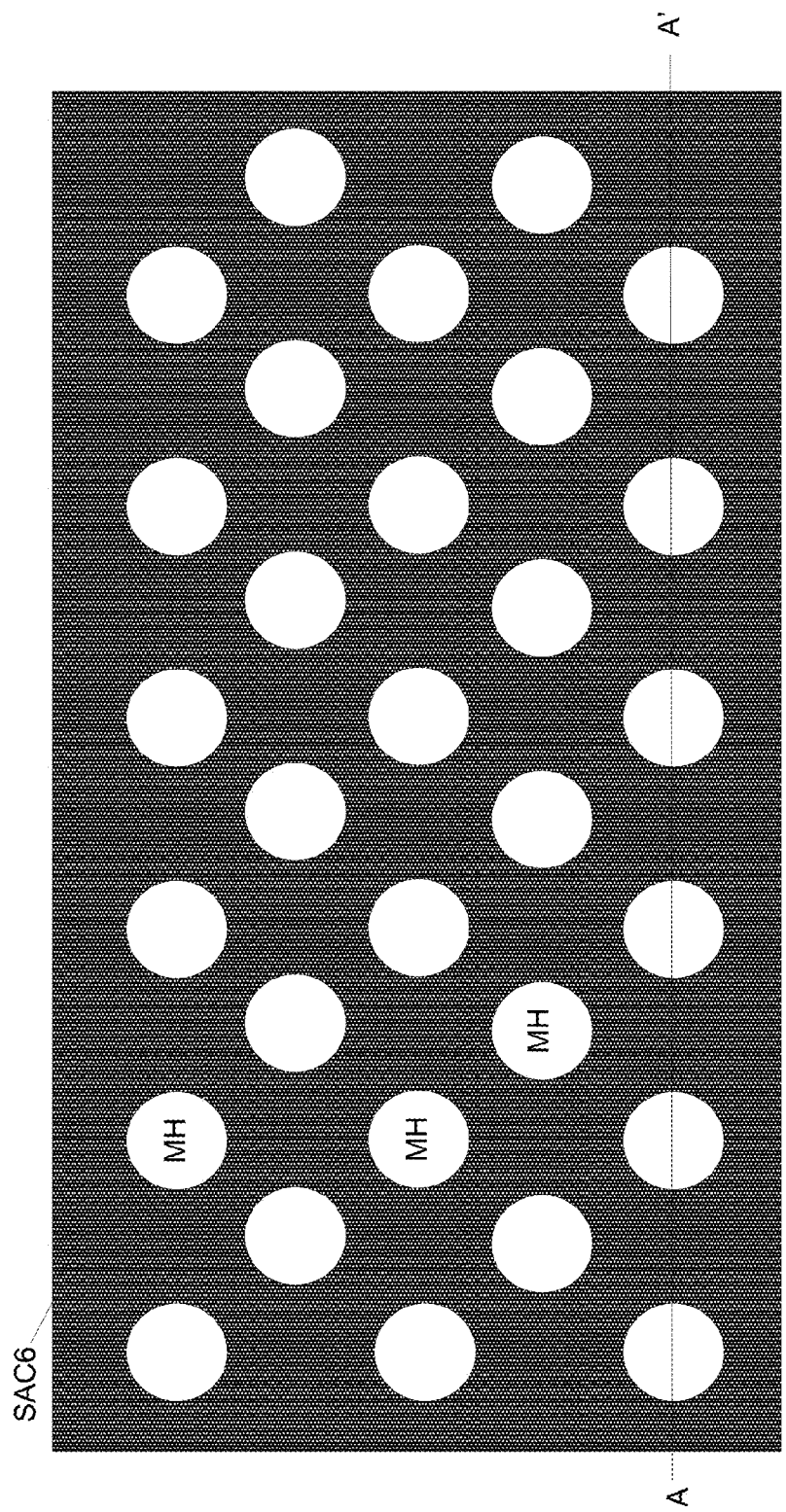

FIG. 10B shows a cross sectional view of layer SAC6 from FIG. 10A after step 908, showing one possible pattern for the memory holes (MH). This is not the only possible pattern. For example, the memory holes do not need to be staggered as depicted. An x-y-z coordinate system is depicted, showing that direction of formation. Note that line A-A' indicates that FIG. 10A is a cross section along line A-A' of FIG. 10B. Also note that the memory holes have a circular cross section in the horizontal direction (e.g., x-y plane), in this example. The memory holes are not required to be circular. Note that the memory holes could be of different diameter in the different layers. For example, the memory holes could have a smaller diameter at the lower layers. The slits are not depicted in FIGS. 10A-10B so as to not obscure the diagrams.

Figure 10C:
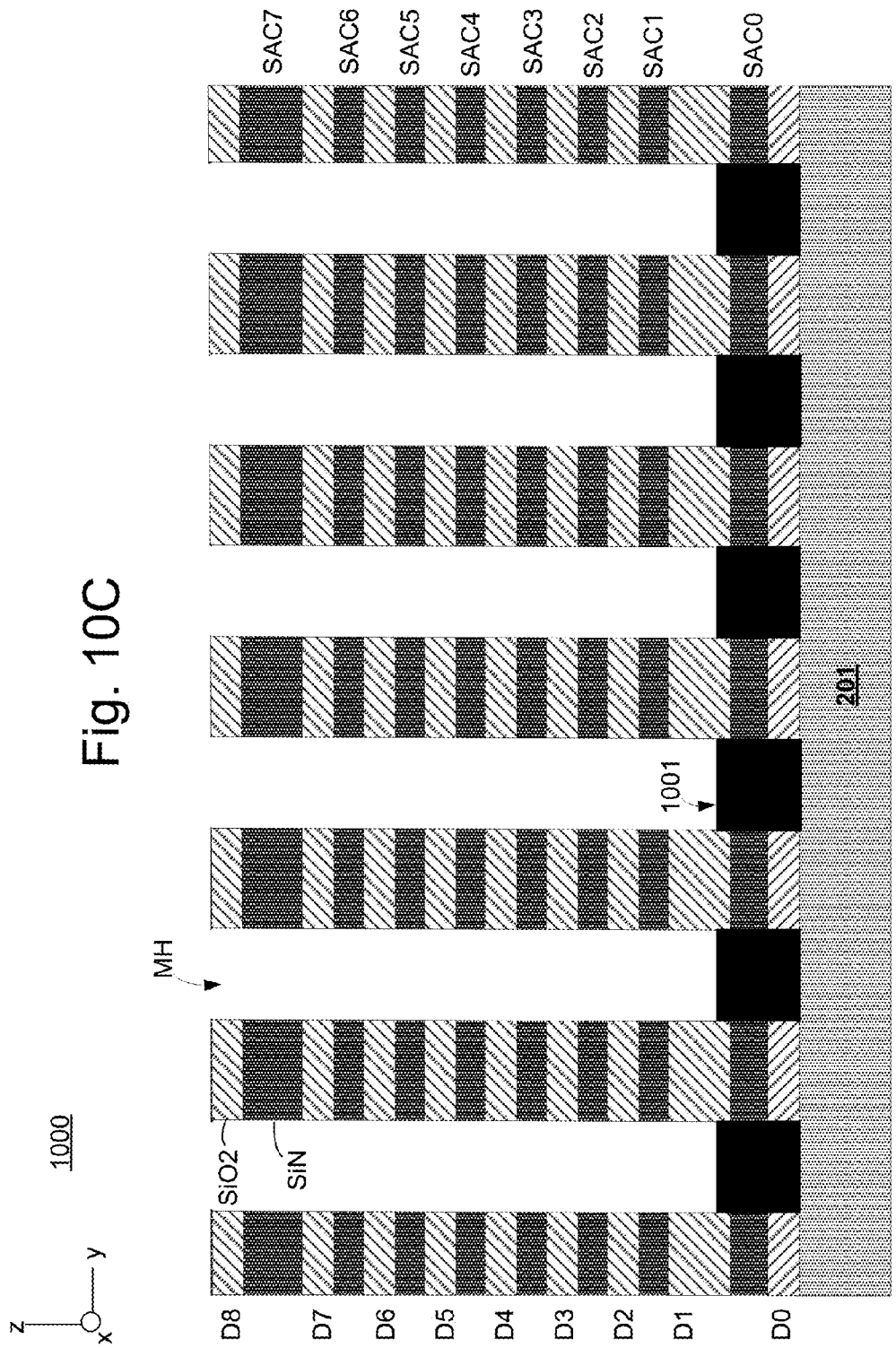

Step 909 includes formation of silicon at the bottom of the memory holes for the source side select gate transistor bodies (see FIG. 5C, 516). In one embodiment, the silicon is single crystal silicon. This could be formed by, for example, epitaxial growth. FIG. 10C depicts results after step 909, showing silicon 1001 in the bottom of the memory holes, which will become source side select gate transistor bodies 516.

Step 910a and step 910b describe two alternative options. Step 910a includes filling in memory holes with, for example, oxide-nitride-oxide (ONO). Step 910a is Option A. The following describes details of one embodiment of filling memory holes. In one approach, the memory holes are filled in by depositing ONO on sidewalls of the columnar memory holes, e.g., using ALD. In one embodiment, layers such as layers 696-698 are formed in the memory holes (see FIG. 5A-5C). A block oxide can be deposited as layer 696, a nitride such as SiN as a charge trapping layer can be deposited as layer 697, and a tunnel oxide can be deposited as layer 698. The ONO layers form a dielectric stack, in one embodiment. The stack layers can be more complex, such as where at least one of these layers can be a combination of layers of oxide and nitride. One example of ONO is $SiO_2$, SiN, $SiO_2$.

Step 910a is just one example of the initial filling of the memory holes with other alternatives existing. One option is to add an aluminum oxide layer first, prior to the ONO. Another option is for the tunnel oxide to comprise multiple layers, such as $SiO_2$ and SiON, with the $SiO_2$ nearest the charge trapping region (e.g., SiN). The tunnel oxide might also include $SiO_2$ and ISSG (in-situ steam generation) formed oxide, with the $SiO_2$ nearest the charge trapping region. The tunnel oxide might also include three layers: $SiO_2$, SiON, and ISSG formed oxide. Thus, the layers from outside in could comprise: $Al_2O_3$, $SiO_2$, SiN, $SiO_2$, SiON, ISSG oxide.

In one embodiment, the blocking layer is not deposited in step 910, but is formed later. Step 910b is for an Option B, in which the blocking layer is formed later (see optional step 938). In step 910b, first a layer of ISSG generated oxide is formed in the memory holes. This could be about 5 to 6 nm (5 to $6 \times 10^9$ meters). Then, the charge trapping layer and tunneling layer are deposited in the memory holes. The charge trapping layer and tunneling layer may be deposited as described in step 910a. The ISSG generated oxide serves as a protective layer for the tunnel oxide during later processing steps.

Figure 10E:
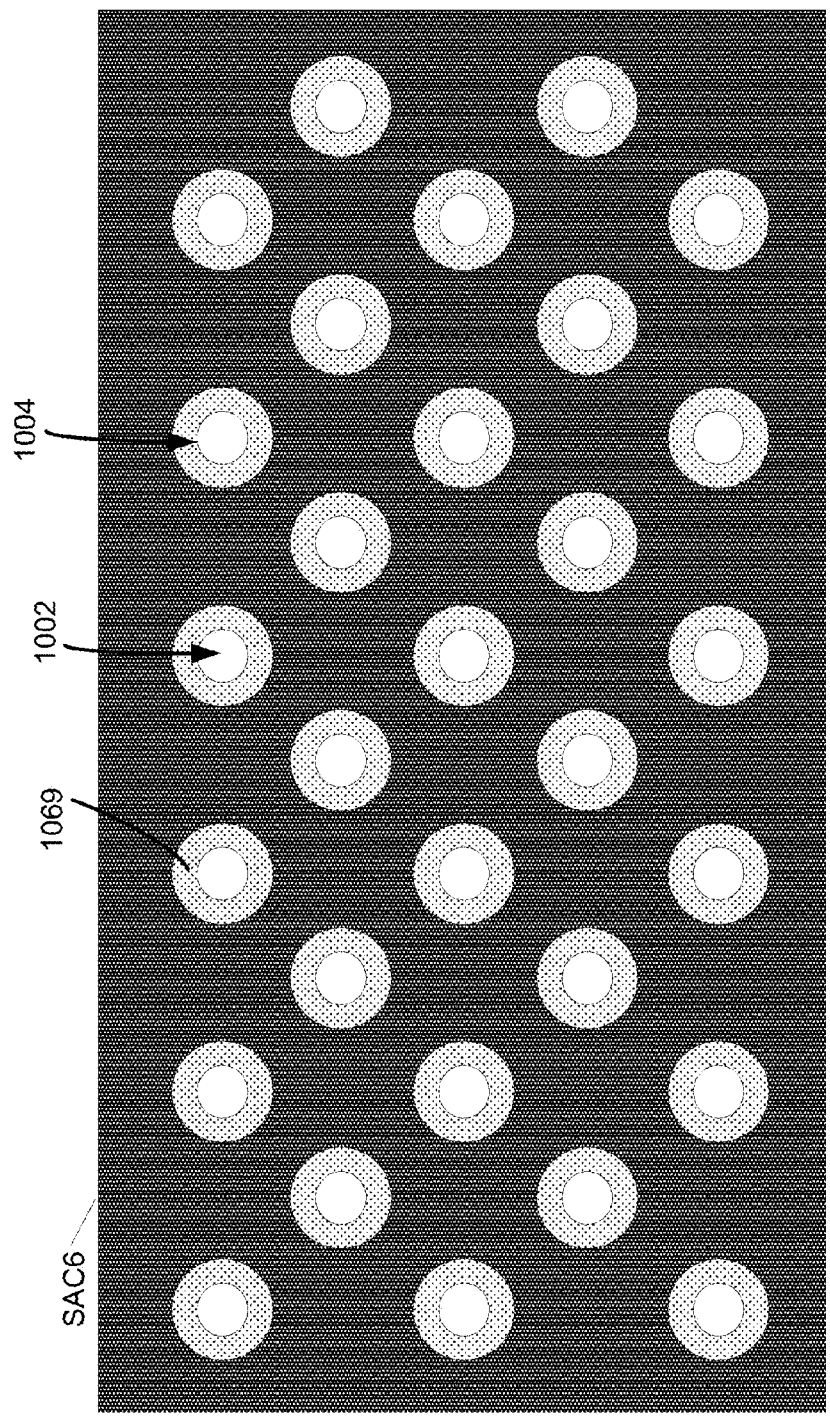

FIGS. 10D and 10E show results after step 910a. Blocking layer 696, charge trapping layer 697 and tunnel oxide layer 698 of FIGS. 5A-5C are represented in FIG. 10D by region 1069. Region 1069 covers sidewalls of the memory holes, as well as the bottom of the memory holes over the silicon 1001. As noted in step 910b, instead the layers in FIG. 10D could be ISSG generated oxide, charge trapping layer 697 and tunnel oxide layer 698. Other possibilities exist. FIG. 10E shows a cross sectional view (horizontal or x-y plane cross section of layer SAC6) after step 910a, showing region 1069 in the memory holes (MH). Region 1069 is a hollow cylinder, in this example. The inside of the hollow cylinder is referred to as a channel hole 1002. The channel hole 1002 is defined by an exposed surface of the tunnel oxide.

Steps 912-922 describe one round of a MIC process. The process can be modified to include a second round, third round, etc.

Figure 13:
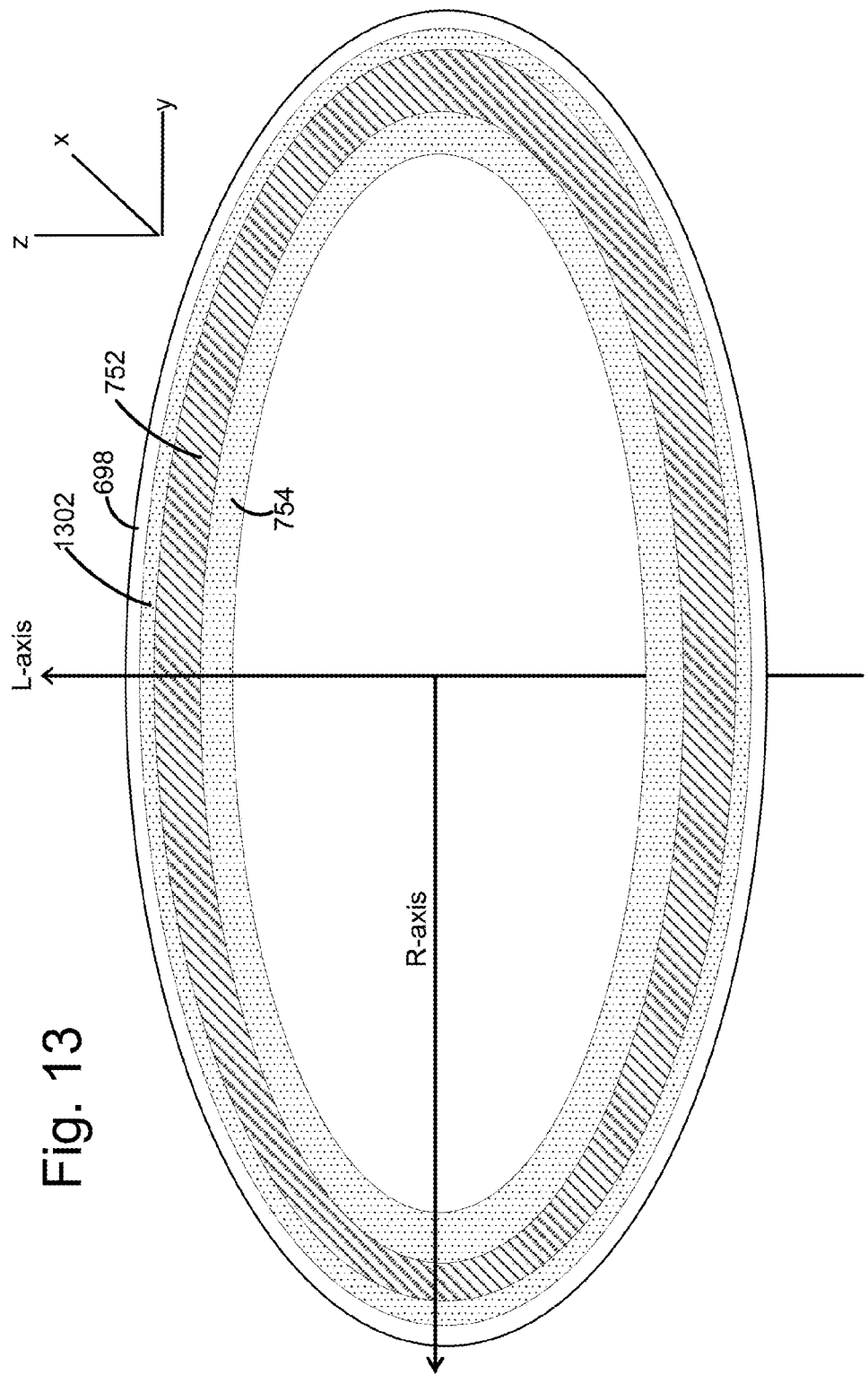
FIG. 13 is a diagram that depicts one embodiment of a protective amorphous silicon layer over the tunnel oxide layer.

Step 912 is forming a protective layer on the tunnel oxide. The protective layer may serve to protect the tunnel oxide during deposition of the first layer of metal. One example for the protective layer is amorphous silicon. As one example, the amorphous silicon is about 5 nanometers ($5 \times 10^{-9}$ meters) in thickness. A material other than amorphous silicon could be used for the protective layer. Step 912 is optional. Its use could depend on what type of metal is being used for the MIC process. In one embodiment, the protective layer is used when aluminum is the metal for the MIC process. The protective layer can be used when other metals are used for the MIC process. FIG. 13, to be discussed below, shows one example of a protective layer (FIG. 13, 1302). After the protective layer is deposited, a pre-cleaning step may be performed. As one example, the pre-cleaning step may use DHF (HF in deionized water).

Step 914 is depositing the metal that will be used for this round of the MIC process. Example metals include, but are not limited to, aluminum (Al), nickel (Ni), silver (Ag), gold (Au), platinum (Pt), and palladium (Pd).

Example conditions for depositing nickel are chemical vapor deposition (CVD) at a temperature of 350 degrees Celsius. A precursor of bis-methylcyclopentadienyl-nickel may be used. An example thickness for the nickel is 5 nm ($5 \times 10^{-9}$ meters). An example thickness for the aluminum is 2 to 5 nm (2 to $5 \times 10^{-9}$ meters). The thickness of the metal may depend on whether the protective layer is used in step 912 (e.g., the metal may be thicker when the protective layer is used). Also, the thickness of the metal may depend on the thickness of the amorphous silicon formed in step 918.

Step 916 is an optional hydrogen anneal. The hydrogen anneal could depend on which metal is being used. In one embodiment, the hydrogen ($H_2$) anneal is used when nickel is the metal for the MIC process. An example temperature for the $H_2$ anneal is 400 degrees Celsius. In one embodiment, the hydrogen anneal is not used when aluminum is the metal for the MIC process.

Step 916 is depositing a layer of amorphous silicon. Example deposition conditions for when nickel is the metal are as follows. Precursors are $SiH_4$ or dichlorosilane (DCS). Deposition temperature is 500 to 600 degrees Celsius. The thickness of the amorphous silicon could be 10 to 15 nm (10 to $15 \times 10^{-9}$ meters). These numbers are for illustration and can vary.

As noted above, there could be a layer of amorphous silicon deposited in step 912. If so, this may impact the thickness of the amorphous silicon formed in step 916. In one embodiment, the combined thickness of these two layers is about the same as the layer from step 918 when the layer is not formed in step 912.

Figure 10F:
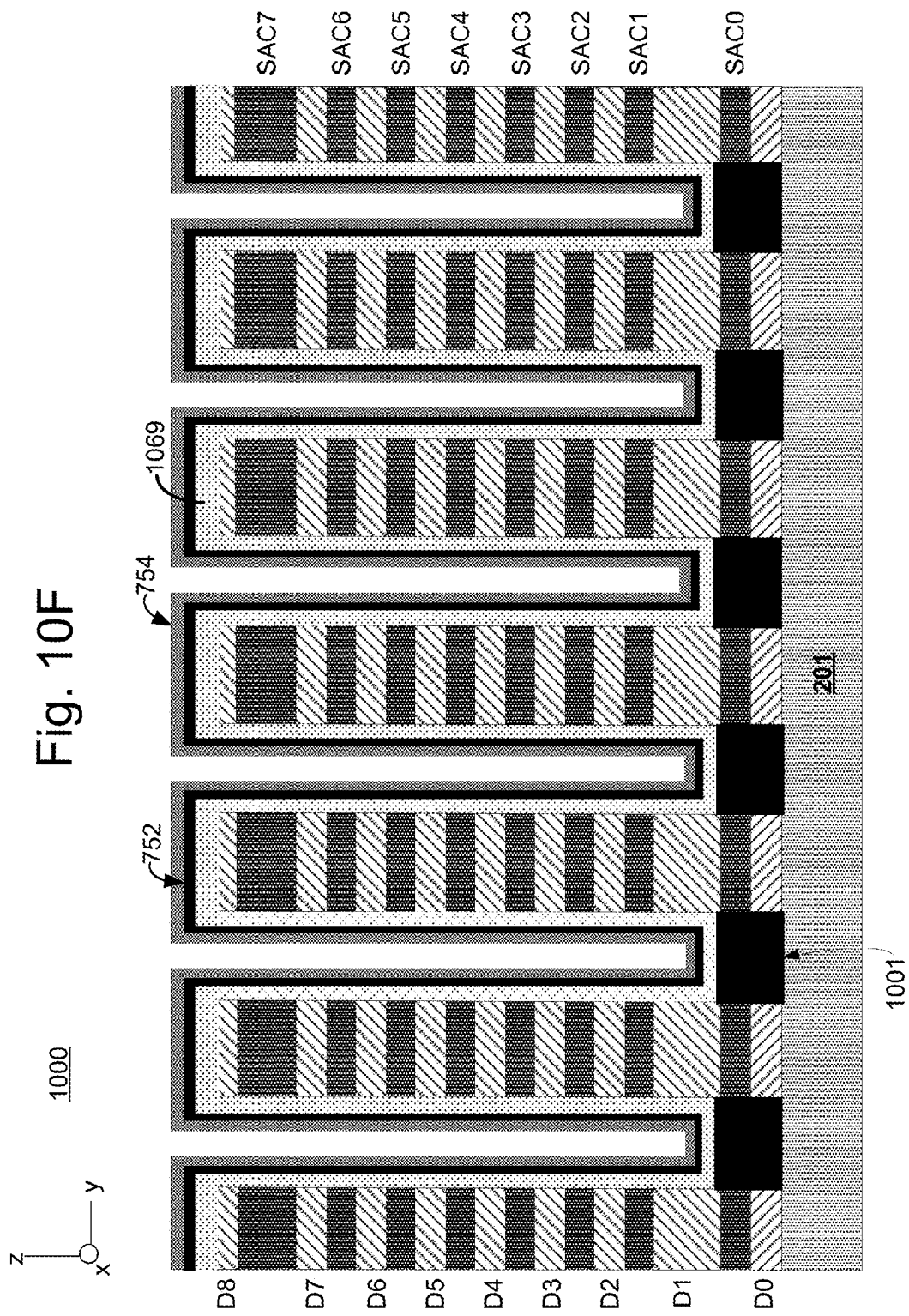
Figure 10G:
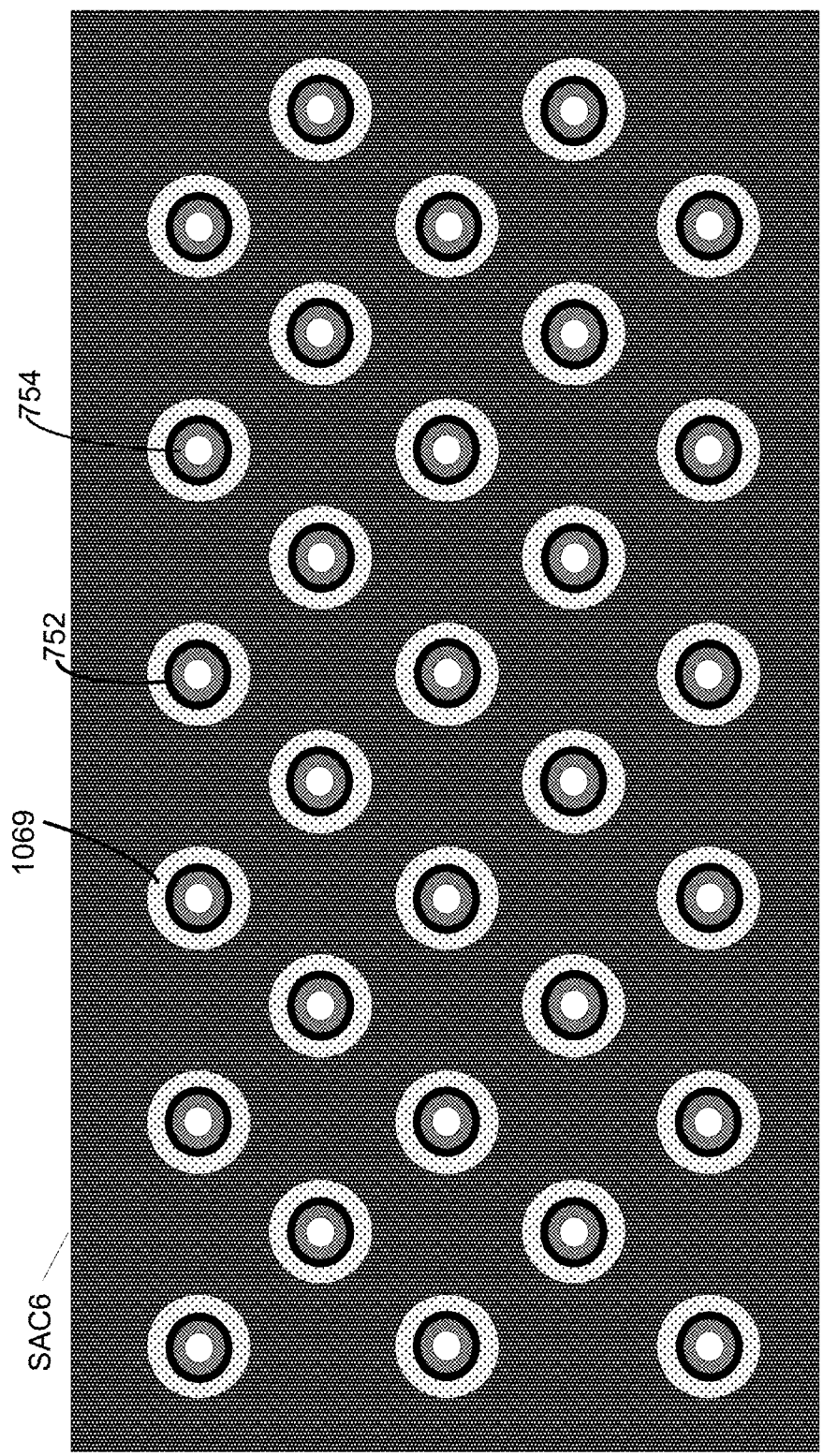

FIGS. 10F and 10G shows results after step 916 for the option in which the protective layer from step 912 is not used. A layer of metal 752 is shown in the memory holes (and also over the tops of the stack 1000). The layer of metal is formed on layer 1069. In this example, layer of metal is formed directly on layer 1069. In another embodiment, there is a protective layer between the layer of metal 752 and layer 1069. Recall that the portion of layer 1069 that is closest to the metal layer 752 is the tunnel oxide. Thus, the metal layer 752 may be formed as a conformal layer on exposed sidewalls of layer 1069 in the memory hole, as well as on layer 1069 at the bottom of the memory hole.

A layer of amorphous silicon 754 is also shown on the layer of metal. In this example, the layer of amorphous silicon 754 is formed directly on the layer of metal 752. Thus, the amorphous silicon 754 may be formed as a conformal layer on exposed sidewalls of metal layer 752 in the memory hole, as well as on metal layer 752 at the bottom of the memory hole.

Step 920 is metal induced crystallization (MIC). The details of MIC may depend on the metal. As one example, for nickel the anneal temperature may be about 350 to 450 degrees Celsius. Additionally, a nitrogen gas ($N_2$) flow of 10 to 50 sccm may be used. As another example, for aluminum the anneal temperature may be about 400 degrees Celsius.

Figure 10H:
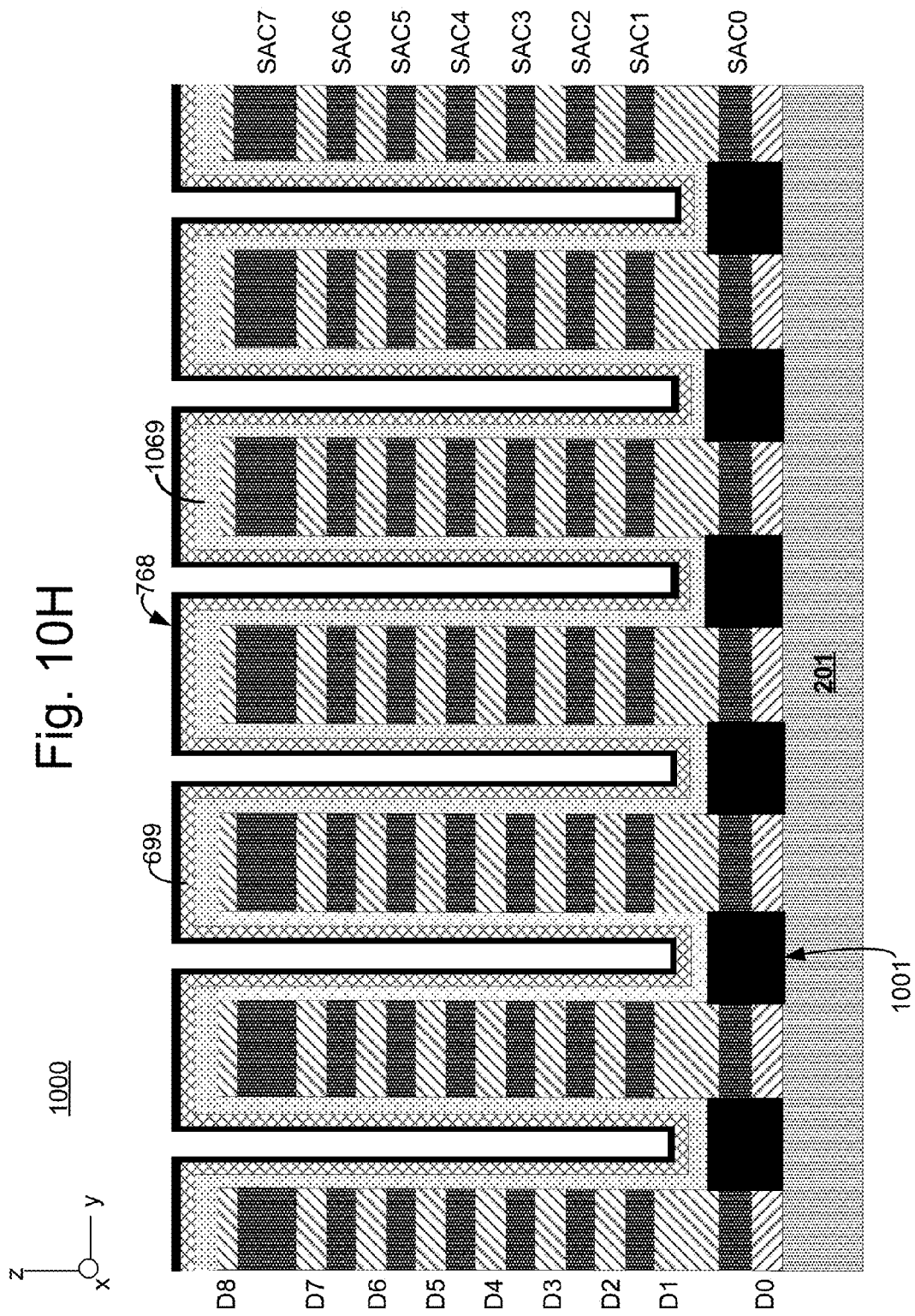
Figure 10I:
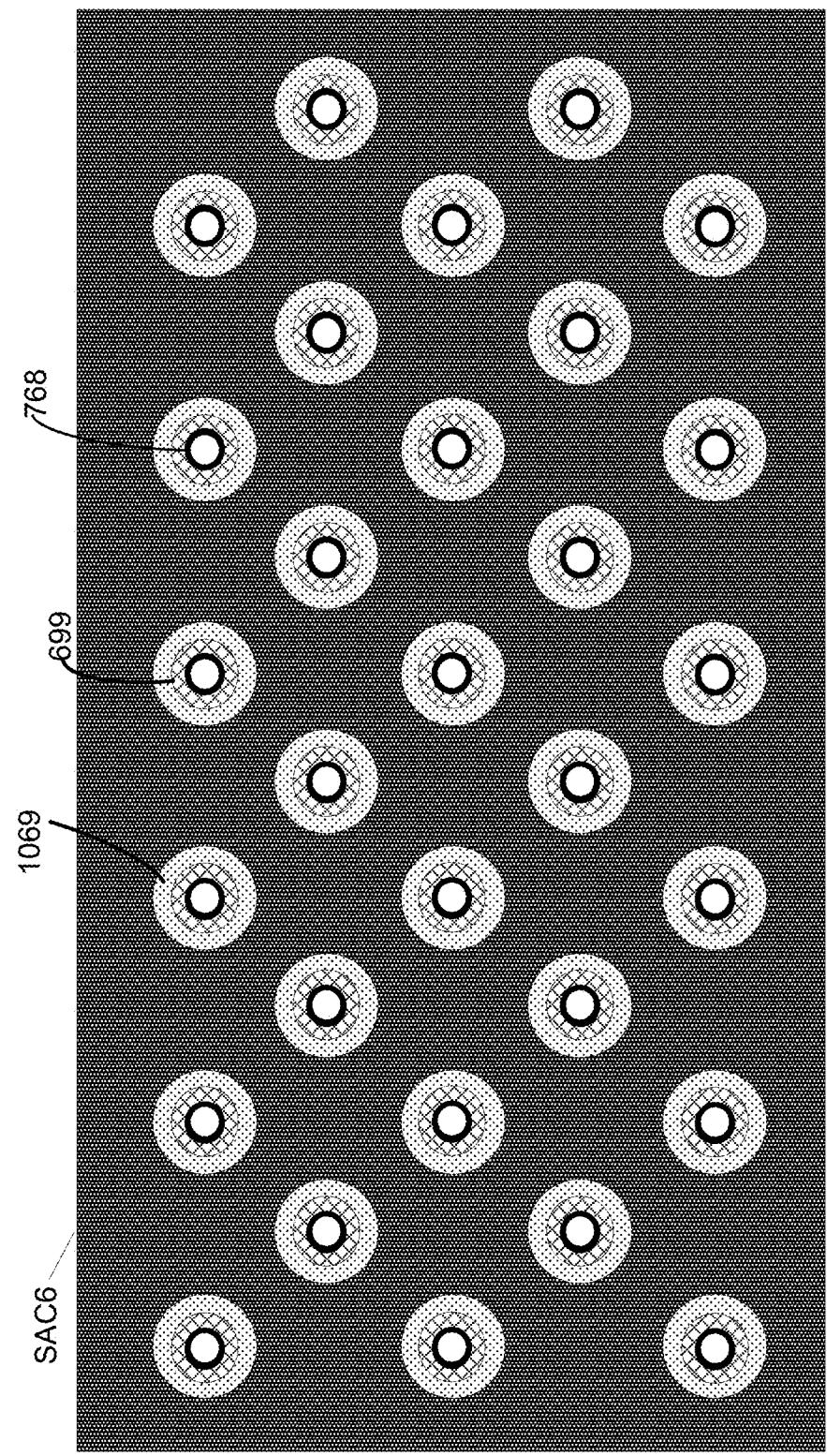

FIGS. 10H and 10I shows results after step 920 for the option in which the protective layer from step 912 is not used. A layer of exposed metal 768 is shown in the memory holes. The exposed metal 768 is on the single region of crystal silicon 699. For example, the exposed metal 768 is on sidewalls of crystal silicon 699 in the memory holes, as well as on crystal silicon 699 at the bottom of the memory hole.

Step 922 is to remove the exposed metal 768. In one embodiment in which nickel is the MIC metal, the clean uses a chemical SH (a mixture of sulfuric acid ($H_2SO_4$) and hydrogen peroxide ($H_2O_2$)). In one embodiment in which aluminum is the MIC metal, the clean uses NC2 ($HCl+H_2O_2+H_2O$). For aluminum, SH ($H_2SO_4+H_2O_2$) could also be used.

Figure 10J:
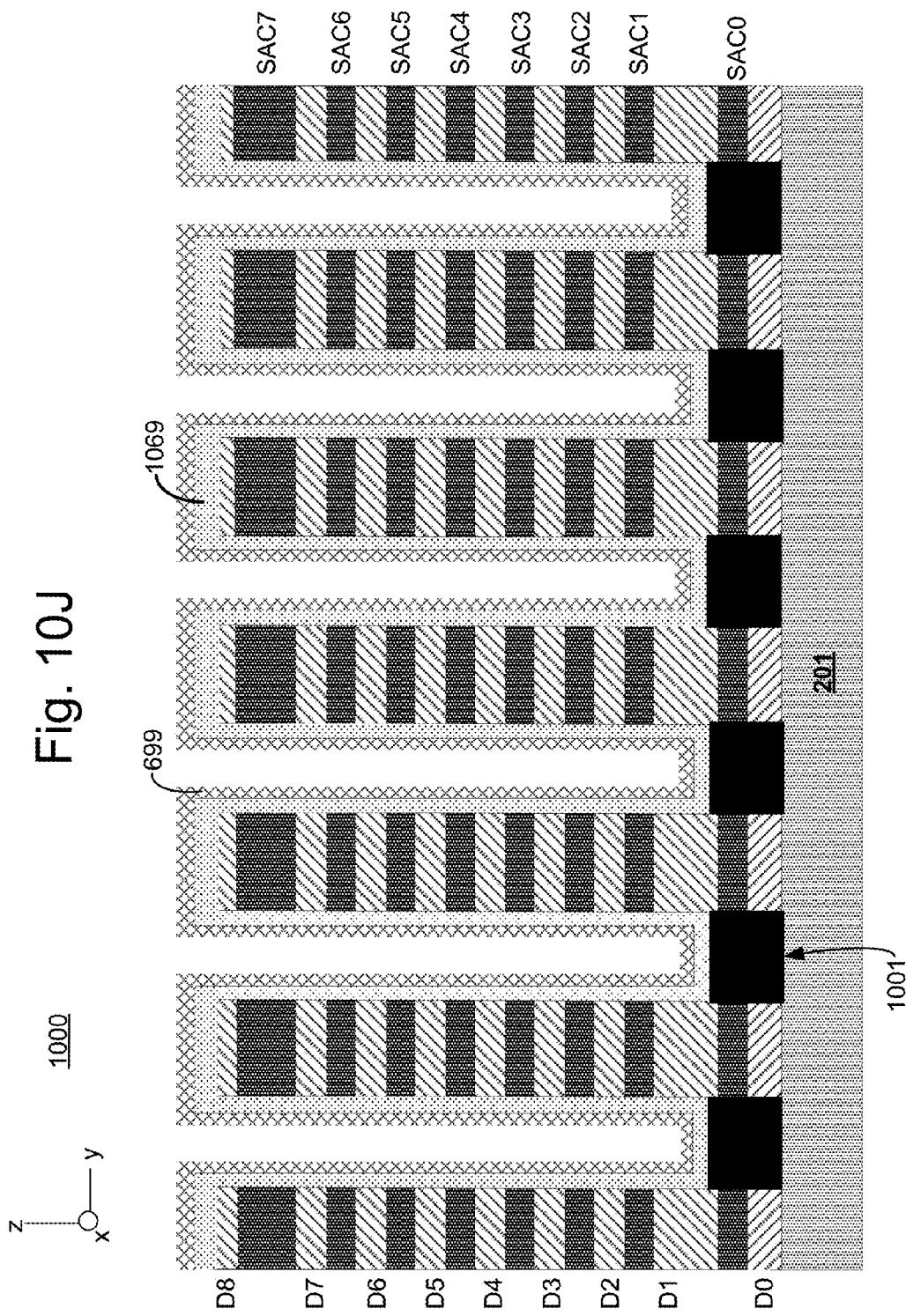
Figure 10K:
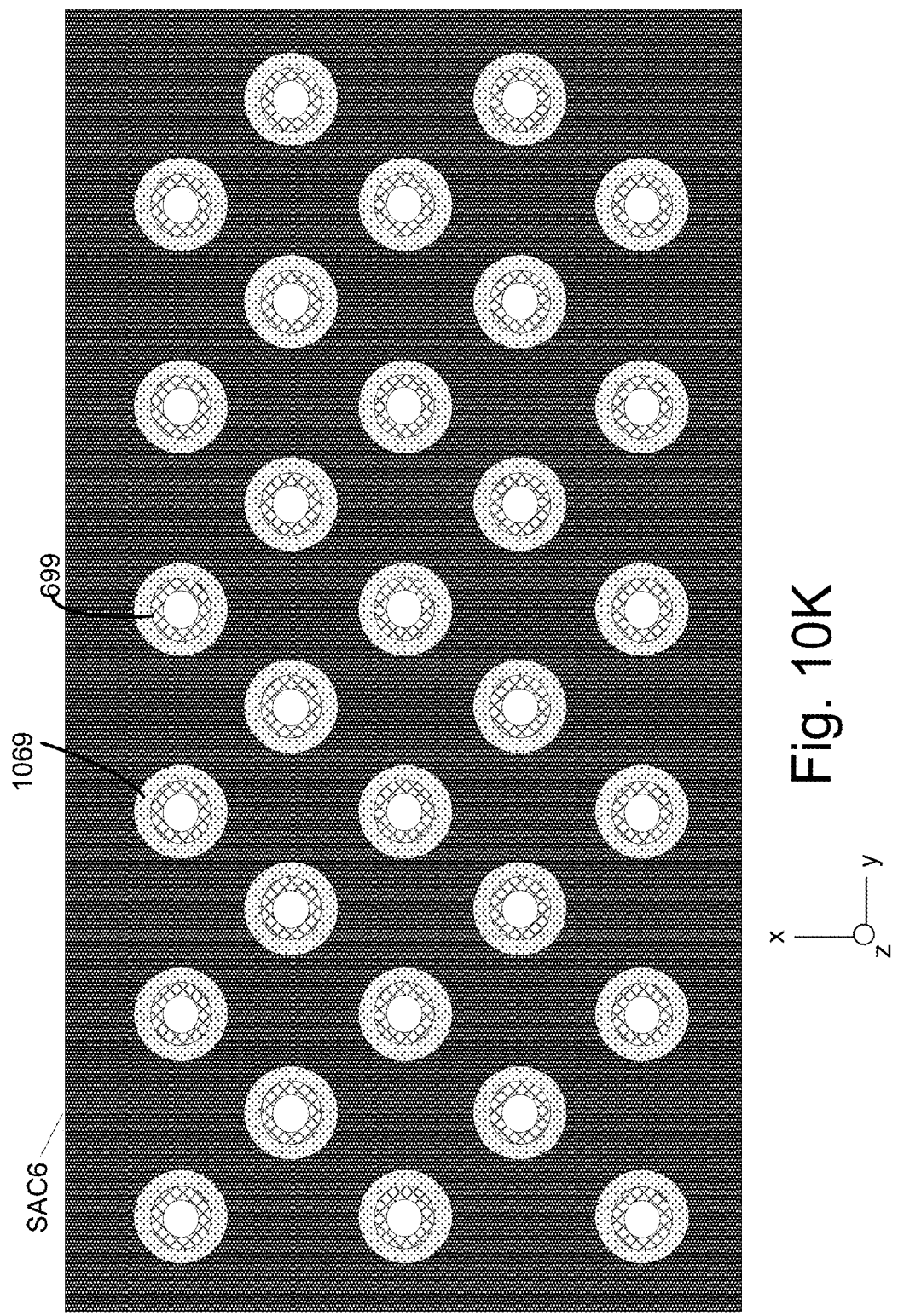

FIGS. 10J and 10K shows results after step 922 for the option in which the protective layer from step 912 is not used. The layer of exposed metal 768 has been removed. Optionally, a crystallization anneal could be performed now (or later). The crystallization anneal may serve to further crystallize the silicon in the channel 699.

Figure 10L:
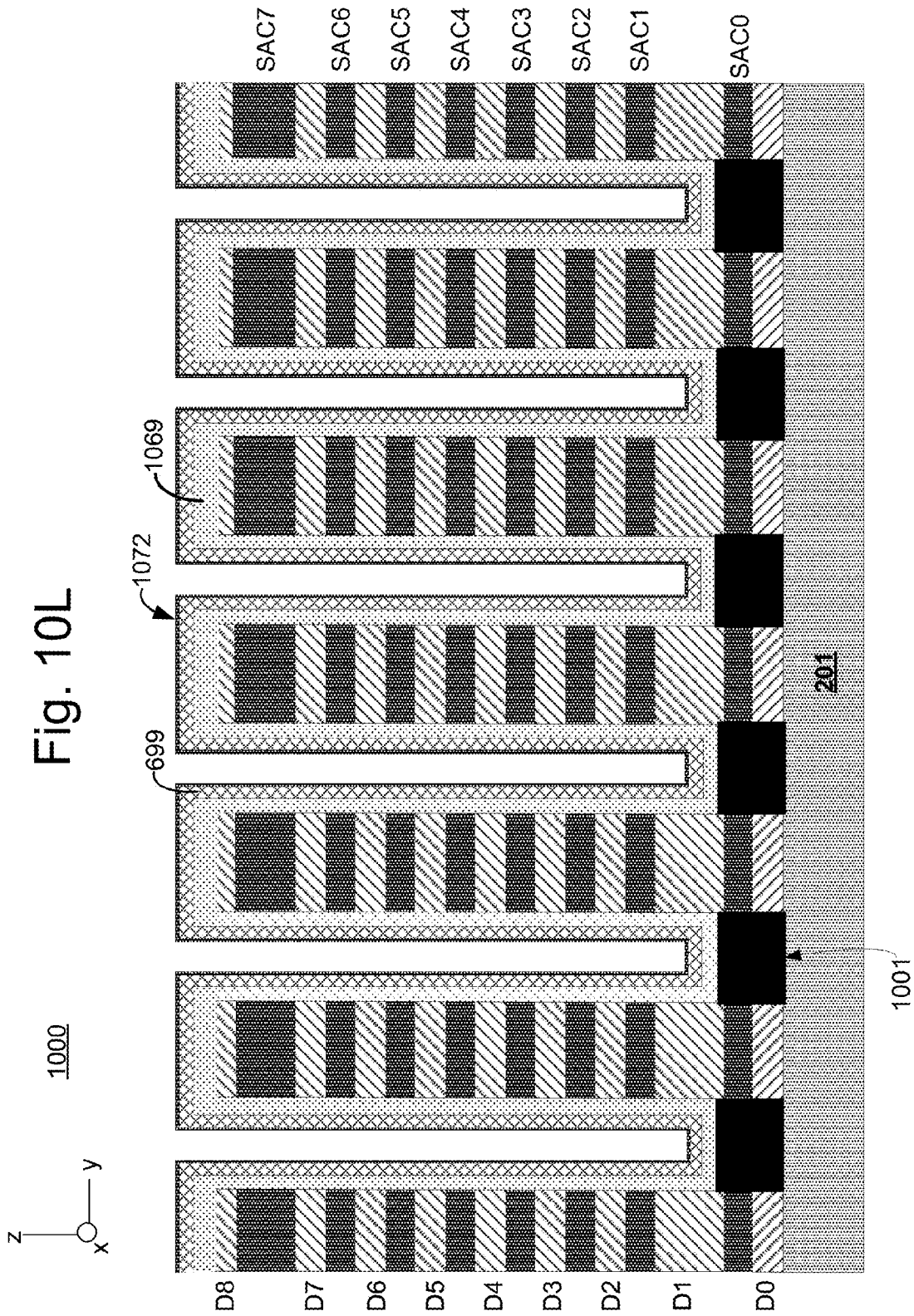

Step 922 concludes one round of the MIC process. Optionally, another round of MIC could be performed. One such example was described in the flowchart of FIG. 7E and depicted in FIGS. 7F-7H. After the one or more rounds of the MIC process are complete, the process goes on to step 924. In step 924, a cover layer of silicon oxide is formed over the channel region 699. In one embodiment, this is an ultralow temperature process. For example, the temperature could be 25 degrees Celsius. FIG. 10L shows results after step 924. FIG. 10L shows the $SiO_2$ layer 1072 over the channel region 699. The $SiO_2$ layer 1072 may be a conformal layer formed on sidewalls of the crystal silicon 699 in the memory holes, as well as on the crystal silicon 699 at the bottom of the memory holes.

Step 926 includes etching the bottom of the memory holes. This forms a lateral recess at the bottom of the memory holes. In one embodiment, this is a reactive ion etch (RIE). In one embodiment, step 926 uses a chemical dry etch (CDE) process. The dry etch may be a remote plasma assisted dry etch process that involves simultaneous exposure to $H_2$, $NF_3$ and $NH_3$ plasma by-products. Remote plasma excitation of hydrogen and fluorine species allows plasma-damage-free substrate processing. The dry etch may be largely conformal and selective towards silicon oxide layers but does not readily etch silicon regardless of whether silicon is amorphous, crystalline or polycrystalline. One example of a dry etch that may be used in step 926 is described in U.S. Pat. No. 8,501,629.

Figure 10M:
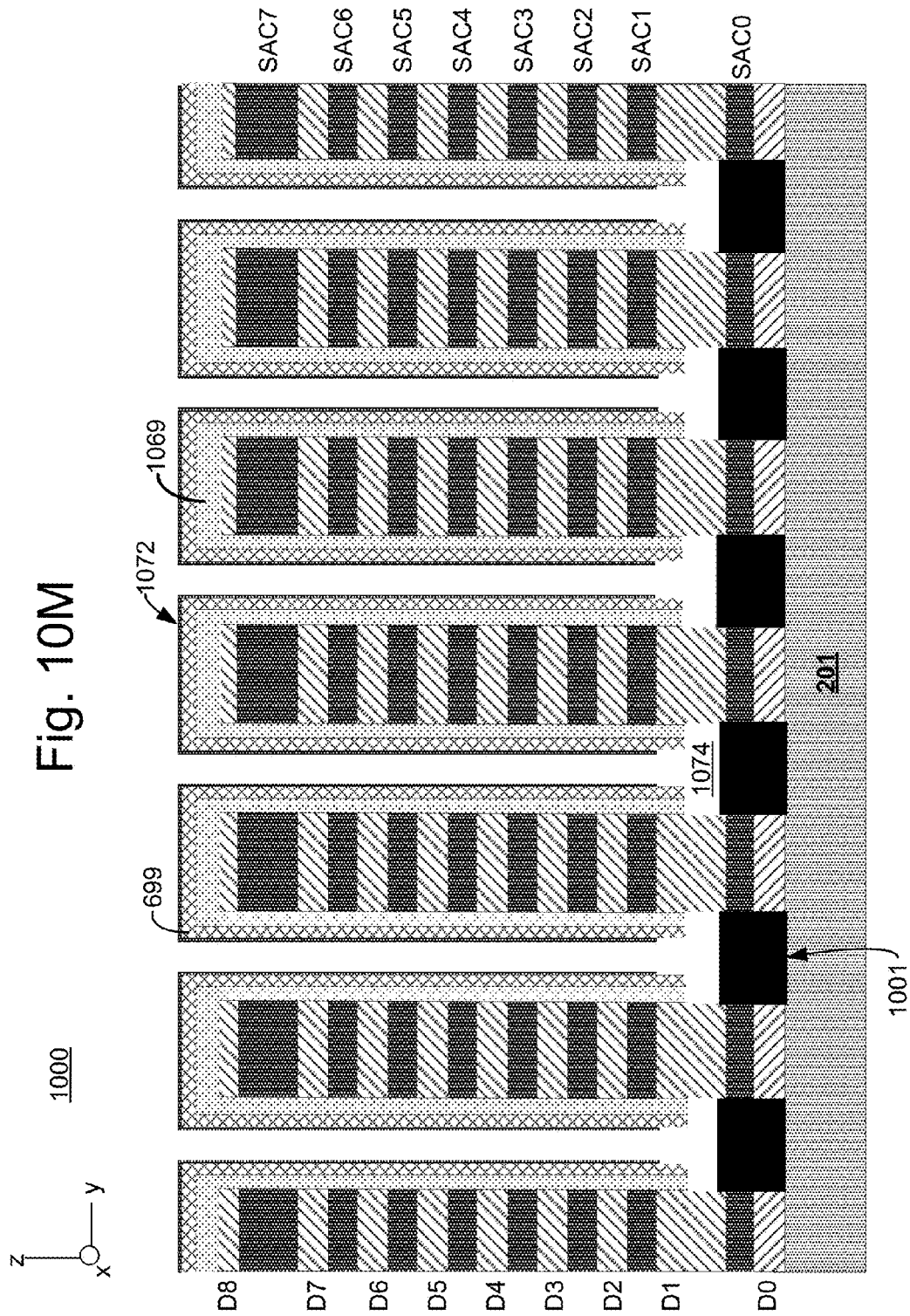

FIG. 10M shows results after step 926, showing that a lateral recess 1074 has been etched at the bottom of the memory holes. The etching has gone through the protective layer 1072 at the bottom of the memory holes, through the horizontal portion of the crystalline silicon channel 699 at the bottom of the memory holes, and through the horizontal portion of the memory layer (e.g., ONO) 1069 at the bottom of the memory holes. However, the protective layer 1072 remains largely in place over the vertical sidewalls of the crystalline silicon channel 699 in the memory holes, protecting the crystalline silicon channel 699 on the vertical sidewalls.

Step 928 is epitaxial silicon growth at the bottom of the memory holes. In one embodiment, precursors such as dicholorosilane (DCS) and HCl are used. Step 928 includes two sub-steps, in one embodiment. In a first sub-step, a bake in hydrogen is performed. This bake may be at about 750 to 950 degrees Celsius and may be for between about ten seconds to 150 seconds. As one example, the hydrogen gas flow rate is about 10 to 50 sccm. As one example, the pressure may be about 10 to 30 mTorr. Also, a nitrogen gas flow may be used to mitigate unintentional nucleation sites on nitride corners. The nitrogen gas flow may be about 10 to 50 sccm. This optional nitrogen gas flow step passivates dangling silicon bonds prior to epitaxial silicon growth. The vertical sidewalls of the channel holes may have unintentional nucleation sites. The unintentional nucleation sites may be dangling silicon bonds. Passivating the dangling silicon bonds helps to prevent unintentional growth of silicon on the vertical sidewalls of the channel holes. Such growth could potentially block the channel hole during the epitaxial growth stage.

The second sub-step is epitaxial silicon growth. In one embodiment, precursors such as dicholorosilane (DCS) and HCl are used in this sub-step. As one example, the HCl flow rate is about 50 to 150 sccm. As one example, the DCS flow rate is about 100 to 400 sccm. A precursor other than dicholorosilane (DCS) and HCl could be used. An example range of temperatures is 750 to 850 degrees Celsius. However, higher or lower temperatures can be used. As one example, the pressure may be about 10 to 30 mTorr. The time may vary depending on the desired amount of epitaxial growth. The growth rate may increase with temperature. The entire growth process may be carried out in a Chemical Vapor Deposition (CVD) technique (single wafer process or batch).

Figure 10N:
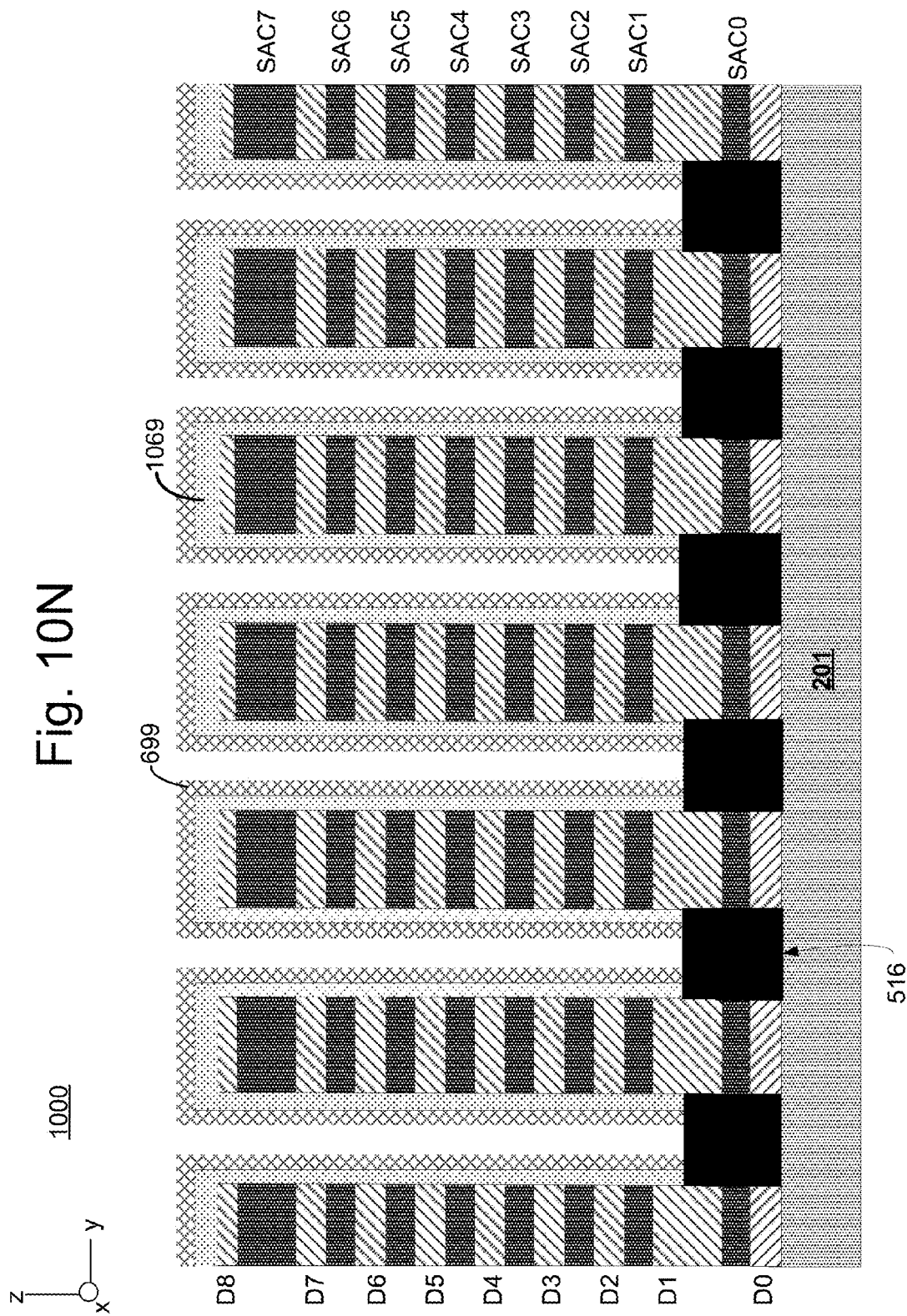

Step 930 is the removal of the protective layer 1072. In one embodiment, a wet etch is used to remove the silicon protective layer. For example, a Dilute HydroFluoric Acid (DHF) dip may be used. FIG. 10N shows results after step 930. FIG. 10N shows the source side select gate transistor bodies 516 in the bottom of the memory holes.

Figure 10P:
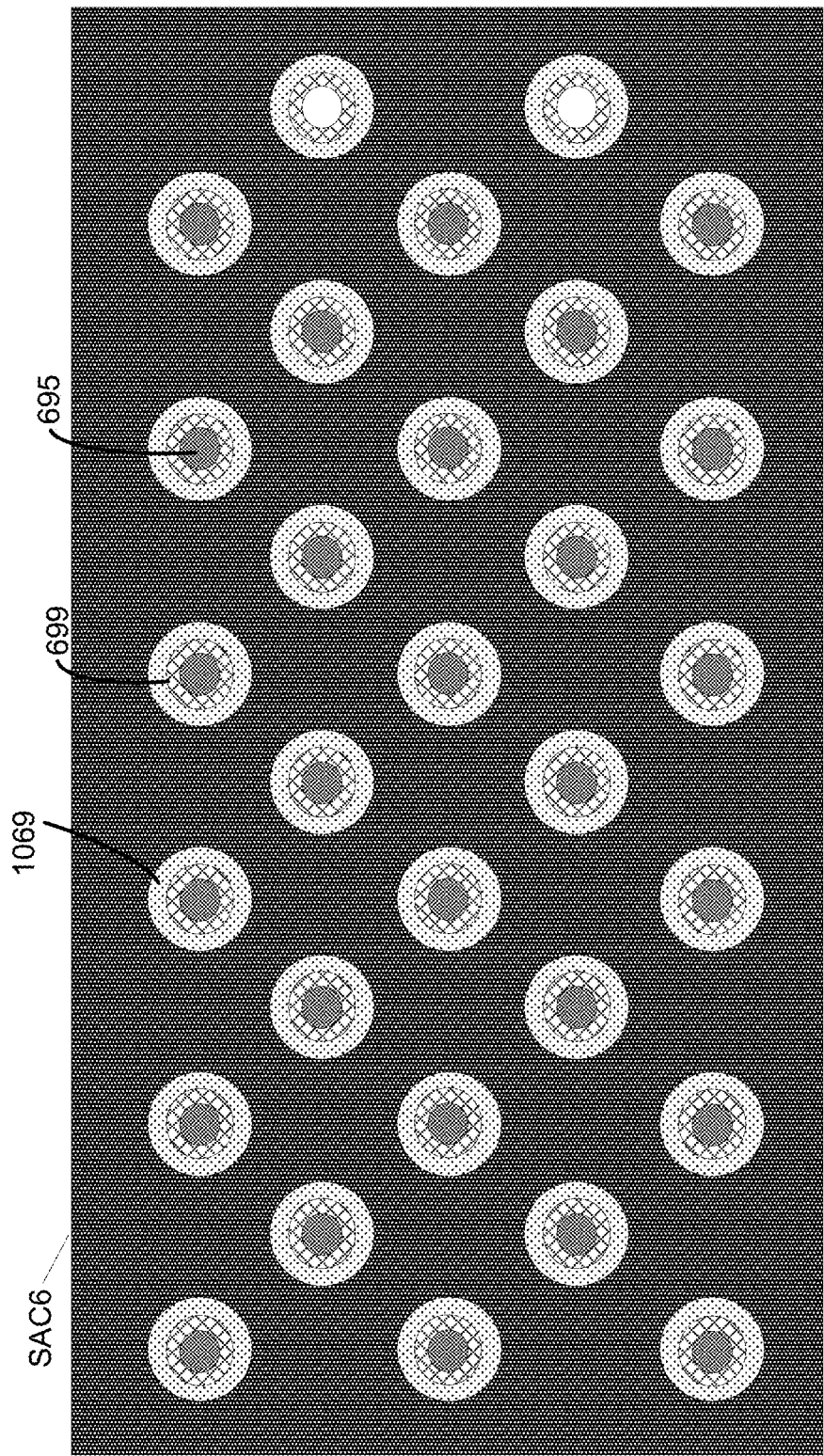

Step 932 is formation of a core of $SiO_2$. This may be ALD or CVD, as two examples. FIGS. 10O and 10P show results after step 932. FIGS. 10O and 10P show the silicon oxide core 695 in the memory holes. The silicon oxide core 695 fills in the opening in the channel region 699.

Step 934 is to etch the slits. This removes the material that was in the slits and is done to allow removal of the sacrificial silicon nitride and to deposit metal. Note that rather than using slits, some other type of etching can be done, such as etching holes, voids, etc.

Step 936 includes performing an etch via the slits to remove portions of the silicon nitride layers. The etch can involve introducing an etchant via the slits, which has a higher selectivity for the silicon nitride, removing the silicon nitride layers. The wet etch is not relatively highly selective of the silicon oxide so that the silicon oxide is not substantially removed. The etch may have a relatively higher selectivity (e.g., by a factor of 1000, or more generally, 100 or more) for the silicon nitride relative than for the silicon oxide. Also note that the etch should not remove the NAND strings.

The wet etch should remove essentially the entire silicon nitride layers wherein the NAND strings are being formed (memory cell area), so that when the regions of the removed silicon nitride are replaced by metal, the metal will extend in substantially the entire layer in the memory cell area. Thus, word line layers at different levels should be isolated from one another and not shorted together. This applies regardless of the etch method, e.g., whether the etchant is introduced via the slits, memory holes, other holes or voids, or combinations thereof. The NAND strings in the memory holes serve as anchors which support the silicon oxide layers when the silicon nitride is removed by etching through slits.

A variety of etching techniques may be used to etch the silicon nitride. Nitride can be etched in one embodiment, by heated or hot phosphoric acid ($H_3PO_4$). As an example, the boiling point of phosphoric acid varies with the concentration of the acid. For example, for a range of acid concentration between 79.5%-94.5% the boiling point may vary from 140° C.-200° C. The etch rate of silicon nitride varies with the temperature and the concentration of the acid. Since the bath is operated at high temperature, water readily evaporates from the solution and the concentration of phosphoric acid changes. Therefore, this may be considered to be a type of "wet" etch. However, a wet etch is not necessarily needed for nitride, as other etching techniques may be applied. In other embodiments, the sacrificial material in the stack may be something other than silicon nitride. Therefore a different type of etch process and etchant may be used.

The ISSG generated oxide that was optionally formed in the memory holes in step 910b serves to protect the charge trapping layer during one embodiment of the etch of step 936. After removing the silicon nitride, the ISSG generated oxide is fully or partially removed. A cleaning step may then be performed.

In step 938 (Option B), a blocking layer is formed. The blocking layer is an $SiO_2$ layer and an $AlO_3$ layer (with the $SiO_2$ layer closer to the charge storage region), in one embodiment. Note that in Option A, the blocking layer was formed earlier in step 910a. The blocking layer may be deposited by ALD from outside of the memory hole through the slits.

Step 940 includes depositing metal (e.g., one or more layers) in the recesses via the slits. In one embodiment, the metal is tungsten. This forms a metal/oxide stack. Metal is provided in the slits to fill the recesses left when the sacrificial material was removed. Chemical vapor deposition (CVD) or atomic layer deposition (ALD) could be used to deposit the metal.

Step 942 is re-filling in the slits. FIG. 10Q shows results after step 942. The sacrificial layers SAC0-SAC7 have been replaced by layers SGS, WL0-WL5, and SGD, respectively. Afterwards, drain diffusion regions 892, bit line contacts 811, and bit lines 111 may be formed.

As noted above, a number of different sequences can be used to for the 3D memory array having the NAND channel with crystalline silicon. Instead of forming the metal layers last, the metal layers could be formed prior to forming the NAND string. In this case, either the memory holes or the slits can be used to etch away the sacrificial layer. Likewise, the metal for the metal layers can be deposited through either the memory holes or the slits.

Figure 11:
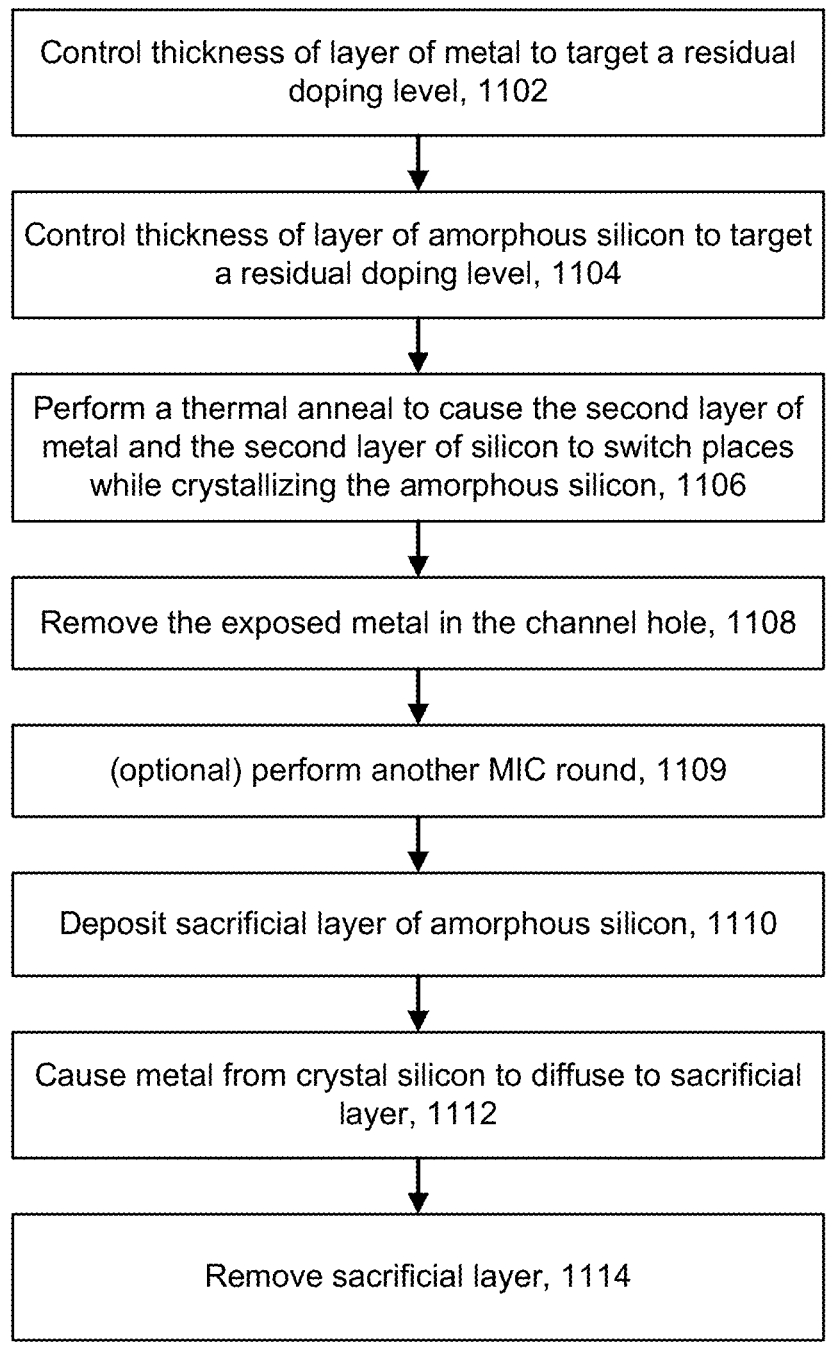
FIG. 11 is a flowchart of one embodiment of a process for removing residual metal from the crystalline silicon channel.

As noted above, some of the metal may remain in the crystalline silicon channel 699 after the MIC process. In one embodiment, a sacrificial layer is formed on the crystalline silicon channel 699 after the MIC process to remove some of the metal from the crystalline silicon channel 699. FIG. 11 is a flowchart of one embodiment of a process for removing residual metal from the crystalline silicon channel 699. This process can be used to target a desired residual doping level in the crystalline silicon channel 699. A number of factors may be used to target a residual doping level. One factor is controlling thickness of the metal layer (or layers) relative to thickness of the amorphous silicon layer (or layers). Another factor is controlling thickness of the sacrificial layer relative to thickness of the crystalline silicon region.

Step 1102 includes forming a metal layer, while controlling the thickness of the metal layer to help target a residual doping level. In one embodiment, the thickness of layer 752 in FIG. 7B is controlled to target a residual doping level. In one embodiment, the thickness of layer 762 in FIG. 7F is controlled to target a residual doping level.

Step 1104 includes forming an amorphous silicon layer, while controlling the thickness of the metal layer to help target a residual doping level. In one embodiment, the thickness of layer 754 in FIG. 7B is controlled to target a residual doping level. In one embodiment, the thickness of layer 764 in FIG. 7F is controlled to target a residual doping level.

In one embodiment, it is the relative thickness of a metal layer to an amorphous silicon layer that is controlled to help target a residual doping level. For example, the thickness of metal layer 752 relative to amorphous silicon layer 754 (see FIG. 7B) is controlled to target a residual doping level. As another example, the thickness of metal layer 762 relative to amorphous silicon layer 764 (see FIG. 7F) is controlled to target a residual doping level.

Depositing more metal may lead to more metal remaining in the crystalline silicon after the thermal anneal (hence a higher doping level). Depositing more amorphous silicon may lead to the metal that remains in the crystalline silicon being more widely distributed (hence a lower doping level).

Step 1106 is performing a thermal anneal to crystallize the amorphous silicon layer. Also metal from the metal layer diffuses through the silicon from the amorphous silicon layer in a radial direction towards the central longitudinal axis of the channel hole. As noted above, some of the metal remains in the silicon region. As noted above, this may be metal atoms that act as a dopant in the silicon region. Also, the silicon crystallizes as described above.

Step 1108 is to remove the exposed metal. Step 1109 is to optionally perform another MIC round.

Figure 12:
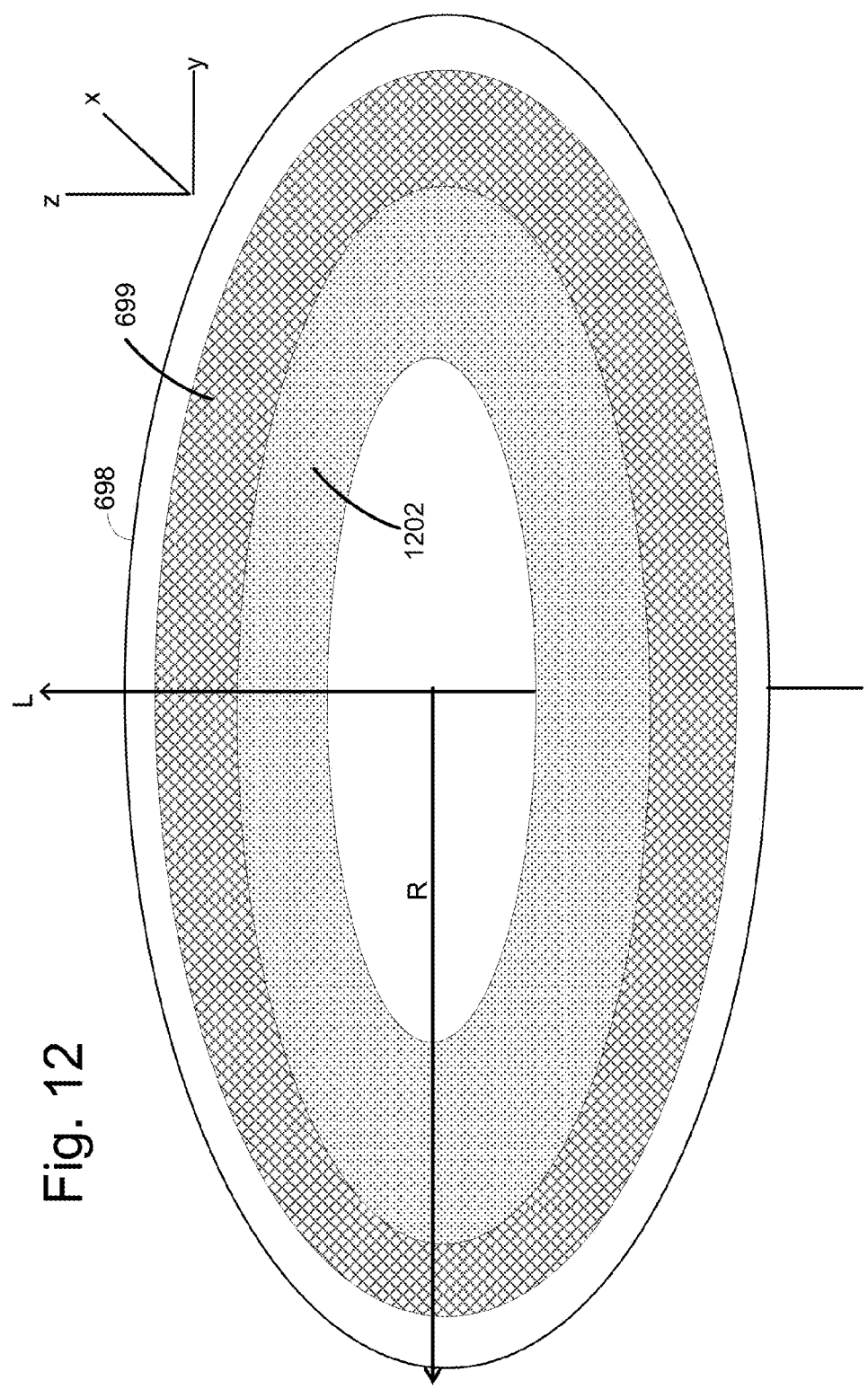
FIG. 12 shows results during the process of FIG. 11.

Step 1110 is to deposit a sacrificial layer of material is deposited on the single region of crystalline silicon 699. This sacrificial layer may be deposited in direct contact with the crystalline silicon 699. In one embodiment, the sacrificial layer of material is un-doped amorphous silicon. In one embodiment, the thickness of sacrificial layer relative to the thickness of the crystalline silicon 699 is controlled to target a residual doping level. FIG. 12 shows results after step 1110. A sacrificial layer 1202 of, for example, undoped amorphous silicon is depicted on the crystalline silicon 699. Also, the tunnel oxide layer 698 is shown. Note that FIG. 12 shows just a cross section and that the layers 698, 699, and 1202 extend in the longitudinal (L) direction.

Step 1112 is to cause metal from the crystalline silicon 699 to diffuse into the sacrificial layer 1202. In one embodiment, step 1112 includes performing a thermal anneal.

Step 1114 is removing of the sacrificial material. This step may include performing a time controlled etch. The length of the etch can be used to remove all of the sacrificial material. This could be a wet or dry etch. Afterwards, the exposed surface of the remaining crystalline silicon 699 may be cleaned. Next, a core of silicon oxide 695 may be deposited.

In one embodiment, the tunnel oxide layer 698 is protected by amorphous silicon prior to depositing the metal during a first round of the MIC process. This was described with respect to step 912 of FIG. 9. FIG. 13 is a diagram that depicts one embodiment of a protective amorphous silicon layer 1302 over the tunnel oxide layer 698. The metal layer 752 may be formed on the protective amorphous silicon layer 1302. In one embodiment, the metal layer 752 is formed directly on the protective amorphous silicon layer 1302. The amorphous silicon layer 754 may be formed on the metal layer 752. In one embodiment, the amorphous silicon layer 754 is formed directly on the metal layer 752. Note that FIG. 13 shows just a cross section and that the layers 698, 1302, 752 and 754 extend in the longitudinal (L) direction.

After depositing the layers depicting in FIG. 13, a thermal anneal may be performed (such as described with respect to step 704d of FIG. 7A). This thermal anneal causes metal from the metal layer 752 to diffuse in a radial direction in towards the center of the channel hole through silicon from the amorphous silicon layer 754. Simultaneously, interaction of metal with the protective amorphous silicon layer 1302 will lead to silicon in the protective layer 1302 crystallizing. Also, silicon from the amorphous silicon layer 754 may move inward towards the protective amorphous silicon layer 1302. As a result a single region of silicon may be formed from the two layers 1302, 754. Additionally, the silicon may crystallize in this region. This could be a single crystal structure, predominantly large grains of polysilicon, etc. The metal that is exposed on the crystalline silicon may then be removed. This describes one round of a MIC process. If desired, one or more additional rounds of a MIC process can be performed. Since the tunnel oxide 698 is now covered by the crystalline silicon, forming an additional protective amorphous silicon layer is not required for the next round of MIC.

In one embodiment, the relative thicknesses of the layers in FIG. 13 are as follows. The protective amorphous silicon layer 1302 may be about 2 to 5 nm (2 to $5 \times 10^{-9}$ meters). The metal layer 752 may be about 5 to 8 nm (5 to $8 \times 10^{-9}$ meters). The amorphous silicon layer 754 may be about 5 to 10 nm (5 to $10 \times 10^{-9}$ meters). The thickness of the metal layer 752 may be adjusted to account for the protective amorphous silicon layer 1302. For example, the metal layer 752 can be made thicker when the protective amorphous silicon layer 1302 is used. In one embodiment, the protective layer 1302 is used when the metal is aluminum. However, the protective layer 1302 may be used with other metals.

Some of the metals used in the MIC process may impact electrical properties of the channel 699. For example, aluminum is known to act as p-type doping in silicon. Controlling doping level in the p-type single crystal silicon (or large grain polysilicon) channel may help in controlling and stabilizing initial memory cell and select gate transistor threshold voltage. It may also improve threshold voltage distributions.

The desired level of doping (e.g., p-type doping) in the channel 699 may depend on total channel thickness and other factors (e.g., memory stack composition and layer thicknesses, control gate (word line) material, etc.). As one example, the desired doping (e.g., p-type doping) can be in the range of $1 \times 10^{18}$ to $8 \times 10^{18}$ per $cm^3$.

One embodiment disclosed herein includes a method for fabricating a three-dimensional (3D) non-volatile storage device. The method comprises forming a plurality of horizontal layers; and forming vertically oriented NAND strings in the plurality of horizontal layers of material. Forming a vertically oriented NAND string comprises forming a hollow cylindrically shaped tunnel oxide layer that extends vertically with respect to the plurality of horizontal layers of material, the tunnel oxide layer having a surface that defines a channel hole; forming a hollow cylindrically shaped layer of metal on the tunnel oxide layer within the channel hole; forming a hollow cylindrically shaped layer of amorphous silicon in the channel hole on the layer of metal; and performing a thermal anneal. The thermal anneal causes metal from the layer of metal and silicon from the layer of amorphous silicon to switch places while crystallizing the silicon that came from the layer of amorphous silicon to form a layer of crystalline silicon having a hollow cylindrical shape with metal from the layer of metal exposed on the crystalline silicon in the channel hole. The exposed metal is then removed.

The foregoing includes one round of a MIC process. Two or more rounds may be used in various embodiments.

In one embodiment, after removing the exposed metal, a sacrificial absorption layer is formed within the channel hole and on the crystalline silicon. In this example, some of the metal that came from the layer of metal remained within the crystalline silicon. Some of the remaining metal from the crystalline silicon is caused to diffuse to the absorption layer. The absorption layer is removed after causing some of the metal from the crystalline silicon to diffuse to the absorption layer.

One embodiment disclosed herein includes a three-dimensional (3D) non-volatile storage device, which comprises a plurality of horizontal layers of material above a substrate; and a plurality of vertically oriented NAND string in the horizontal layers. Each of the vertically oriented NAND strings comprises a tunnel oxide layer and a channel region that comprises crystalline silicon. The tunnel oxide layer has a hollow cylindrical shape that extends vertically with respect to the plurality of horizontal layers of material. The hollow cylindrical shape has an inner surface. The crystalline silicon has a hollow cylindrical shape, wherein the tunnel oxide layer completely surrounds the crystalline silicon. The crystalline silicon has predominantly a (100) orientation with respect to the inner surface of the tunnel oxide layer.

One embodiment disclosed herein includes a method for fabricating a three-dimensional (3D) non-volatile storage device, which comprises the following. Layers of material that are above and horizontal with respect to a substrate are formed. Memory holes that extend vertically through the plurality of layers of material are formed. Vertically oriented NAND strings are formed within the memory holes. Forming the NAND strings comprises the following. Memory cells are formed within each of the memory holes, which includes forming a layer of charge trapping material and a tunnel oxide layer in each of the memory holes. The tunnel oxide layer has an inner surface that defines a channel hole. A first layer of metal is formed within each of the channel holes on the tunnel oxide layer. A first layer of amorphous silicon is formed within each of the channel holes on the first layer of metal. A first thermal anneal is performed to cause metal from the first layer of metal to diffuse through the silicon from the first layer of amorphous silicon and to cause silicon from the first layer of amorphous silicon to crystallize to a base layer of crystalline polysilicon in each of the channel holes. Metal from the first layer of metal is exposed on the base layer of crystalline polysilicon in the channel holes after the first thermal anneal. The exposed metal is removed from the channel holes after the first thermal anneal. A second layer of metal is formed in each of the channel holes on the base layer of crystalline polysilicon. A second layer of amorphous silicon is formed in the channel holes on the second layer of metal. A second thermal anneal is performed to cause metal from the second layer of metal to diffuse through the silicon from the second layer of amorphous silicon and to cause silicon from the second layer of amorphous silicon to crystallize with the base layer of crystalline polysilicon into a single region of crystalline silicon. Metal from the second layer of metal is exposed on the single region of crystalline silicon in the channel holes after the second thermal anneal. The exposed metal is removed from the channel holes after the second thermal anneal.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A three-dimensional (3D) non-volatile storage device, comprising:
   a plurality of horizontal layers of material above a substrate; and
   a plurality of vertically oriented NAND strings in the horizontal layers, each of the vertically oriented NAND strings comprising:
      a tunnel oxide layer, wherein the tunnel oxide layer has a hollow cylindrical shape that extends vertically with respect to the plurality of horizontal layers of material, the hollow cylindrical shape having an inner surface; and
      a channel region that comprises crystalline silicon, wherein the crystalline silicon has a hollow cylindrical shape, wherein the tunnel oxide layer completely surrounds the crystalline silicon, wherein the crystalline silicon has predominantly a (100) orientation with respect to the inner surface of the tunnel oxide layer.

2. The three-dimensional (3D) non-volatile storage device of claim 1, wherein the channel region is single crystal of silicon having a (100) orientation with respect to the inner surface of the tunnel oxide layer.

3. The three-dimensional (3D) non-volatile storage device of claim 1, wherein the channel region comprises grains of polysilicon with predominantly all of the channel region being part of grains of polysilicon having a (100) orientation with respect to the inner surface of the tunnel oxide layer.

4. The three-dimensional (3D) non-volatile storage device of claim 1, wherein the channel region comprises large grains of polysilicon with most of the channel region being part of large grains having a (100) orientation with respect to the inner surface of the tunnel oxide layer, wherein a large grain extends at least 300 nanometers in a direction parallel to the vertically oriented NAND strings.

5. The three-dimensional (3D) non-volatile storage device of claim 1, wherein the crystalline silicon of the channel region comprises a metal dopant.

6. The three-dimensional (3D) non-volatile storage device of claim 5, wherein the metal dopant is aluminum.

7. A three-dimensional (3D) non-volatile storage device, comprising:
   a plurality of conductive layers above a substrate;
   a plurality of dielectric layers alternating with the plurality of conductive layers above the substrate; and
   a plurality of NAND strings, each of the NAND strings comprising:
      a tunnel oxide layer, wherein the tunnel oxide layer has a hollow cylindrical shape that extends vertically with respect to the plurality of conductive layers, the hollow cylindrical shape having an inner surface; and a channel region that comprises crystalline silicon, wherein the crystalline silicon has a hollow cylindrical shape having an inner surface and an outer surface, wherein the outer surface is in direct physical contact with the inner surface of the tunnel oxide layer, wherein the tunnel oxide layer completely surrounds the crystalline silicon, wherein the crystalline silicon comprises one or more crystal lattice structures, wherein predominantly all of the one or more crystal lattice structures have a (100) plane that is oriented parallel to the outer surface of the crystalline silicon.

8. The three-dimensional (3D) non-volatile storage device of claim 7, wherein predominantly all of the one or more crystal lattice structures have a (100) plane that is oriented parallel to the inner surface of the crystalline silicon.

9. The three-dimensional (3D) non-volatile storage device of claim 7, wherein the channel region comprises grains of polysilicon with predominantly all of the channel region being part of grains of polysilicon having a (100) plane that is oriented parallel to the outer surface of the crystalline silicon.

10. The three-dimensional (3D) non-volatile storage device of claim 7, wherein the channel region comprises large grains of polysilicon with most of the channel region being part of large grains having a (100) plane that is oriented parallel to the outer surface of the crystalline silicon, wherein a large grain extends at least 300 nanometers in a direction parallel to the NAND strings.

11. The three-dimensional (3D) non-volatile storage device of claim 7, wherein the crystalline silicon of the channel region comprises a metal dopant.

12. The three-dimensional (3D) non-volatile storage device of claim 11, wherein the metal dopant is aluminum.

13. The three-dimensional (3D) non-volatile storage device of claim 7, further comprises a core filler dielectric inside of the crystalline silicon.

14. A method of forming a three-dimensional (3D) non-volatile storage device, comprising:
  forming a plurality of horizontal layers of material above a substrate; and
  forming a plurality of vertically oriented NAND strings in the horizontal layers, wherein forming each of the vertically oriented NAND strings comprises:
    forming a tunnel oxide layer, wherein the tunnel oxide layer has a hollow cylindrical shape that extends vertically with respect to the plurality of horizontal layers of material, the hollow cylindrical shape having an inner surface; and
    forming a channel region that comprises crystalline silicon, wherein the crystalline silicon has a hollow cylindrical shape, wherein the tunnel oxide layer completely surrounds the crystalline silicon, wherein the crystalline silicon has predominantly a (100) orientation with respect to the inner surface of the tunnel oxide layer.

* * * * *